US007282963B2

(12) United States Patent
Tohya

(10) Patent No.: US 7,282,963 B2
(45) Date of Patent: Oct. 16, 2007

(54) WIDE-BAND CIRCUIT COUPLED THROUGH A TRANSMISSION LINE

(75) Inventor: Hirokazu Tohya, Tokyo (JP)

(73) Assignee: NEC Corporation, Toyko (JP)

( * ) Notice: Subject to any disclaimer, the term of this patent is extended or adjusted under 35 U.S.C. 154(b) by 194 days.

(21) Appl. No.: 10/551,413

(22) PCT Filed: Mar. 24, 2004

(86) PCT No.: PCT/JP2004/004089

§ 371 (c)(1),
(2), (4) Date: Oct. 3, 2005

(87) PCT Pub. No.: WO2004/091035

PCT Pub. Date: Oct. 21, 2004

(65) Prior Publication Data

US 2007/0024323 A1 Feb. 1, 2007

(30) Foreign Application Priority Data

Apr. 4, 2003 (JP) ............................ 2003-101691

(51) Int. Cl.
*G01R 23/02* (2006.01)

(52) U.S. Cl. .......................................... 327/39; 327/44

(58) Field of Classification Search .................. 327/39, 327/44; 333/22 R, 26, 32, 33, 124, 132, 333/134-137, 238, 245, 246, 258, 262
See application file for complete search history.

(56) References Cited

U.S. PATENT DOCUMENTS 4,815,075 A 3/1989 Cameron .................... 370/497
4,935,710 A 6/1990 Yamazaki et al. .......... 333/167
5,903,820 A 5/1999 Hagstrom .................... 455/82
6,148,221 A * 11/2000 Ishikawa et al. ............ 505/210

FOREIGN PATENT DOCUMENTS

| | | | |
|---|---|---|---|
| EP | 0240634 | A2 | 10/1987 |
| EP | 0736978 | A2 | 10/1996 |
| JP | 62-239702 | A | 10/1987 |
| JP | 4-44702 | U | 4/1992 |
| JP | 5-46724 | B2 | 7/1993 |
| JP | 2501994 | B2 | 3/1996 |
| JP | 8-316870 | A | 11/1996 |
| JP | 2000-59167 | A | 2/2000 |
| JP | 2001-15885 | A | 1/2001 |

(Continued)

*Primary Examiner*—Linh My Nguyen
(74) *Attorney, Agent, or Firm*—Foley & Lardner LLP

(57) ABSTRACT

To provide a broadband circuit from which a desired circuit characteristic is stably obtained over a wide frequency band with a small number of circuit devices and which can be easily designed. In the case of the broadband circuit to which a circuit device is connected through a transmission line including a signal transmission conductor, grounding conductor, and dielectric present between these conductors, an LILC 13 having a four-terminal line structure in which a pair of conductors are faced each other, having an impedance lower than that of a conductor connected to any terminal, and using a frequency band of an electromagnetic wave whose wavelength is shorter than a length approximately four times of the length of the circut device as an object frequency band is inserted into the transmission line and used as a low impedance device to the electromagnetic wave of the object frequency band.

23 Claims, 40 Drawing Sheets

FOREIGN PATENT DOCUMENTS

| | | | |
|---|---|---|---|
| JP | 2001-177305 | A | 6/2001 |
| JP | 2002-9507 | A | 1/2002 |
| JP | 2002-26603 | A | 1/2002 |
| JP | 2002-217603 | A | 8/2002 |
| JP | 2002-252330 | A | 9/2002 |
| WO | WO 02/056409 | A1 | 7/2002 |

* cited by examiner (a)

(b)

(a)

(b)

(a)

(b)

(a)

(b)

(a)

(b)

(a)

(b)

(a)

(b)

(a)

(b)

WIDE-BAND CIRCUIT COUPLED THROUGH A TRANSMISSION LINE

BROADBAND CIRCUIT

This application is a National Stage application of PCT/JP/2004/004089, filed Mar. 24, 2004, which claims priority from Japanese patent application JP 2003-101691, filed Apr. 4, 2003. The entire contents of each of the aforementioned applications are incorporated herein by reference.

1. Technical Field

The present invention relates to a broadband circuit in which a desired circuit characteristic can be obtained over a wide frequency band, particularly to a broadband circuit in which a desired broadband circuit characteristic is stably obtained with a small number of circuit elements and which can be easily designed.

2. Background Art

In the case of a passive AC circuit constituted by combining elements such as capacitor, coil, and resistance, characteristics of these elements are shown by using impedance Z satisfying the following relation when a voltage applied to the both ends of an element is V and a current flowing through the element is I:

$$V=Z*I.$$

For example, when AC having frequency f (=ω/2π (π is circular constant)) flows through a capacitor having capacitance C, the impedance of the capacitor is shown as 1/jωC. Similarly, the impedance of a coil having inductance L is shown as jωL. The impedance of a resistance is handled as resistance value R having no frequency dependency.

Thus, when AC flows through a capacitor or coil, the impedance of each of these devices becomes a value including ω proportional to the frequency of AC and the characteristic of the capacitor is shown as a value inversely proportional to the frequency of AC and the characteristic of the coil is shown as a value proportional to the frequency of AC.

A passive AC circuit using a capacitor is designed so that a desired circuit characteristic can be obtained by using the characteristic (capacitance characteristic) that impedance lowers as frequency rises and using the capacitor as an impedance device.

However, the above characteristic of capacitor is an ideal characteristic and an actual capacitor shows a characteristic same as that of an equivalent circuit obtained by connecting a coil and a resistance in series as parasitic devices, as shown in FIG. 1(*a*).

A feedback circuit including a capacitor and a coil causes resonance when the impedance of the capacitor coincides with the reactance of the coil, that is, 1/jωC=jωL. The frequency in this case is referred to as a resonant frequency.

The relation between the frequency and the impedance in the above case is shown in FIG. 1(*b*) and an equivalent circuit including a parasitic device shows a characteristic that impedance lowers as frequency rises up to a resonant frequency and after the impedance is minimized at the resonant frequency, the impedance increases as the frequency rises.

Thus, in the case of an equivalent circuit including a parasitic device, the difference from the characteristic of an ideal capacitor widens as a frequency rises in a frequency band higher than a resonant frequency. Therefore, a passive AC circuit using a capacitor loses the characteristic of a circuit at a frequency band higher than a resonant frequency.

As a prior art for obtaining a desired circuit characteristic in a high frequency band, Japanese Patent Application Laid-Open No. 2001-015885 (Patent Document 1) discloses “a high-frequency electronic circuit and a mounting structure of a chip three-terminal capacitor on the high-frequency electronic circuit”.

The invention disclosed in Patent Document 1 is an invention for obtaining a desired circuit characteristic in a high frequency band by using a chip three-terminal capacitor as a low impedance device.

Problems to be Solved by the Invention

FIG. 2 shows the equivalent circuit of a filter using a chip three-terminal capacitor applied to the invention disclosed in Patent Document 1. Moreover, FIG. 3 shows the transmission characteristic of the equivalent circuit. In the case of this filter, a low transmittance of 80 dB is obtained at a frequency close to 20 MHz that is higher than ever. However, the property that transmittance lowers as a frequency rises in a frequency band that is equal to or lower than a cutoff frequency, the transmittance is minimized at the cutoff frequency, and the transmittance rises as the frequency rises in a frequency band equal to or higher than the cutoff frequency is the same as that of a conventional filter circuit using a capacitor.

That is, though a desired circuit characteristic is obtained at a frequency close to the cutoff frequency, the transmittance suddenly rises when the frequency is deviated from the cutoff frequency. Therefore, a sufficient filtering characteristic cannot be obtained in a frequency band deviated from the cutoff frequency.

In the case of a circuit for processing an analog signal for communication, a signal wave is present in a narrow frequency band. Therefore, it is enough that a desired filter characteristic is obtained only in a frequency band close to the signal wave. Therefore, it is possible to apply the above filter circuit using the chip three-terminal filter.

However, in the case of a digital circuit whose signal wave becomes rectangular, the spectrum of the signal wave is distributed over a very wide band including the higher harmonic wave of a fundamental wave. Therefore, to pass only some frequency band components of a digital signal wave, a frequency component to be prevented is present as a broadband spectrum. Therefore, a filter circuit to be applied to a circuit for processing a high-speed digital signal must have a characteristic for passing or preventing electromagnetic waves over a wide band.

In the case of a filter circuit to which the invention disclosed in Patent Document 1 is applied, a desired filter characteristic can be obtained only in the neighborhood of a predetermined frequency due to the influence of a parasitic device. Therefore, to realize the characteristic for passing or preventing electromagnetic waves over a wide band, it is necessary to design the configuration shown in FIG. 2 as a high-order filter circuit by further combining coils and capacitors.

However, a parasitic device is actually added to a coil as shown in FIG. 4(*a*). In other words, an actual coil shows the same characteristic as an equivalent circuit obtained by connecting resistors in series and capacitors in parallel.

The relation between frequency and impedance of this equivalent circuit becomes greatly different from the characteristic of an ideal coil when the frequency rises as shown in FIG. 4(*b*). Therefore, coils and capacitors themselves, added to compensate the influence of a parasitic device, are influenced by the parasitic device and design parameters become more complex for a higher-order circuit. Therefore, it is difficult to design a high-order circuit because it is difficult to theoretically systematize how each design parameter acts.

Moreover, in the case of a high-order circuit in which design parameters intricately act, the circuit is easily influenced by an operating environment. Therefore, the stability and reliability of a circuit characteristic are easily impaired. For example, even if a filter circuit formed on a circuit board shows a desired characteristic, when the circuit board is set to a housing, a desired characteristic may not be obtained.

Because of these problems, actual circuit design inevitably depends on the cut-&-try technique and it becomes difficult to design circuits with CAD.

Thus, in the case of an electronic circuit according to the prior art using a capacitor, complex circuit design was forced in order to obtain the original characteristic of the circuit for a wide frequency band and there was a problem that the characteristic of a designed circuit is unstable and lacks reliability.

The present invention is made to solve the problem and its object is to provide a broadband circuit in which a desired circuit characteristic is stably obtained over a wide frequency band by a small number of circuit devices and which can be easily designed.

As examples of a broadband circuit, it is possible to list a filter circuit (low-pass filter, high-pass filter, band-pass filter, or band elimination filter), a terminal circuit and the like. In the case of these broadband circuits, it is preferable that a desired circuit characteristic is obtained in a frequency band including 100 MHz to 10 GHz in view of increase of signal processing speed and can be universally used in a digital signal circuit.

Disclosure of the Invention

To achieve the above object, the present invention provides a broadband circuit as a first mode with which a circuit device is connected through a transmission line having a signal transmission conductor, a grounding conductor, and a dielectric present between these conductors, characterized in that a line device having a four-terminal line structure in which a pair of conductors are faced each other, having an impedance lower than that of a conductor to be connected to any terminal, and using the frequency band of an electromagnetic wave having a wavelength shorter than the length approx. four times larger than the length of the line as an object frequency band is inserted into the transmission line and used as a low impedance device to the electromagnetic wave of the object frequency band.

Moreover, to achieve the above object, the present invention provides the broadband circuit of the first mode of the present invention as a second mode in which a signal source for outputting signal electromagnetic waves and a passive device to be operated in accordance with an input signal are connected by the transmission line into which the line device is inserted, characterized in that the line device inserted into the transmission line includes at least some of spectrums of signal electromagnetic waves in an object frequency band, one end of either of a pair of conductors of the line device is connected to the output terminal of the signal source and the other end of it is connected to the input terminal of the passive device, and the other ends of the conductors are connected to the ground. In the case of the above configuration, it is preferable that the signal source and the line device are connected each other through a device mainly including a reactance component in the object frequency band or the signal source and line device are connected each other through a resistance. Moreover, it is preferable that a frequency component in the object frequency band of the line device among signal electromagnetic waves propagated from the signal source up to the line device is reflected from the line device, a frequency component out of the object frequency band of the line device is propagated to the passive device side by the line device, and a DC component transmits to the passive device side through one of the pair of conductors of the line device connected to the signal source and passive device.

Moreover, to achieve the above object, the present invention provides the broadband circuit of the first mode as a third mode in which a signal source for outputting signal electromagnetic waves and a passive device to be operated in accordance with an input signal are connected by a transmission line into which a line device is inserted, characterized in that the line device inserted into the transmission line includes at least some of spectrums of the signal electromagnetic waves in an object frequency band, one end of either of a pair of conductors of the line device is connected to the output terminal of signal source and the other end of it is electrically opened, the end at the passive device side of the other hand is connected to the input terminal of the passive device, and at least one end is connected to the ground through a device mainly including a reactance component in the object frequency band.

Furthermore, to achieve the above object, the present invention provides the broadband circuit of the first mode as a fourth mode in which a signal source for outputting signal electromagnetic waves and a passive device to be operated in accordance with an input signal are connected by a transmission line into which a line device is inserted, characterized in that the line device inserted into the transmission line includes at least some spectrums of the signal electromagnetic waves in an object frequency band, one end of either of a pair of conductors of the line device is connected to the output terminal of a signal line and the other end is electrically opened, the end at the passive device side of the other hand is connected to the input terminal of the passive device, and at least one end is connected to the ground through a resistance.

In the case of the third mode or fourth mode of the present invention, it is preferable that a frequency component in an object frequency band among signal electromagnetic waves propagated from a signal source up to a line device is propagated to the passive device side through a line including one of a pair of conductors of the line device connected to the input terminal of the passive device and ground and a frequency component out of the object frequency band of the line device enters the line device and attenuates.

Moreover, to achieve the above object, the present invention provides the broadband circuit of the above first mode as a fifth mode, in which a signal source for outputting signal electromagnetic waves and a passive device to be operated in accordance with an input signal are connected by a transmission line into which first and second line devices are inserted, characterized in that the first and second line devices respectively include some of spectrums of the signal electromagnetic waves in each object frequency band, one end of one of a pair of conductors of the first line device is connected to the output terminal of a signal source and the other end is electrically opened, an end of the other hand opposite to the signal source is connected to one of a pair of conductors of the second line device, at least one end is connected to the ground through a device mainly including a reactance component or resistance in the object frequency band of the first line device, one of a pair of conductors of the second line device whose one end is connected to the first line device is connected to the input terminal of the passive device and both ends of the other of the conductors is connected to the ground. In the case of the above configuration, it is preferable that the first line device and the second line device are connected through a device mainly including a reactance component or resistance in the object frequency band of the second line device. Moreover, it is preferable that a frequency component in the object frequency band of the first line device among signal electromagnetic waves propagated from the signal source up to the first line device is propagated to the second line device side through a line including one of a pair of conductors of the first line device connected with the conductor of the second line device and the ground, the frequency component out of the object frequency band of the first line device enters the line device and attenuates, a frequency component in the object frequency band of the second line device among signal electromagnetic waves propagated up to the second line device is reflected from the second line device, and a frequency component out of the object frequency band of the second line device is propagated to the passive device through the second line device.

Furthermore, to achieve the above object, the present invention provides the broadband circuit of the first mode as a sixth mode in which a signal source for outputting signal electromagnetic waves and a passive device to be operated in accordance with an input signal are connected, characterized in that the first and second line devices respectively include at leas some of spectrums of the signal electromagnetic waves in each object frequency band, one end of one of a pair of conductors of the first line device is connected to the output terminal of the signal source and the other end is connected to one of a pair of conductors of the second line device, both ends of the other hand are connected to the ground, the other end of one of a pair of conductors of the second line device whose one end is connected with the first line device is electrically opened and the end of the other hand at the passive device side is connected to the input terminal of the passive device and at least one end is connected to the ground through a device mainly including a reactance component or resistance in the object frequency band of the second line device. In the case of the above configuration, it is preferable that a frequency component in the object frequency band of the first line device among signal electromagnetic waves propagated from the signal source up to the first line device is reflected from the first line device, a frequency component out of the object frequency band of the first line device is propagated to the second line device side through the first line device, a frequency component in the object frequency band of the second line device is propagated to the passive device side through a line including one of a pair of conductors of the second line device connected to the input terminal of the passive device and the ground, and a frequency component out of the object frequency band of the second line device enters the second line device and attenuates.

Furthermore, to achieve the above object, the present invention forms the broadband circuit of the first mode as a seventh mode in which a signal source for outputting signal electromagnetic waves and a passive device to be operated in accordance with an input signal are mutually connected by a transmission line into which first and second line devices are inserted, characterized in that the first and second line devices respectively include at least some of spectrums of the signal electromagnetic waves in each object frequency band, one end of one of a pair of conductors of the first line device is. connected to the output terminal of the signal source and the other end is connected to the input terminal of the passive device, both ends of the other hand are connected to the ground, one end of one of a pair of conductors of the second line device is connected to the output terminal of the signal source and the other end is electrically opened, the end of the other hand at the passive device side is connected to the input terminal of the passive device, and at least one end is connected to the ground through a device mainly including a reactance component or resistance in the object frequency band of the second line device. In the case of the above configuration, it is preferable that a frequency component in the object frequency band of the first line device among signal electromagnetic waves propagated from the signal source up to the first line device is propagated to the passive device side through a line including one of a pair of conductors of the first line device connected to the input terminal of the passive device and the ground, a frequency component out of the object frequency band of the first line device enters the first line device and attenuates, a frequency component in the object frequency band of the second line device among signal electromagnetic waves propagated up to the second line device from the signal source is reflected from the second line device, and a frequency component out of the object frequency band of the second line device is transmitted to the passive device side through the second line device.

In the case of the sixth mode or seventh mode of the present invention, it is preferable that a signal source and first line device are connected through a device mainly including a reactance component or resistance in the object frequency band of first line device.

Moreover, to achieve the above object, the present invention provides the broadband circuit of the above first mode as an eighth mode in which a signal source for outputting signal electromagnetic waves and a passive device to be operated in accordance with an input signal are connected by a transmission line into which a line device is inserted, characterized in that the line device inserted into the transmission line includes spectrums of the signal electromagnetic waves in an object frequency band, one end of one of a pair of connectors of the line device is connected to the output terminal of the signal source and the other end is connected to the input terminal of the passive device, and at least one end of the other hand is connected to the ground through a terminal resistance. In the case of the above configuration, it is preferable that a frequency component in the object frequency band of the line device among signal electromagnetic waves propagated up to the line device from the signal source is propagated to the passive device side through a line including one of a pair of conductors connected to the signal source and passive device and the ground, a frequency component out of the object frequency band of the line device is propagated to the passive device side through the line device, and a DC component is transmitted to the passive device side through one of a pair of conductors of the line device connected to the signal source and passive device.

Furthermore, to achieve the above object, the present invention provides the broadband circuit of the above first mode as a ninth mode in which a signal source for outputting signal electromagnetic waves and a passive device to be operated in accordance with an input signal are mutually connected by a transmission line into which a first line device is inserted and a power supply for supplying power to the signal source and the first line device are connected through a second line device, characterized in that the first and second line devices include spectrums of signal electromagnetic waves in their object frequency bands, one end of one of a pair of conductors of the first line device is connected to the output terminal of the signal source and the other end is connected to the input terminal of the passive device, at least one end of the other hand is connected to the second line device through a terminal resistance, one end of one of a pair of conductors of the second line device is connected to the first line device through the terminal resistance, the other end is connected to the power supply, both ends of the other hand are connected to the ground. In the case of the above configuration, it is preferable that a frequency component in the object frequency band of the first line device among signal electromagnetic waves propagated up to the first line device from the signal source is propagated to the passive device side through a line including one of a pair of conductors of the first line device connected to the signal source and passive device and the ground, a frequency component out of the object frequency band of the first line device is propagated to the passive device side through the first line device, a DC component is transmitted to the passive device side through one of a pair of conductors of the first line device connected to the signal source and passive device.

In the case of the eighth or ninth mode of the present invention, it is preferable that a terminal resistance has an impedance equal to that of a signal transmission conductor connected to an end of a conductor of a line device to which the terminal resistance is not connected at the side to which the terminal resistance is connected. Moreover, it is preferable that a line device is further set to a power supply line for connecting a signal source and a power supply for supplying power to the signal source and one end of one of a pair of conductors of the line device set to the power supply line is connected to the signal source and the other end is connected to the power supply, and both end of the other hand are connected to the ground.

In the case of any one of configurations of the second to ninth modes of the present invention, it is preferable that a signal source and a passive device are mounted on a printed circuit board on which a signal transmission conductor is formed as a wiring pattern and a grounding conductor is formed as a ground plane and a wiring pattern connected to the ground plane and in the case of a line device mounted on the printed circuit board, at least one ends of a pair of conductors are connected to wiring patterns of a signal transmission conductor and grounding conductor and inserted into a transmission line.

Figure 1:
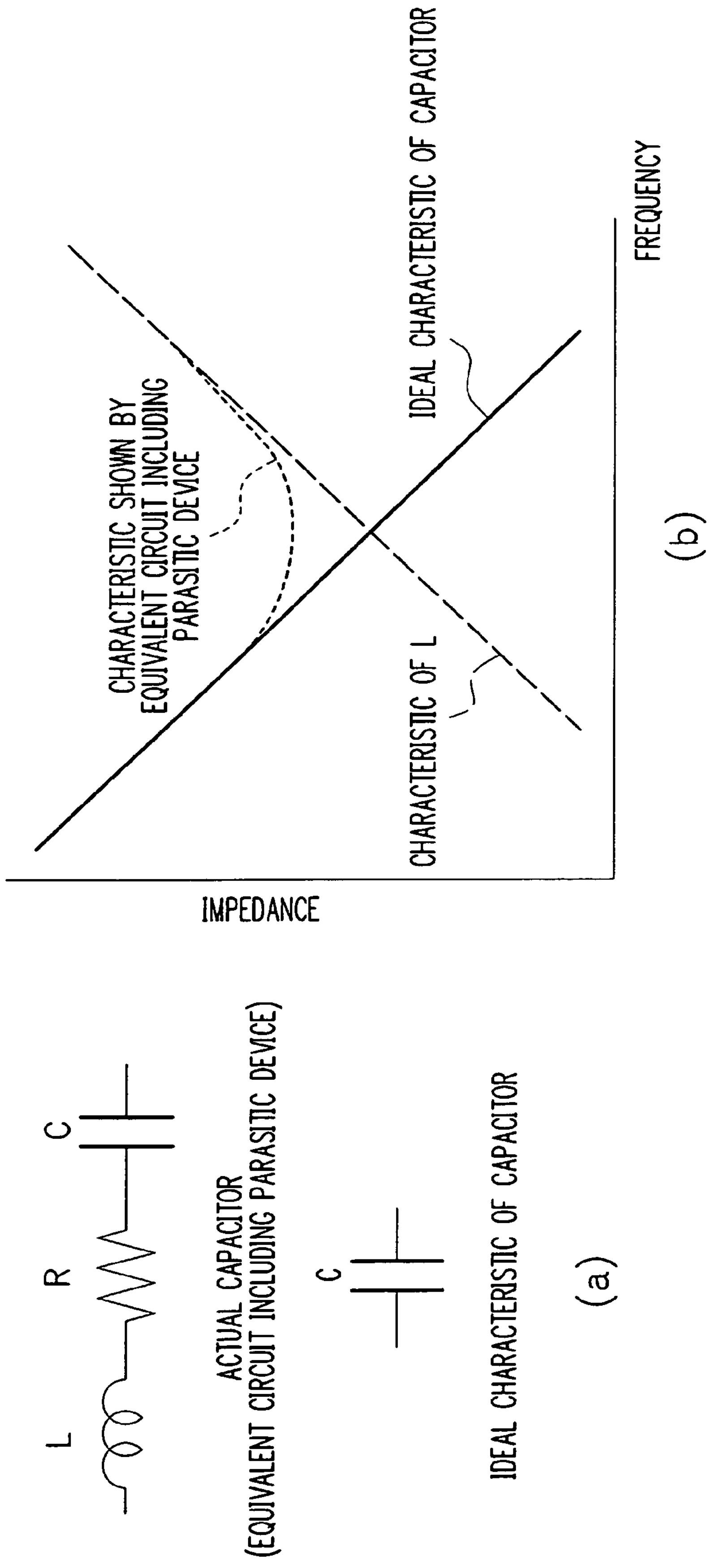
FIGS. 1(*a*) and 1(*b*) are illustrations showing the equivalent circuit of a capacitor including a parasitic device and its frequency characteristic.
Figure 2:
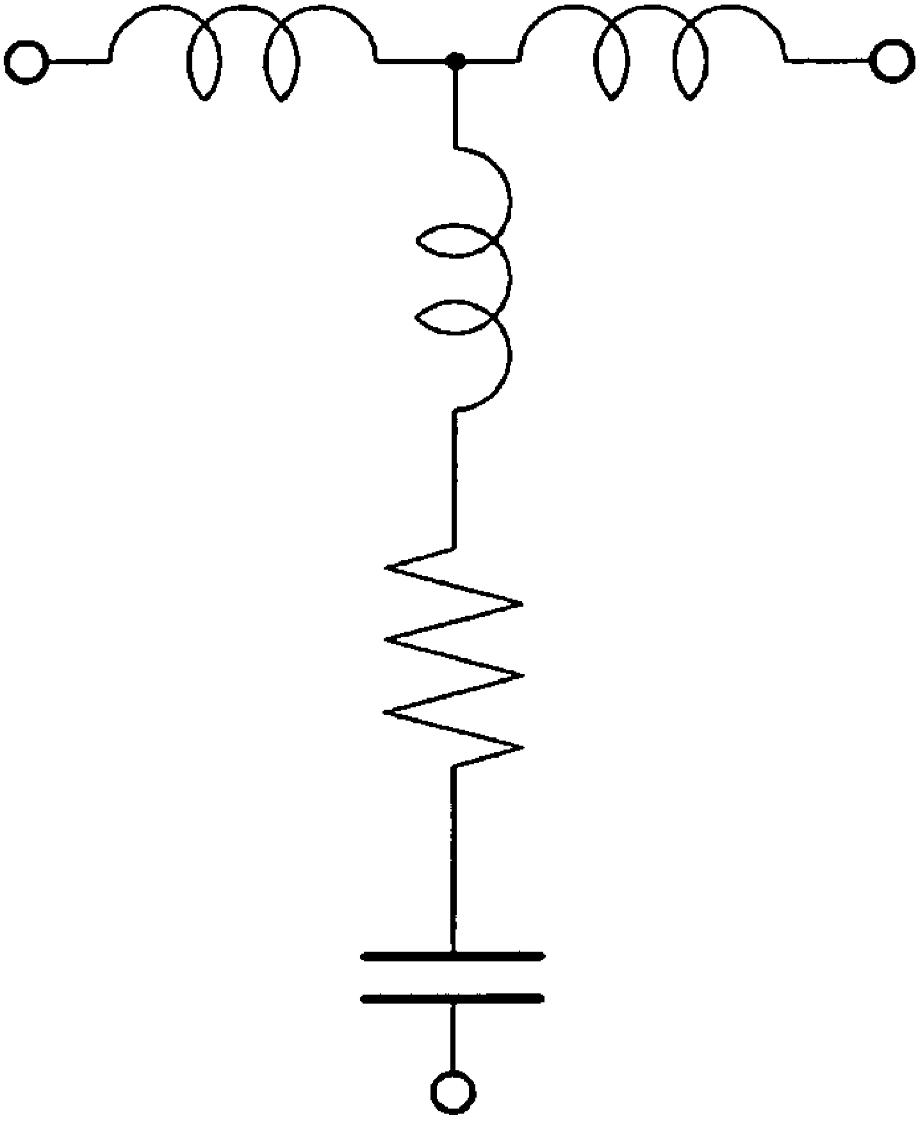
FIG. 2 is an illustration showing a configuration of a three-terminal filter circuit.
Figure 3:
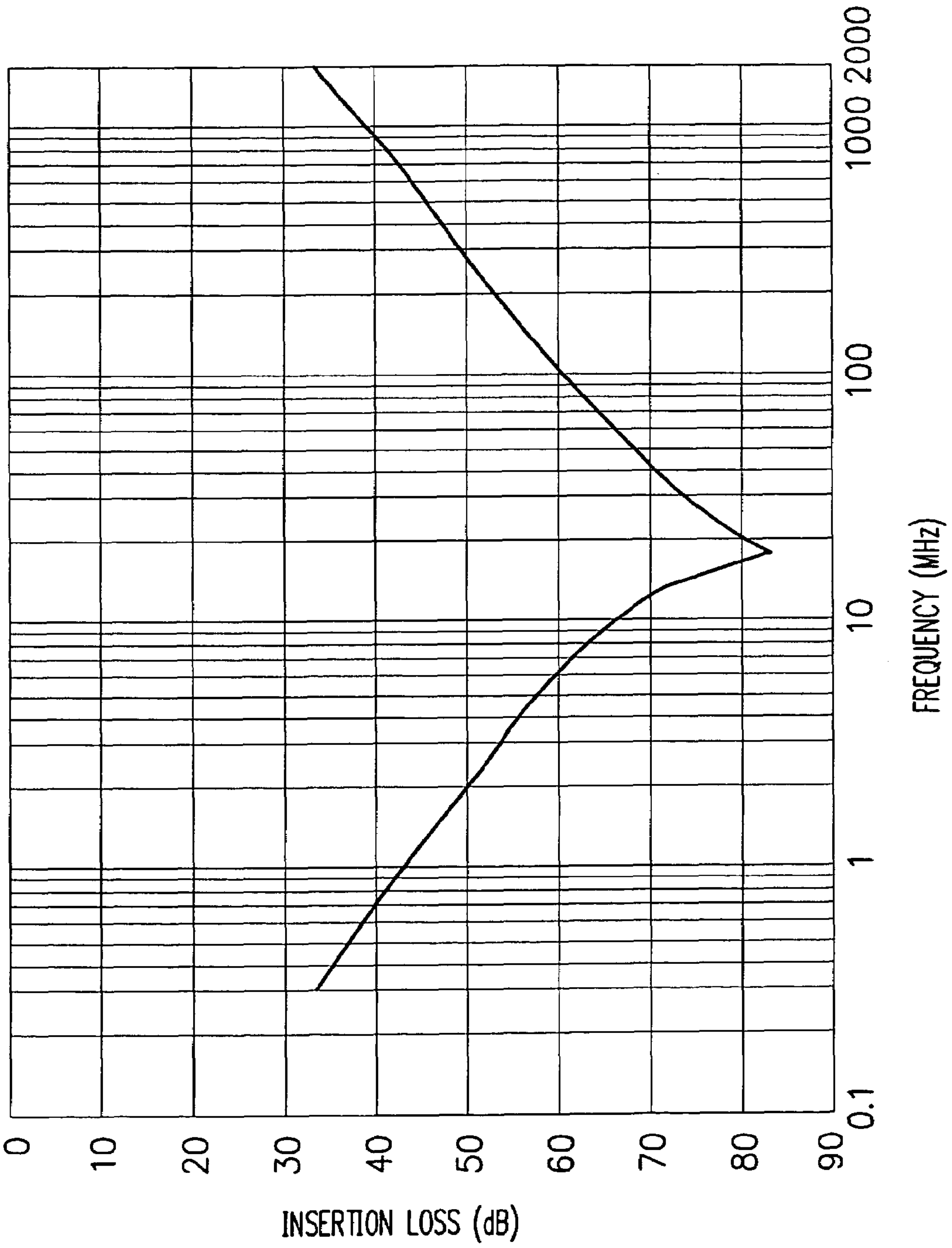
FIG. 3 is an illustration showing the transmission characteristic of a three-terminal filter circuit.
Figure 4:
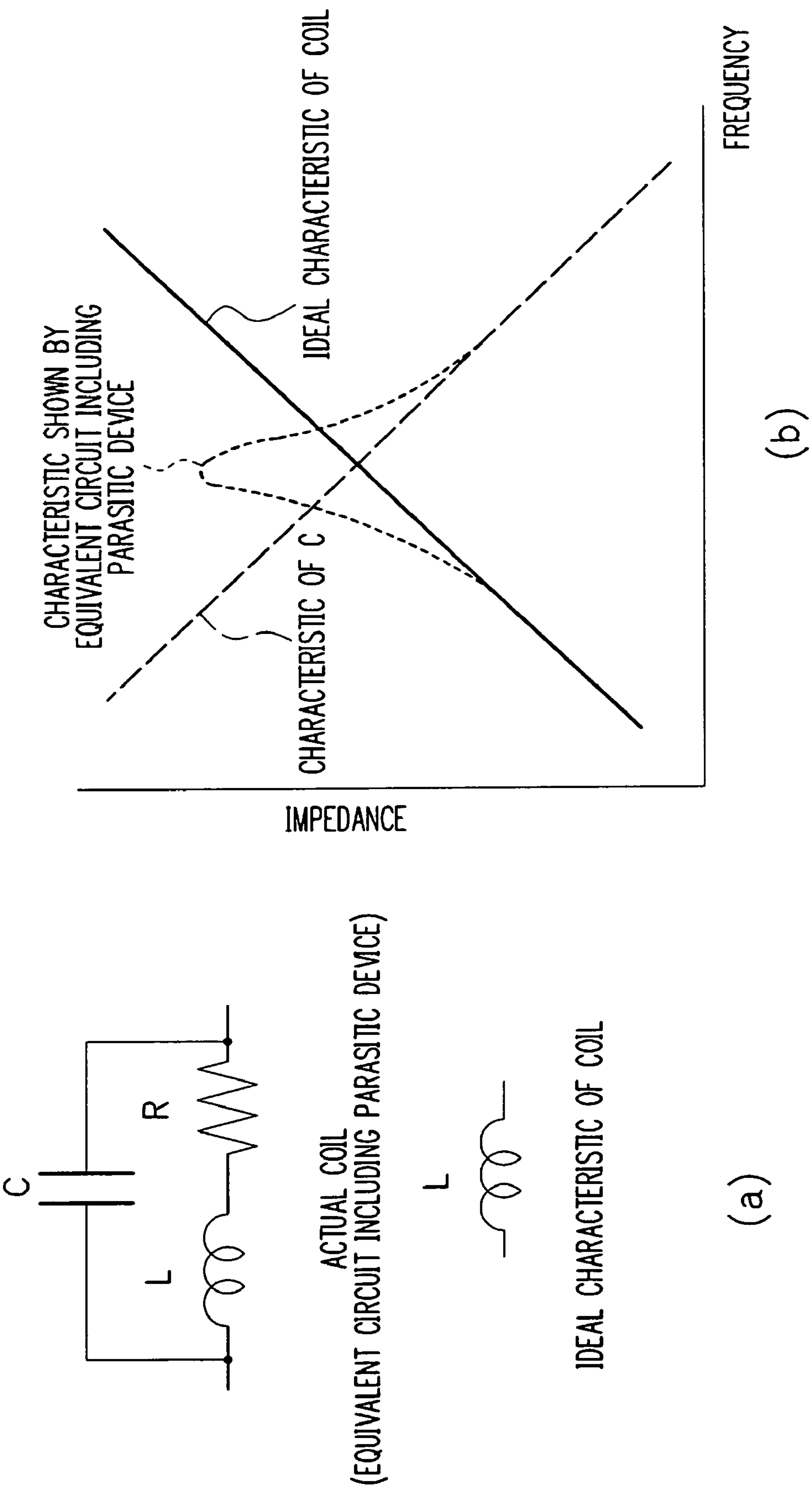
FIGS. 4(*a*) and 4(*b*) are illustrations showing the equivalent circuit of a coil including a parasitic device and its frequency characteristic.

Reference numerals 1*a*, 2*a*, 4*a*, and 5*a* show high-frequency signals. Reference numerals 1*b*, 2*b*, 4*b*, and 5*b* show low-frequency signals. Reference numerals 1*c*, 4*c*, and 5*c* show DC signals. Reference numerals 10*a*, 10*b*, 10*c*, 10*d*, 20*a*, 20*c*, 20*d*, 30*a*, 30*b*, 30*c*, 30*d*, 40*a*, 40*b*, 40*c*, 40*d*, 50*a*, 50*b*, 50*c*, and 50*d* show wiring patterns. Reference numerals 11, 21, 31, 41, and 51 show drivers. Reference numerals 12, 23, 24, 322, and 332 show coils. Reference numerals 13, 22, 42, 46, 47, 52, 56, 57, 321, and 331 show LILC. Reference numerals 13*a*, 13*b*, 13*c*, 13*d*, 22*a*, 22*b*, 22*c*, 22*d*, 42*a*, 42*b*, 42*c*, 42*d*, 46*a*, 46*b*, 46*c*, 46*d*, 52*a*, 52*b*, 52*c*, 52*d*, 56*a*, 56*b*, 56*c*, 56*d*, 57*a*, 57*b*, 57*c*, 57*d*, 321*a*, 321*b*, 321*c*, 321*d*, 322*a*, 322*b*, 322*c*, and 322*d* show terminals of LILCs. Reference numerals 14, 25, 35, 45, and 55 show receivers. Reference numerals 18*a*, 18*b*, 28*a*, 28*b*, 38*a*, 38*b*, 38*c*, 38*d*, 48*a*, 58*a*, and 58*b* show wirings. Reference numerals 19, 43, 44, 53, and 54 show resistances. Reference numerals 81*a*, and 81*b* show grounding conductors. Reference numeral 82 shows a signal transmission conductor. Reference numerals 83 and 113 show dielectrics. Reference numerals 111, 112, 211, 212, 311, 312, 411, and 412 show inverter buffers. Reference numerals 111*a*, 111*b*, 112*a*, 112*bv*, 211*a*, 211*b*, 212*a*, 212*b*, 311*a*, 311*b*, 312*a*, 312*b*, 411*a*, 411*b*, 412*a*, 412*b*, 511*a*, 511*b*, 512*a*, and 512*b* show transistors. Reference numeral 130 shows a sealing material. Reference numeral 131 shows a first conductor. Reference numeral 132 shows a second conductor.

BEST MODE FOR CARRYING OUT THE INVENTION

The present invention realizes a broadband circuit from which a desired circuit characteristic is obtained over a wide frequency band by a smaller number of devices than ever by using a device having a four-terminal line structure and a low impedance (Low Impedance Line Structure Component; hereafter referred to as LILC) instead of a capacitor and thereby forming an electronic circuit.

Figure 5:
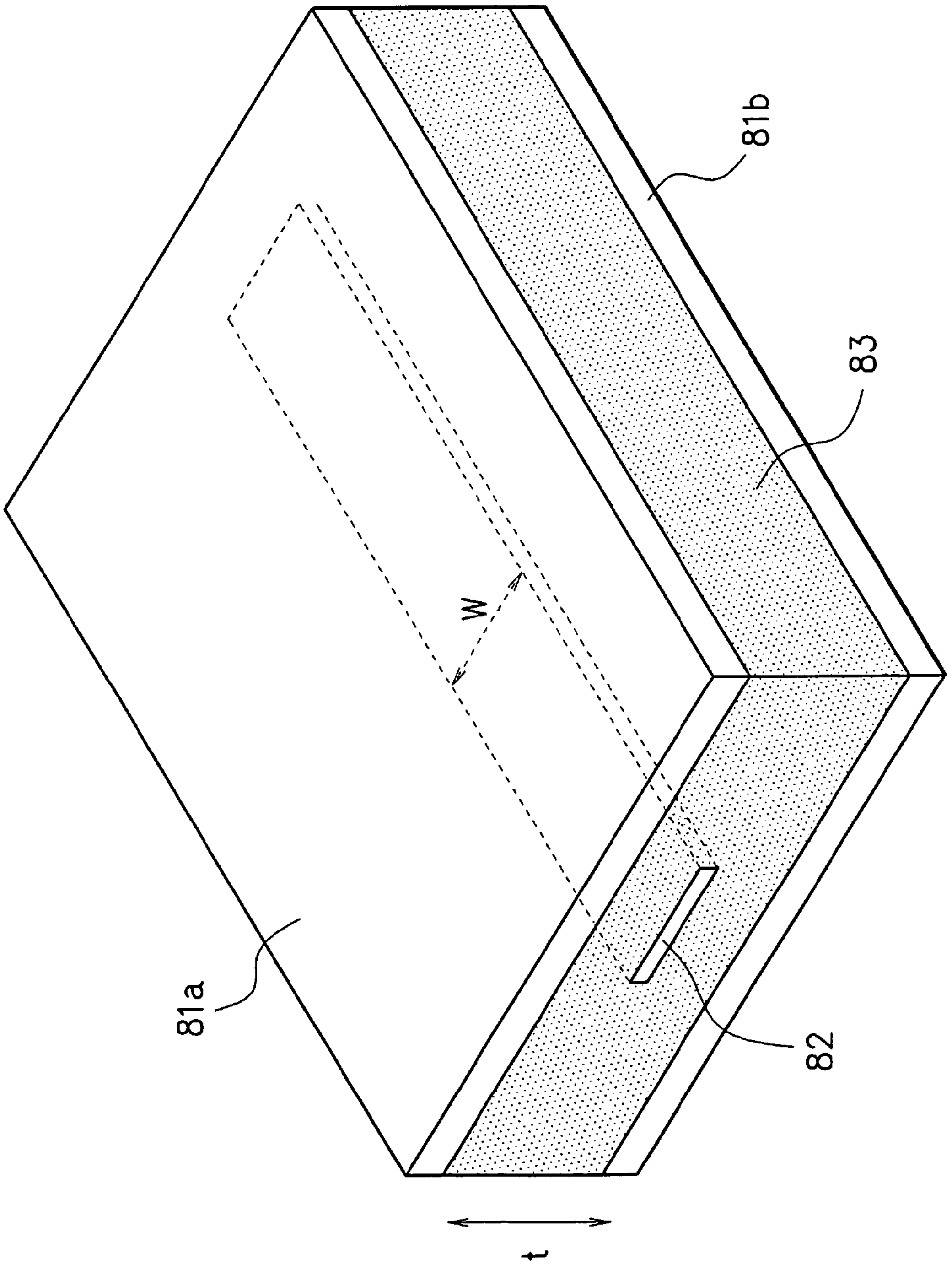
FIG. 5 is an illustration showing a line structure.

A line having the strip structure shown in FIG. 5 is considered. In the case of this line, DC propagates through grounding conductors 81*a* and 81*b* and a signal transmission conductor 82 and an electromagnetic wave propagates through a dielectric 83. When assuming that the resistance and loss of the line can be ignored to simplify the description, the characteristic impedance ZO of this strip line is shown by the expression (1).

$$Z0 = \frac{1}{4}\sqrt{\frac{\mu_0}{\varepsilon_0\varepsilon_r}} - \frac{t}{W} = \sqrt{\frac{L}{C}} \tag{1}$$

t: Thickness of dielectric

W: Width of line $\mu_0$: Magnetic permeability in a vacuum ($1.26\times10^{-6}$ H/m)

$\epsilon_0$: Dielectric constant in a vacuum ($8.85\times10^{-12}$ F/m)

$\epsilon_r$: Specific dielectric constant in dielectrics

In this case, the characteristic impedance of a line is calculated in accordance with $(L/C)^{1/2}$. Therefore, the impedance becomes a value decided by only a capacitance component and an inductance component and is a constant value for frequency. Therefore, a change of characteristics due to frequency does not occur.

Therefore, by lowering the impedance of a device having a line structure (that is, by using the device having the line structure as an LILC) and using the device as a low impedance device, it is possible to realize an electronic circuit showing a desired circuit characteristic independently of frequency.

Parameters for the impedance of the device having the line structure include L (inductance), C (capacitance), R (resistance), and G (conductance). When L or R increases, a problem occurs that the power-supply voltage fluctuation at the time of logic-circuit switching increases. Therefore, it is necessary to lower the impedance by adjusting C.

That is, as understood from the expression (1), it is necessary to increase C of unit length.

Moreover, unless the line length of the device is sufficiently long compared with the wavelength of an electromagnetic wave flowing through the device, it is impossible to regard the device as a line structure. Therefore, it is necessary to make the line length of the LILC sufficiently long compared with the wavelength of an electromagnetic wave flowing through the LILC. Specifically, it is preferable that the substantial length (=effective line length) of a portion through which an electromagnetic wave passes is equal to or longer than ¼ of the wavelength of electromagnetic waves passing through the device.

There is the relation of the expression (2) between reflection coefficient (S11) and transmission coefficient (S21).

The transmission coefficient (S21) including a loss is obtained by the expression (3). The reciprocal of a transmission characteristic is referred to as an insertion loss. The character x in the expression (3) denotes a line length. The character α denotes an attenuation constant constituting a propagation constant and is shown by the expression (4).

Moreover, the conductance G in the expression (4) is shown by the expression (5) when using tanδ used for a capacitor. In the expression (5), S denotes the area of a dielectric and t denotes the thickness of the dielectric.

$$S_{11}^2 + S_{21}^2 = 1 \tag{2}$$

$$S_{21} = \sqrt{1 - S_{11}^2} \cdot e^{-\alpha x} \tag{3}$$

$$\alpha = \sqrt{\frac{\sqrt{R^2 + \omega^2 L^2)(G^2 + \omega^2 C^2)} + (RG - \omega^2 LC)}{2}} \tag{4}$$

$$G = \omega\varepsilon_0\varepsilon_r \frac{S}{t} \cdot \tan\delta \tag{5}$$

When used for an electronic circuit, a line device has a low impedance. However, because it has a finite impedance value, an electromagnetic wave enters the line device. However, as understood from the expressions (3), (4), and (5), the electromagnetic wave entering the line device exponentially attenuates and it hardly goes to the outside. That is, by applying a proper loss to an LILC, it is unnecessary to consider termination for the LILC. It is found that the insertion loss becomes the product of an impedance mismatching value and the exponential of device length, frequency and tanδ.

Thus, an LILC to be applied to an electronic circuit as a low impedance device is a device having a line structure satisfying the following conditions.

<1> The LILC has a length which can be regarded as a line when viewed from an electromagnetic wave propagated through the device. (It is preferable that the substantial length (=effective ling length) of a portion through which an electromagnetic wave passes is equal to or longer than ¼ of the electromagnetic wave of an object frequency.)

<2> The LILC shows an impedance low enough for the circuit characteristic of an electronic circuit to become a desired characteristic. (It is preferable that the capacitance C of unit length is large.)

<3> The LILC increases a dielectric loss and lengthens a line according to necessity.

Figure 6:
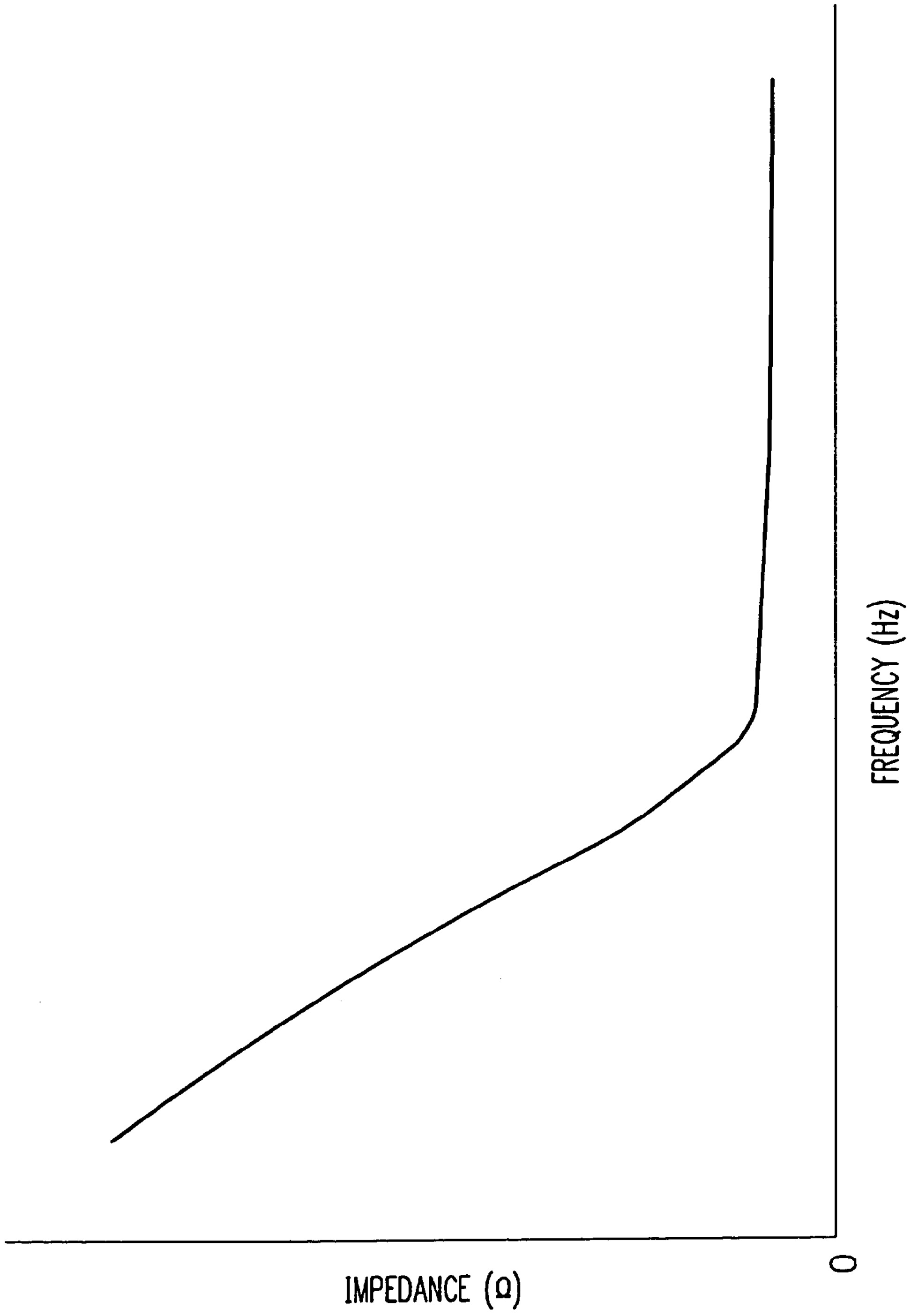
FIG. 6 is an illustration showing a relation between impedances and frequencies of a line structure device.

In the case of the line device, a relation between frequency and impedance is shown in FIG. 6. An impedance is not increased in a frequency band in which the device can be regarded as a line because the impedance is influenced by a parasitic device.

In this case, description is made by using the line having the strip structure as an example. However, the structure of the LILC is not restricted to the strip structure. It is allowed to use a microstrip-type line structure or coaxial cylindrical line structure.

A preferred embodiment of a broadband circuit to which the above LILC is applied as a low impedance device is described below.

FIRST EMBODIMENT

Figure 7:
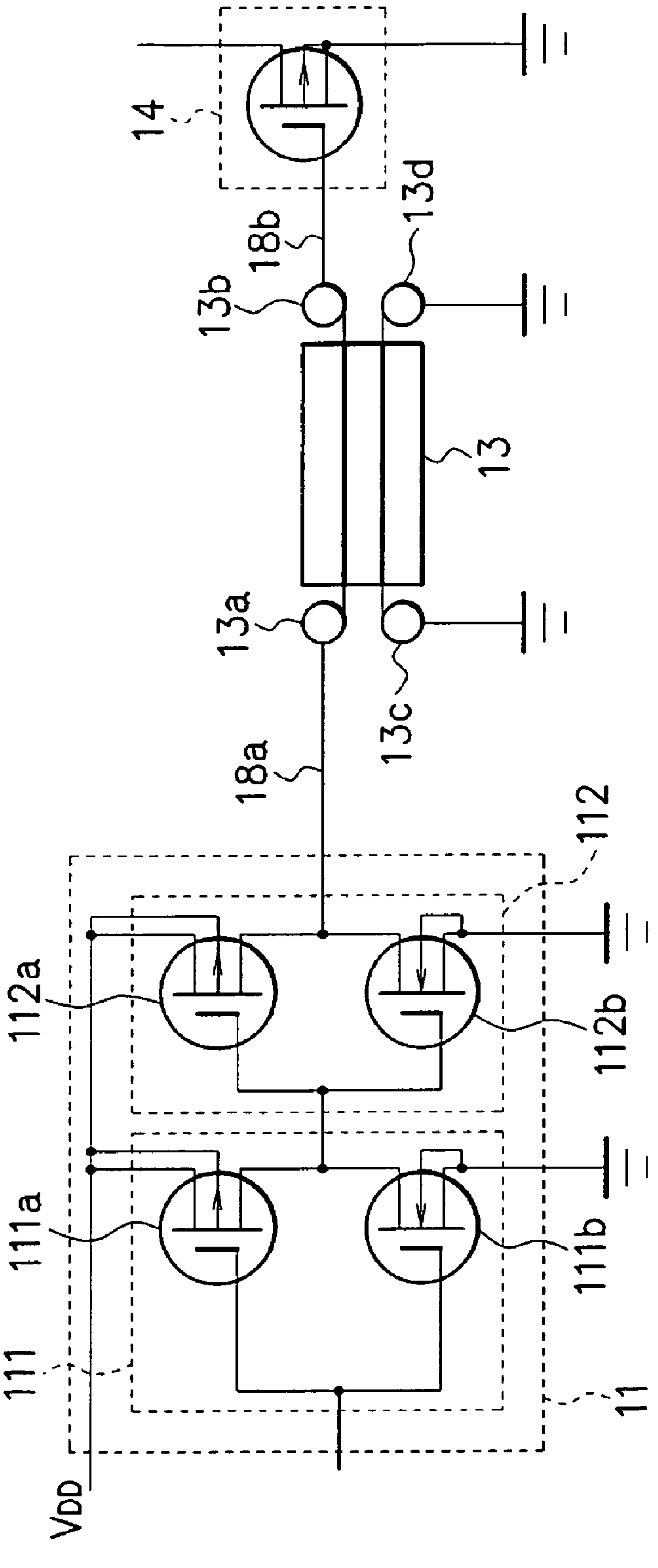
FIG. 7 is an illustration showing a configuration of an LPF circuit of first embodiment preferably executing the present invention.

First embodiment to which the present invention is preferably applied is described below. FIG. 7 shows a configuration of a low-pass filter circuit (LPF circuit) to which the present invention is applied. This circuit has a driver 11, a LILC 13, and a receiver 14.

The driver 11 has inverter buffers 111 and 112 and the inverter buffers 111 and 112 connected in series constitute a buffer circuit. The inverter buffer 111 has transistors 111*a* and 111*b* and the inverter buffer 112 has transistors 112*a* and 112*b*. The high-side transistors 111*a* and 112*a* are P channels and are turned off when a gate voltage is kept at high level. Moreover, the low-side transistors 111*b* and 112*b* are N channels and are turn on when a gate voltage is kept at high level. $V_{DD}$ is supplied to drain terminals of the transistors 111*a* and 112*a* from a not-illustrated power supply. The transistors 111*a* and 111*b* respectively output signal waves by switching $V_{DD}$ in accordance with a gate voltage to input the signal wave to the input terminal of the inverter buffer 112. The transistors 112*a* and 112*b* respectively generate signal waves by switching $V_{DD}$ in accordance with the signal wave input to a gate terminal and the signal wave is output from the driver 11 as a signal electromagnetic wave. The LILC 13 is a device having a four-terminal line structure in which a pair of conductors are faced each other at the both sides of a dielectric and the characteristic impedance Z0 is set to a value (Z0/Z1≈0) very smaller than the characteristic impedance Z1 of the wiring 18*a* for connecting the driver 11 with the LILC 13. A terminal 13*a* of the LILC 13 is connected with the output terminal of the driver 11 and a terminal 13*b* is connected to the input terminal of the receiver 14. Moreover, terminals 13*c* and 13*d* of the LILC 13 are connected to the ground. The receiver 14 is a transistor for converting a signal inputted to the input terminal (gate terminal) into voltage.

Figure 8:
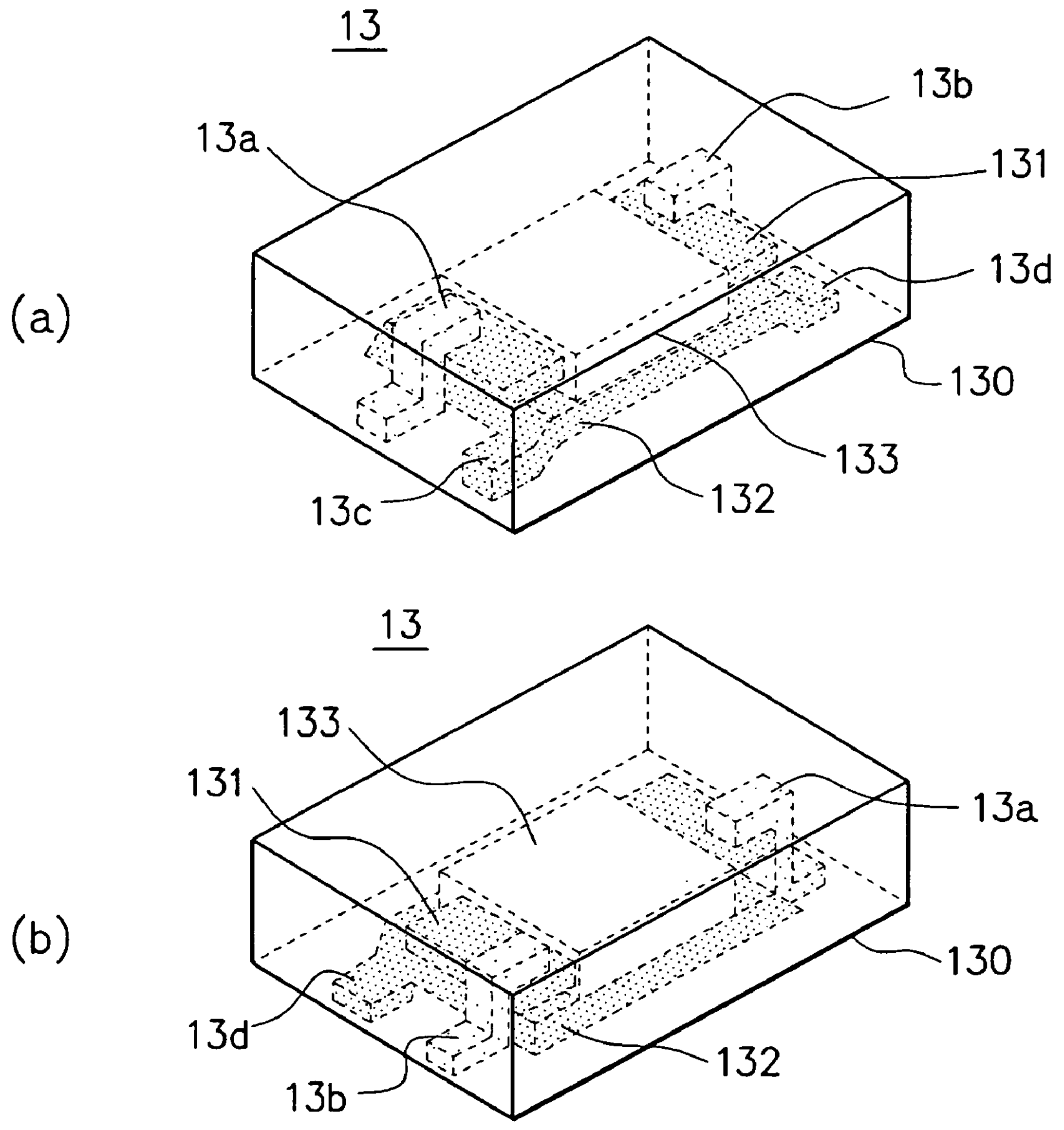
FIGS. 8(*a*) and 8(*b*) are illustrations showing an LILC structure.

FIGS. 8(*a*) and 8(*b*) show a structure of the LILC 13 to be applied to the LPF circuit of this embodiment. FIGS. 8(*a*) and 8(*b*) show the same configuration from different view points. A dielectric 133 is set so as to surround the first conductor 131. The first conductor 131 and the second conductor 132 are set so as to be faced each other through the dielectric 133 and fixed as they are by the sealing material 130.

The terminals 13*a* and 13*b* are set to the first electrode 131 and the terminals 13*c* and 13*d* are set to the second electrode 132. The terminals extend to the bottom side of the LILC 13, pass through the sealing material 130, and are exposed (or protruded) to the outside. By connecting the terminals exposed (or protruded) from the sealing material 130 to a signal transmission conductor and a grounding conductor, it is possible to insert the LILC 13 into a transmission line.

A case of applying the LILC having the above structure to all embodiments is described as an example. However, the above structure is an example and a structure of the LILC is not restricted to the above structure.

Figure 9:
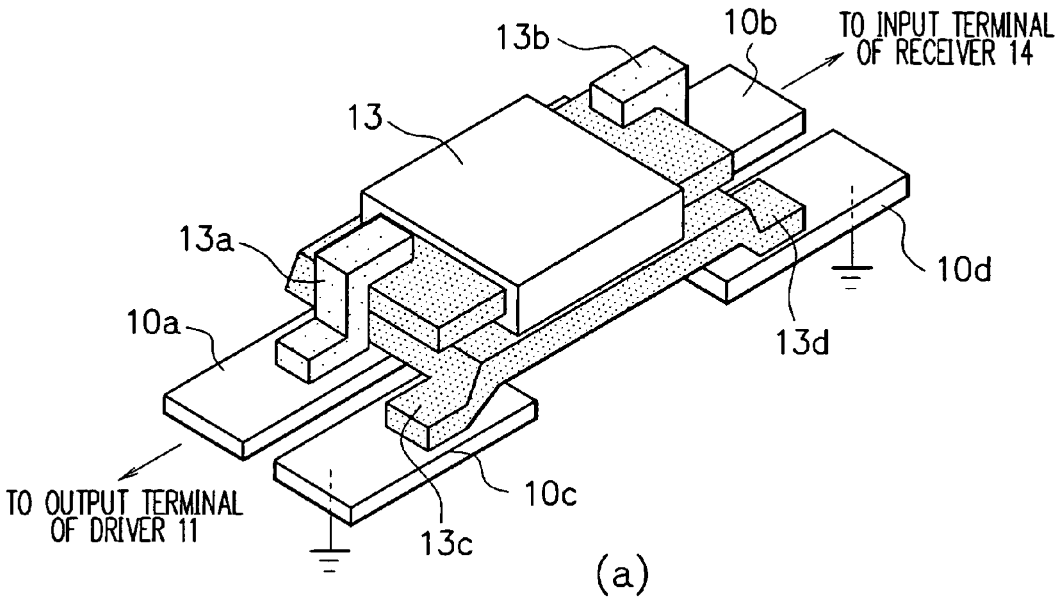
FIGS. 9(*a*) and 9(*b*) are illustrations showing an embodiment of an LILC to be applied to the LPF circuit of the first embodiment.
Figure 9:
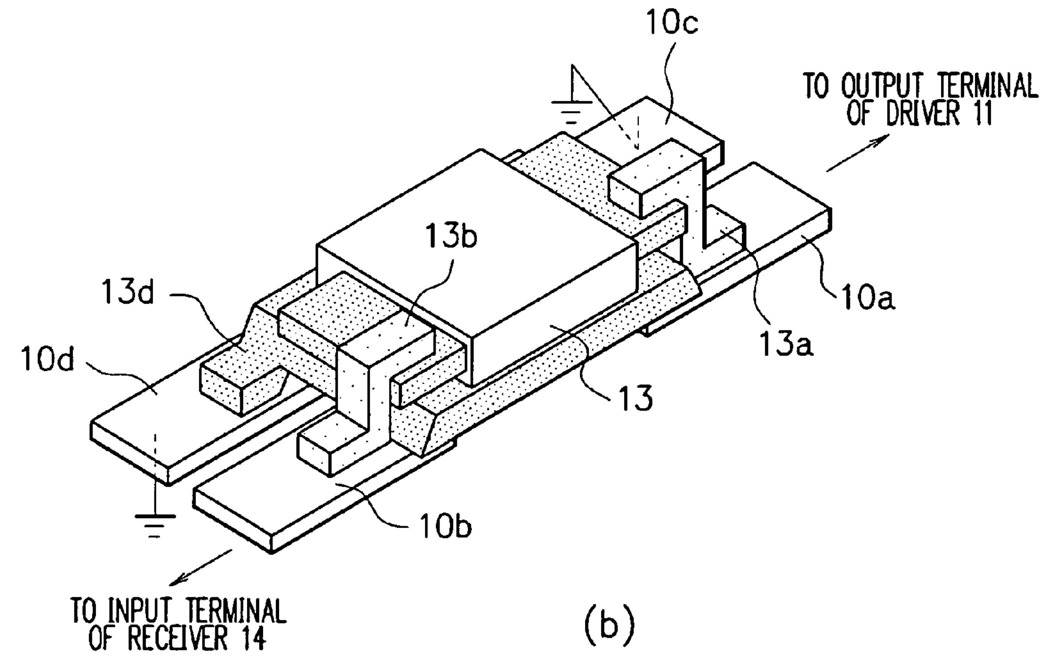

FIGS. 9(*a*) and 9(*b*) show a state of setting the LILC 13 to a wiring pattern on a printed circuit board. In this case, the sealing material 130 is not shown in FIG. 9(*a*) or 9(*b*) in order to easily understand the state of the LILC 13 (same is applied to other embodiments). To show states of both ends of the LILC 13, FIGS. 9(*a*) and 9(*b*) show the same configuration from different view points. The terminal 13*a* of the LILC 13 is connected to the wiring pattern 10*a* connected to the output terminal of the driver 11. The terminal 13*b* of the LILC 13 is connected to the wiring pattern 10*b* connected to the gate terminal of the receiver 14. The terminal 13*c* and 13*d* of the LILC 13 are respectively connected to the wiring patterns 10*c* and 10*d*, which are connected to the ground.

Figure 10:
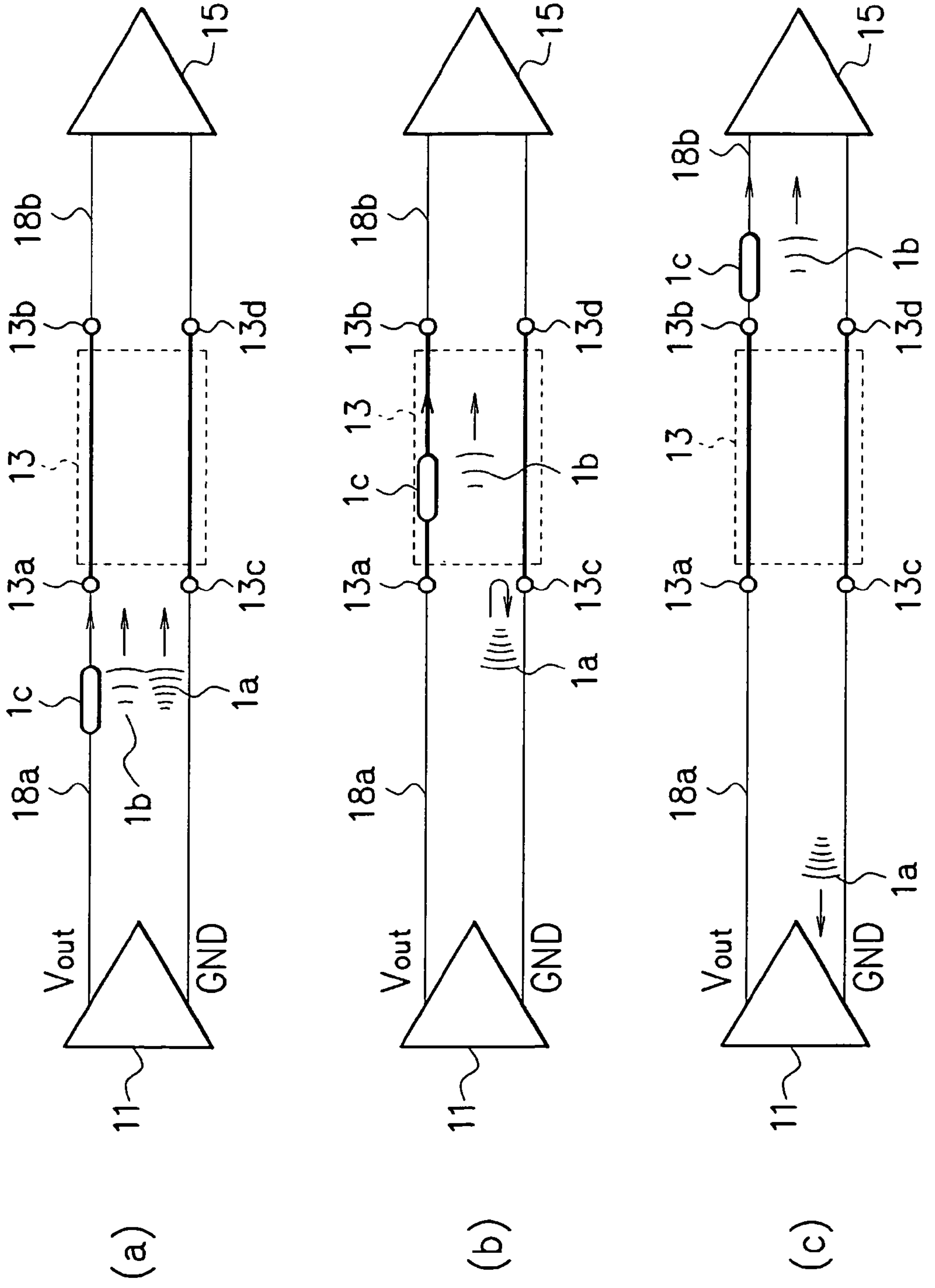
FIGS. 10(*a*) to 10(*c*) are illustrations for explaining a process in which a pulse signal wave passes through the LPF circuit of the first embodiment.

Operations of the LPF circuit are described below. FIGS. 10(*a*) to 10(*c*) show states in which pulse signal waves output from the driver 11 pass through the LPF circuit. As shown in FIG. 10(*a*), pulse signal waves output from the driver 11 reach the LILC 13 through a line including the wiring 18*a* and the ground. Among pulse signal waves reaching the LILC 13, an electromagnetic wave component (high-frequency signal 1*a*) having a high frequency and thus being capable of regarding the LILC 13 as a line is influenced by mismatching between the impedance of the wiring 18*a* and the impedance of the LILC 13. In this case, because $Z0/Z1 \approx 0$, the high-frequency signal 1*a* is reflected by the LILC 13.

However, because an electromagnetic wave component having a low frequency (low frequency signal 1*b*) cannot regard the LILC 13 as a line, it is not influenced by impedance mismatching between the wiring 18*a* and the LILC 13. Therefore, the low frequency signal 1*b* enters the LILC 13 without being reflected, passes through the portion of the dielectric of the LILC 13, and is propagated to the receiver-14 side. Moreover, the DC signal 1*c* transmits to the receiver-14 side by passing through the conductor portion of the LILC 13.

As shown in FIG. 10(*c*), the low frequency signal 1*b* propagating to the receiver-14 side and the transmitted DC signal 1*c* enter the gate terminal of the receiver 14 to operate the receiver 14. Thereby, the receiver 14 operates in accordance with only low frequency signals and DC signals among pulse signals generated by the driver 11.

Figure 11:
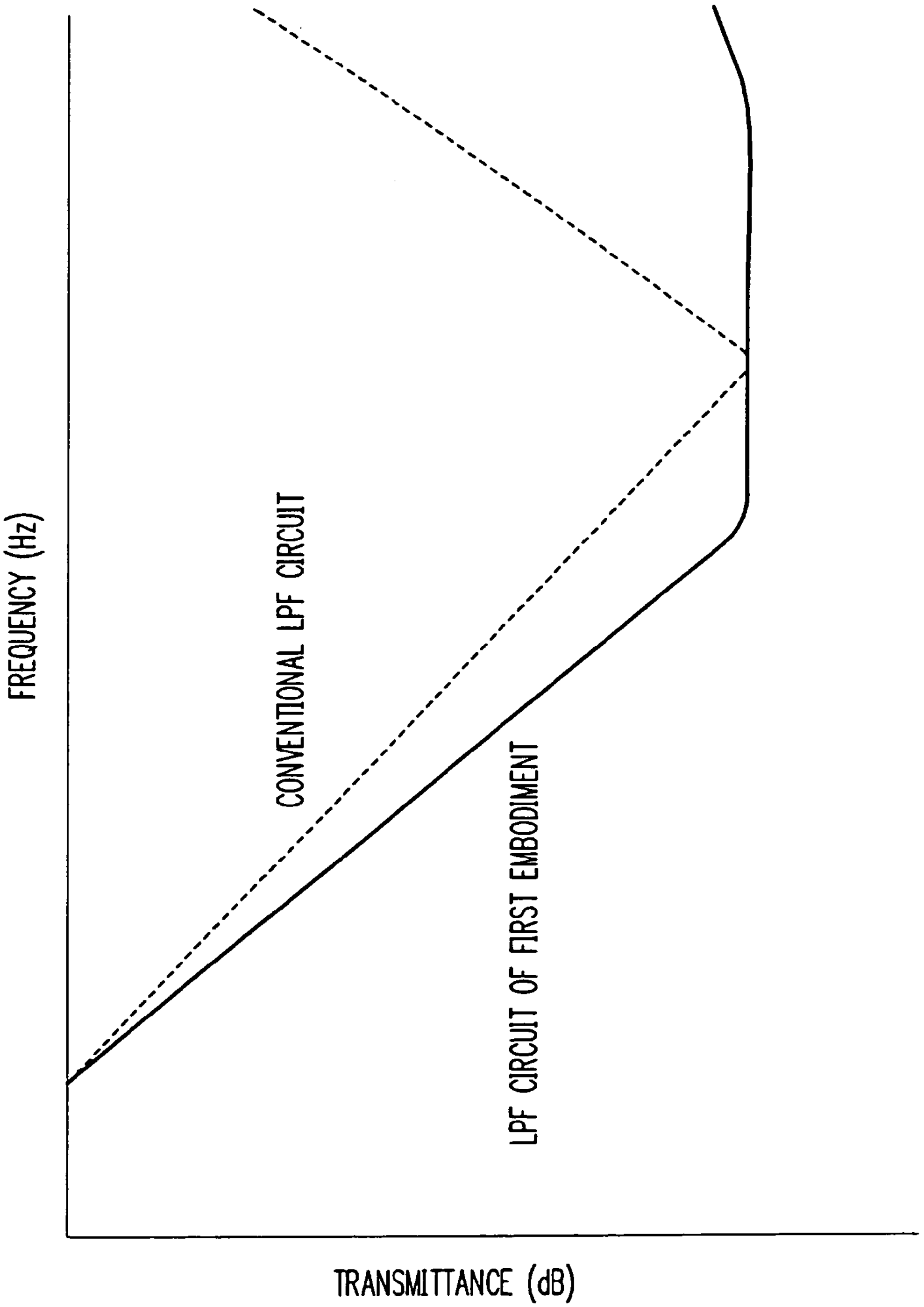
FIG. 11 is an illustration showing the transmission characteristic of the LPF circuit of the first embodiment.

FIG. 11 shows the transmission characteristic diagram of the LPF circuit. The ordinate axis denotes transmittance (dB) and the abscissa axis denotes frequency (Hz). In the case of this embodiment, a constant impedance is obtained independently of frequency and an LPF circuit is formed by using a LILC having a slightly large dielectric loss. Therefore, it is prevented that the circuit is influenced by a parasitic device and transmission characteristic is deteriorated even in a frequency band equal to or higher than a cutoff frequency.

Therefore, the LPF circuit of this embodiment has a low transmittance to an electromagnetic wave of a frequency higher than the cutoff frequency and shows a circuit characteristic close to that of an ideal LPF circuit differing from a conventional LPF circuit.

It is possible to set a cutoff frequency arbitrarily by changing the substantial length (effective line length) of the line portion of the LILC 13. When an aspect ratio (ratio between the width of the line portion of the LILC 13 and the gap of a pair of conductors) and the film thickness of an insulator are fixed, the length of the line portion of the LILC 13 is inversely proportional to the cutoff frequency. This is not only applied to an LPF circuit but to all embodiments.

Thus, the LPF circuit of this embodiment is a broadband circuit which can be easily designed without performing complex calculation or depending on the cut-and-try technique. Moreover, because the number of design parameters is small, it is possible to improve the stability and reliability of circuit characteristics.

SECOND EMBODIMENT

Figure 12:
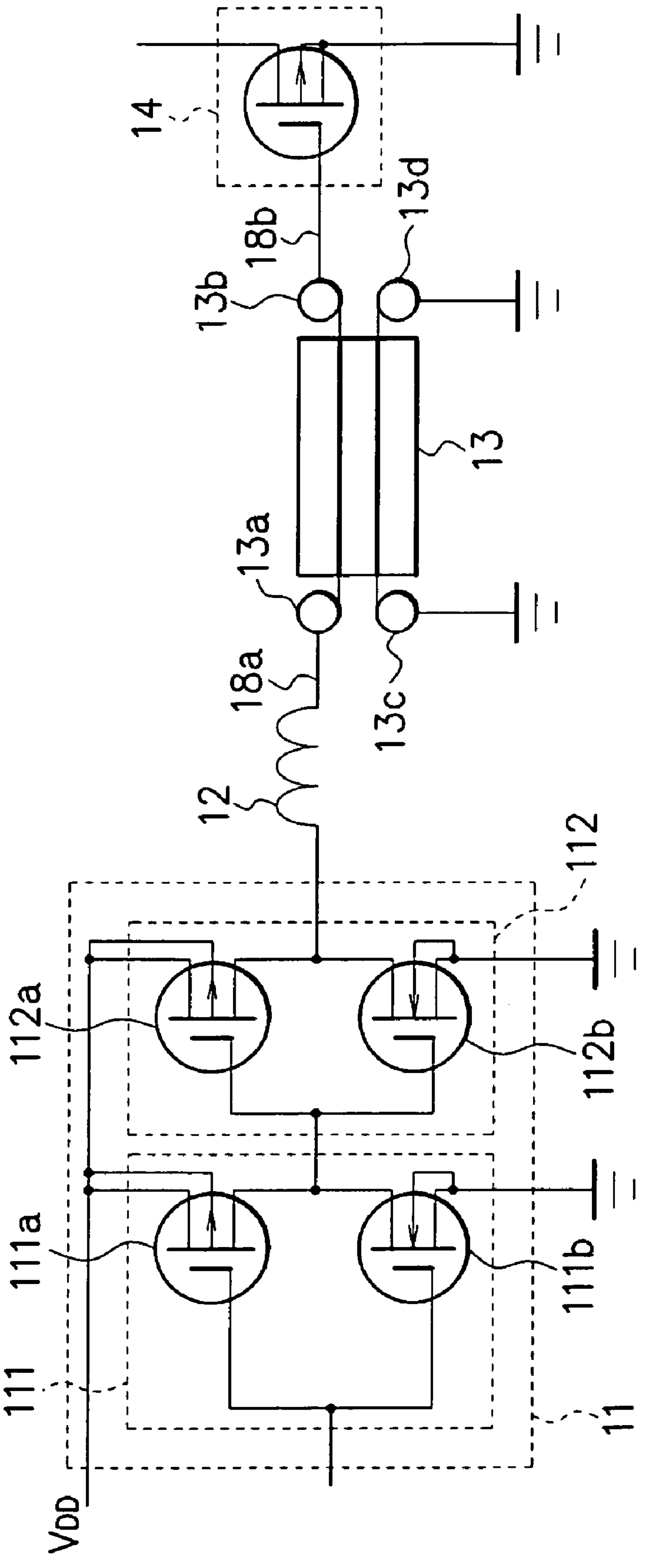
FIG. 12 is an illustration showing a configuration of an LPF circuit of second embodiment preferably executing the present invention.

First embodiment preferably executing the present invention is described below. FIG. 12 shows a configuration of a low-pass filter circuit (LPF circuit) to which the present invention is applied. This circuit is the same as that of the first embodiment except that a coil 12 is set between a driver 11 and an LILC 13. The coil 12 is a device set to improve the characteristic of a low pass filter. Operations of the LPF circuit are the same as the first embodiment.

Figure 13:
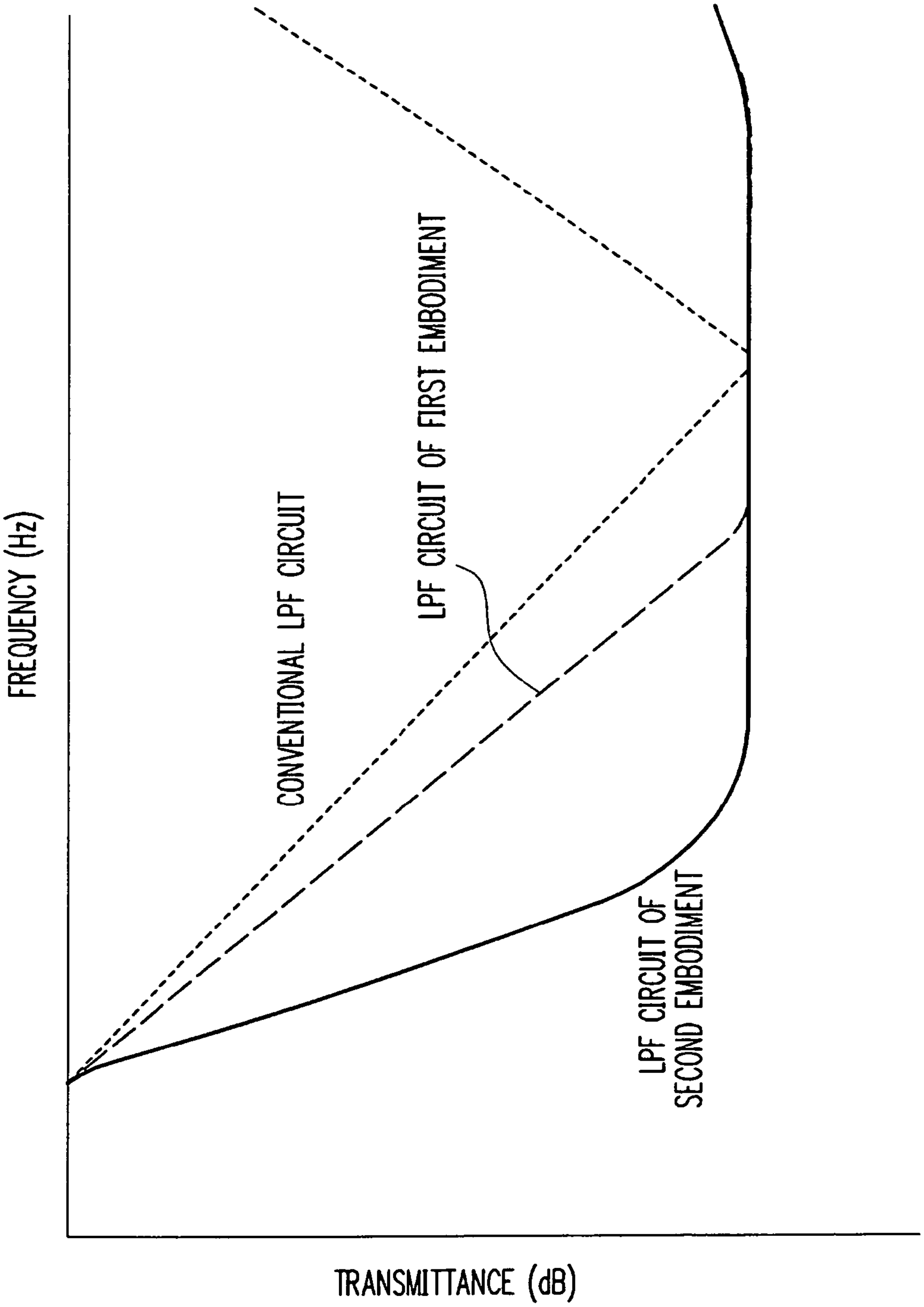
FIG. 13 is an illustration showing the transmission characteristic of the LPF circuit of the second embodiment.

FIG. 13 shows the transmission characteristic of the LPF circuit. The ordinate axis denotes transmittance (dB) and the abscissa axis denotes frequency of incoming wave (Hz). The coil 12 set between the driver 11 and the LILC 13 (in other words, inserted into a wiring 18*a*) shows an inductance characteristic in a low frequency band. Therefore, the inductance characteristic of the coil 12 and the capacitance characteristic of the LILC 13 create synergy effect and when frequency exceeds a predetermined frequency, the transmittance suddenly decreases.

Moreover, the coil 12 shows a capacitance characteristic in a high frequency band. However, because the low impedance characteristic of the LILC 13 does not change even in a high frequency band and a dielectric loss is slightly increased, the transmittance of the LPF circuit is not increased even in a frequency band equal to or higher than a cutoff frequency.

Thus, the LPF circuit of this embodiment has a low transmittance to an electromagnetic wave having a frequency higher than a resonant frequency and shows a circuit characteristic close to that of an ideal LPF circuit similarly to the LPF circuit of the first embodiment.

Therefore, the LPF circuit of this embodiment is a broadband circuit which can be easily designed without performing complex calculation or depending on the cut-and-try technique. Moreover, because the number of design parameters is small, it is possible to improve the stability and reliability of a circuit characteristic.

THIRD EMBODIMENT

Figure 14:
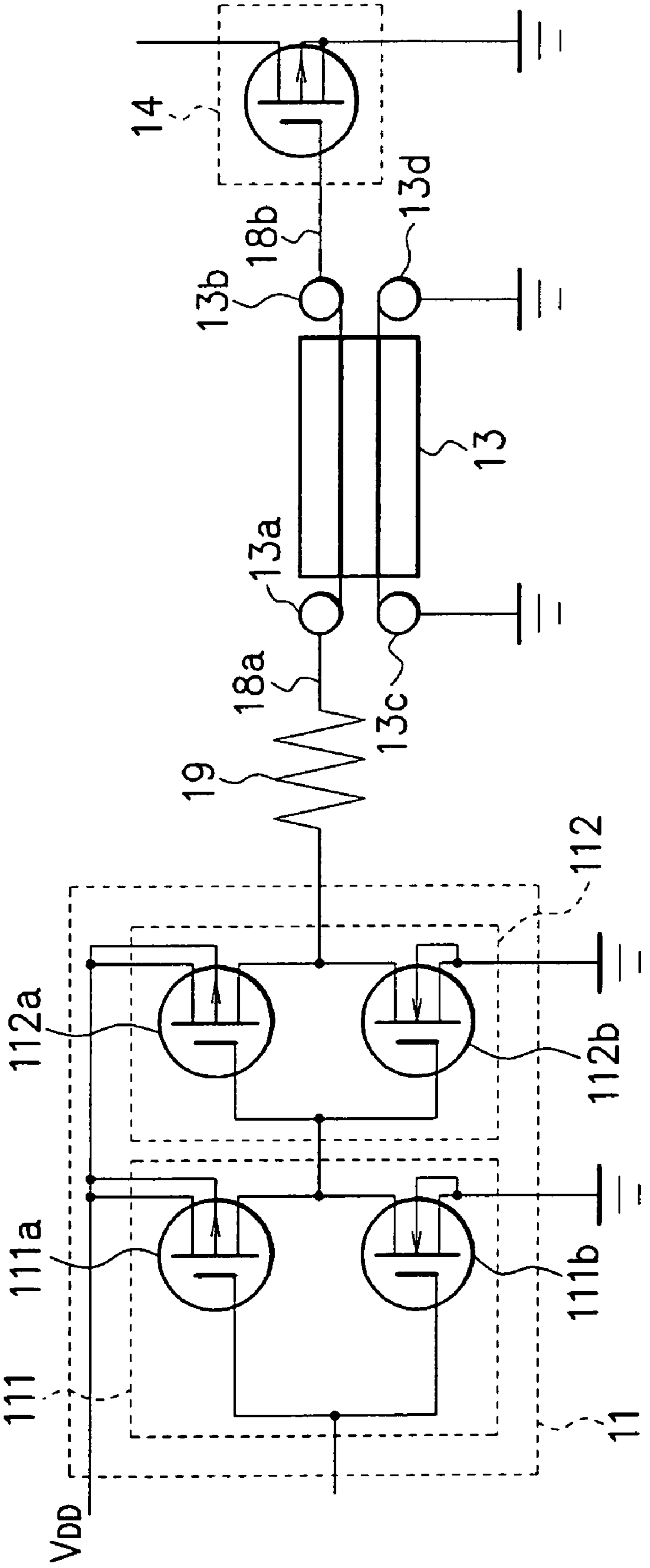
FIG. 14 is an illustration showing a configuration of an LPF circuit of third embodiment preferably executing the present invention.

Third embodiment preferably executing the present invention is described below. FIG. 14 shows a configuration of a low-pass filter circuit (LPF circuit) under the present invention. This circuit is the same as that the first embodiment except that a resistance 19 is further set between the driver 11 and the LILC 13. A coil 19 is a device set to improve the characteristic of a low-pass filter. Operations of an LPF circuit are the same as the first embodiment.

The resistance 19 set between the driver 11 and the LILC 13 (in other words, inserted into a wiring 18*a*)is not influenced by a parasitic device in a low frequency band and its impedance is constant independently of frequency. Therefore, when a resistance value is low, the resistance 19 shows the same characteristic as a coil. Therefore, when the resistance value of the resistance 19 is low, the characteristic of the resistance 19 and the capacitance characteristic of the LILC 13 create synergy effect but when frequency exceeds a predetermined frequency, the transmittance is suddenly decreased.

Moreover, the capacitance characteristic of the LILC 13 is not changed even in a high frequency band and the dielectric loss is slightly increased. Therefore, the transmittance of the LPF circuit is not increased even in a frequency band equal to or higher than a cutoff frequency.

Therefore, the LPF circuit of this embodiment has a low transmittance to an electromagnetic wave of a frequency higher than a resonant frequency and shows a circuit characteristic close to an ideal LPF circuit similarly to the LPF circuit of the first embodiment.

Thus, the LPF circuit of the embodiment is a broadband circuit which can be easily designed without performing complex calculation or depending on the cut-and-try technique. Moreover, because the number of design parameters is small, it is possible to improve the stability and reliability of circuit characteristics.

FOURTH EMBODIMENT

Figure 15:
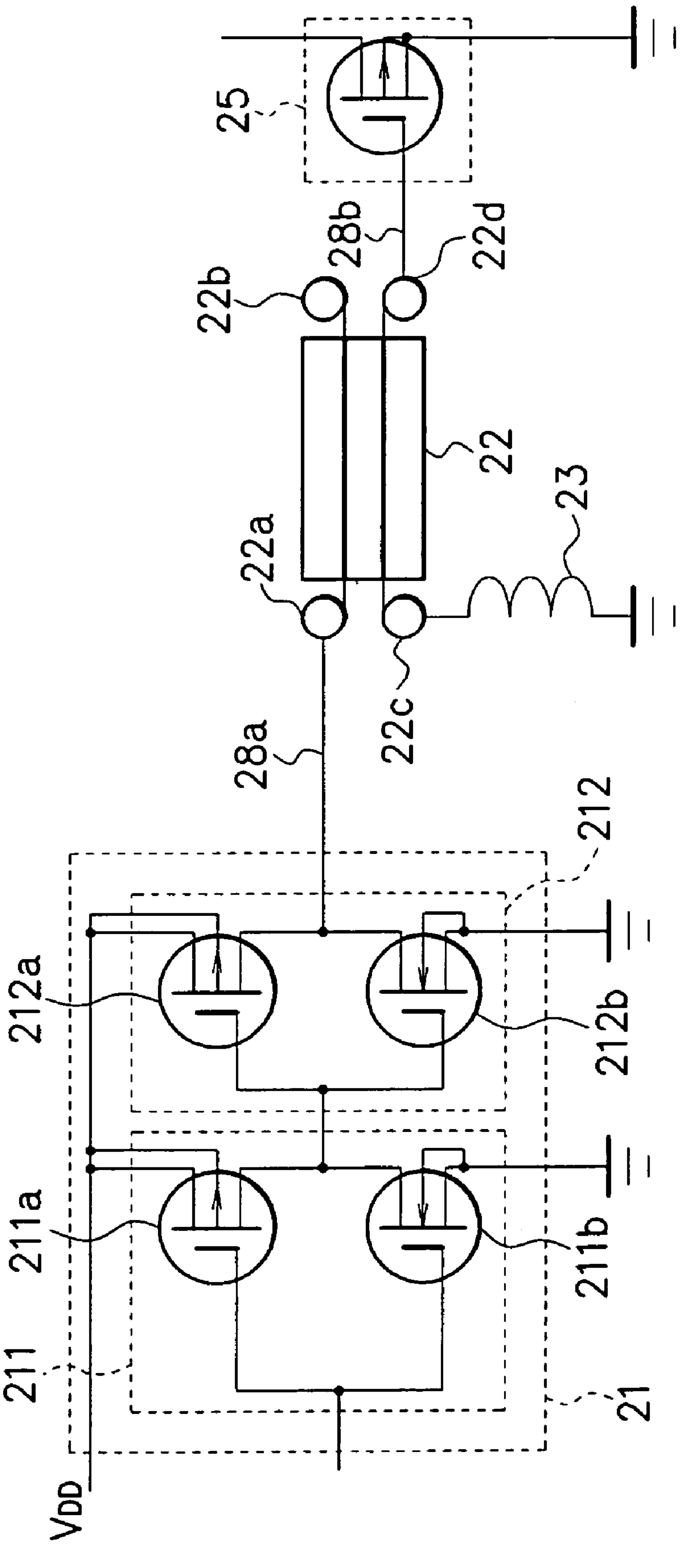
FIG. 15 is an illustration showing a configuration of an HPF circuit of fourth embodiment preferably executing the present invention.

Fourth embodiment preferably executing the present invention is described below. FIG. 15 shows a configuration of a high-pass filter circuit (HPF circuit) to which the present invention is applied.

This HPF circuit has a driver 21, a LILC 22, a coil 23, and a receiver 25. The driver 21 is constituted of transistors 211 and 212.

The driver 21 has a configuration same as the driver 11 of the first embodiment and outputs signal electromagnetic waves from the output terminal. The LILC 22 is a device having a four-terminal line structure in which a pair of conductors are faced at the both sides of a dielectric and its characteristic impedance Z0 is set to a value ($Z0/Z2 \approx 0$) very smaller than the characteristic impedance Z2 of a wiring 28*a* for connecting the driver 21 with the LILC 22. The terminal 22*a* of the LILC 22 is connected to the output terminal of the driver 21 and the terminal 22*b* is opened. Moreover, the terminal 22*c* of the LILC 22 is connected to the ground through the coil 23. The terminal 22*d* of the LILC 22 is connected to the input terminal of the receiver 25. The coil 23 is a device set to improve the characteristic of a bypass filter. The receiver 25 is a transistor for converting a signal inputted to the input terminal (gate terminal) into a voltage.

Figure 16:
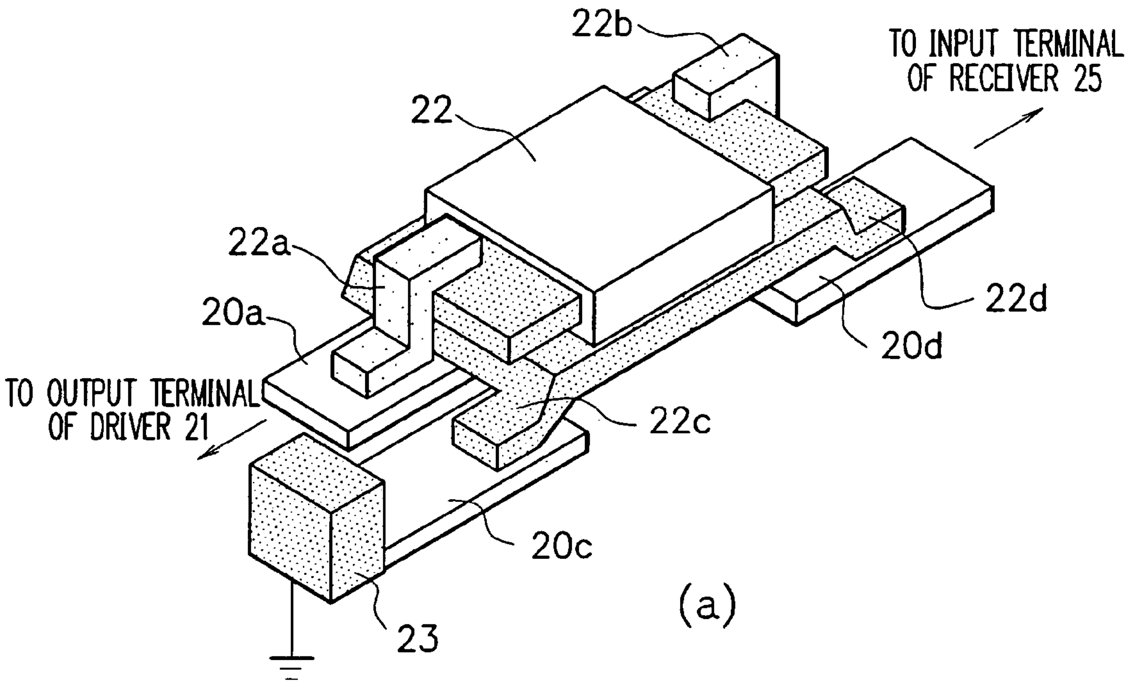
FIGS. 16(*a*) and 16(*b*) are illustrations showing an embodiment of an LILC to be applied to the HPF circuit of the fourth embodiment.
Figure 16:
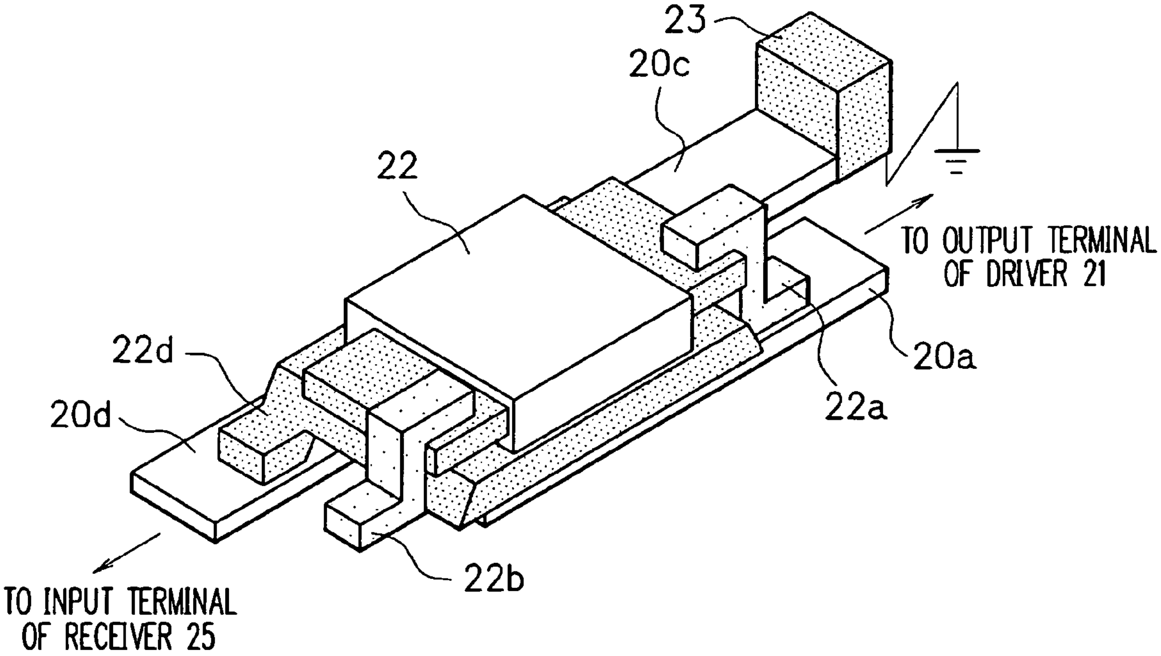

FIGS. 16(*a*) and 16(*b*) show a state of setting the LILC 22 to a wiring pattern on a printed circuit board. To show connection states at the both ends of the LILC 22, FIG. 16(*a*) and 16(*b*) show states viewed from two directions by changing view points. The terminal 22*a* of the LILC 22 is connected to a wiring pattern 20*a* connected with the output terminal of the driver 21. The terminal 22*b* of the LILC 22 is opened without being connected to any wiring pattern. The terminal 22*c* is connected to the wiring pattern 20*c* connected to the ground through the coil 23. The terminal 22*d* of the LILC 22 is connected with a wiring pattern 20*d* connected with the gate terminal of the receiver 25.

Figure 17:
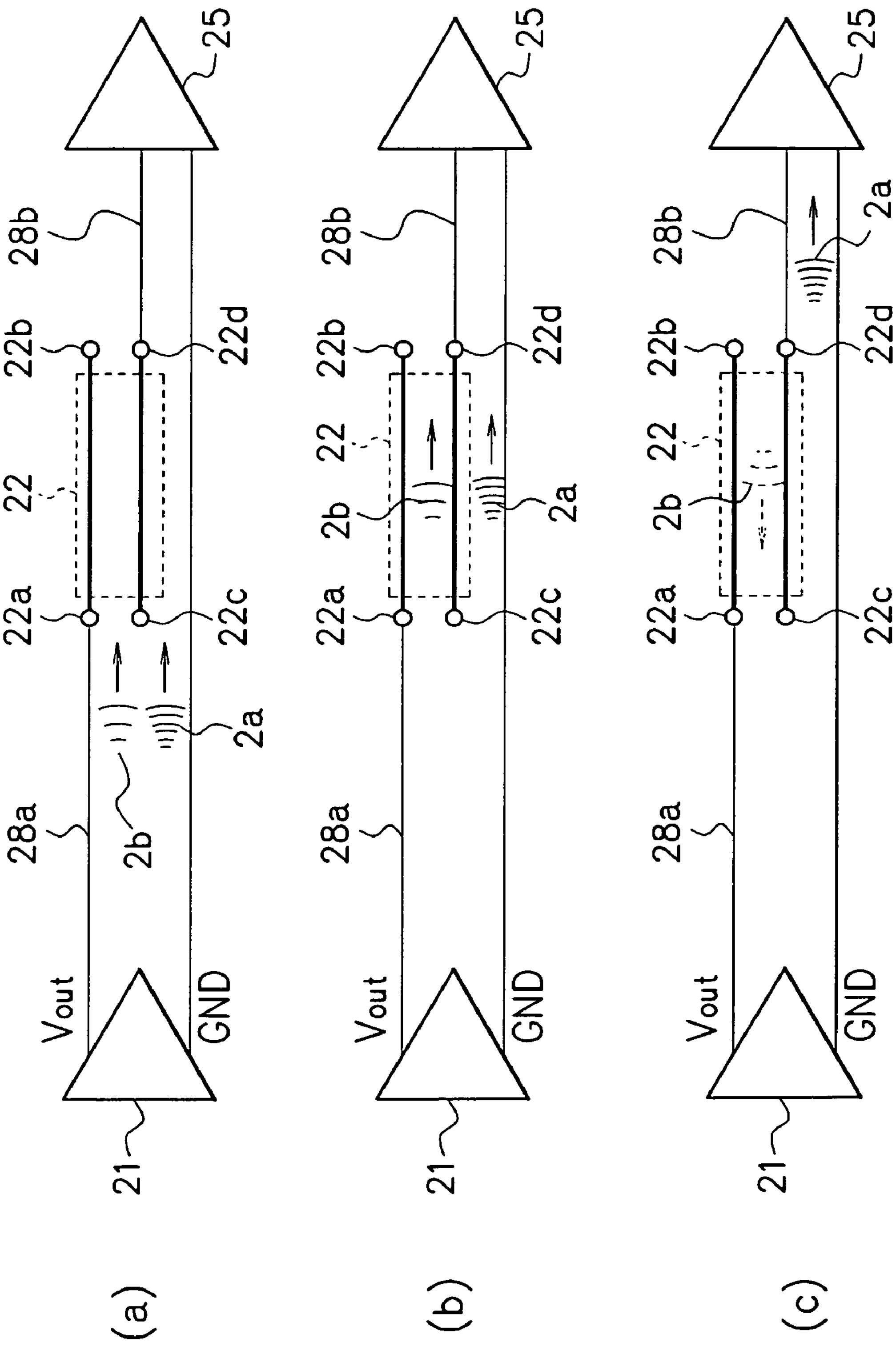
FIGS. 17(*a*) to 17(*c*) are illustrations for explaining a process in which a pulse signal wave passes through the HPF circuit of the fourth embodiment.

Operations of the HPF circuit are described below. FIGS. 17(*a*) to 17(*c*) show states in which pulse signal waves output from the driver 21 pass through an LPF circuit. As shown in FIG. 17(*a*), the pulse signal waves output from the driver 21 reach the LILC 22 through a line including the wiring 28*a* and the ground. In the case of this embodiment, because the terminal 22*b* of the LILC 22 is opened, the DC component DC signal) of a pulse signal is not transferred. An electromagnetic component (high-frequency signal 2*a*) having a high frequency and capable of regarding the LILC 22 as a line among pulse signal waves reaching the LILC 22 is influenced by mismatching between the impedance of the wiring 28*a* and the impedance of the LILC 22. In this case, because $Z0/Z2 \approx 0$, the high-frequency signal does not enter the LILC 22 but reaches the gate terminal of the receiver 25 by passing the gap between one of the conductors connected to the ground through the coil 23 and the ground as shown in FIG. 17(*b*). That is, the high-frequency signal proceeds to the receiver 25 side by bypassing the LILC 22 through a line including one of the conductors of the LILC 22 having terminals 22*c* and 22*d* and a ground plane.

However, an electromagnetic wave component having a low frequency (low frequency signal 2*b*) among the pulse signal waves reaching the LILC 22 enters the dielectric in the LILC 22 without being influenced by mismatching between the impedance of the wiring 28*a* and the impedance of the LILC 22. However, because the terminal 22*b* of the LILC 22 is electrically opened, the component does not reach the receiver 25 but it attenuates in the LILC 22 because the loss of the dielectric is set to be slightly high.

As shown in FIG. 17(*c*), the high-frequency signal entering the gate terminal of the receiver 25 operates the receiver 25. Thereby, the receiver 25 operates in accordance with only high-frequency signals among pulse signal waves generated by the driver 21.

Figure 18:
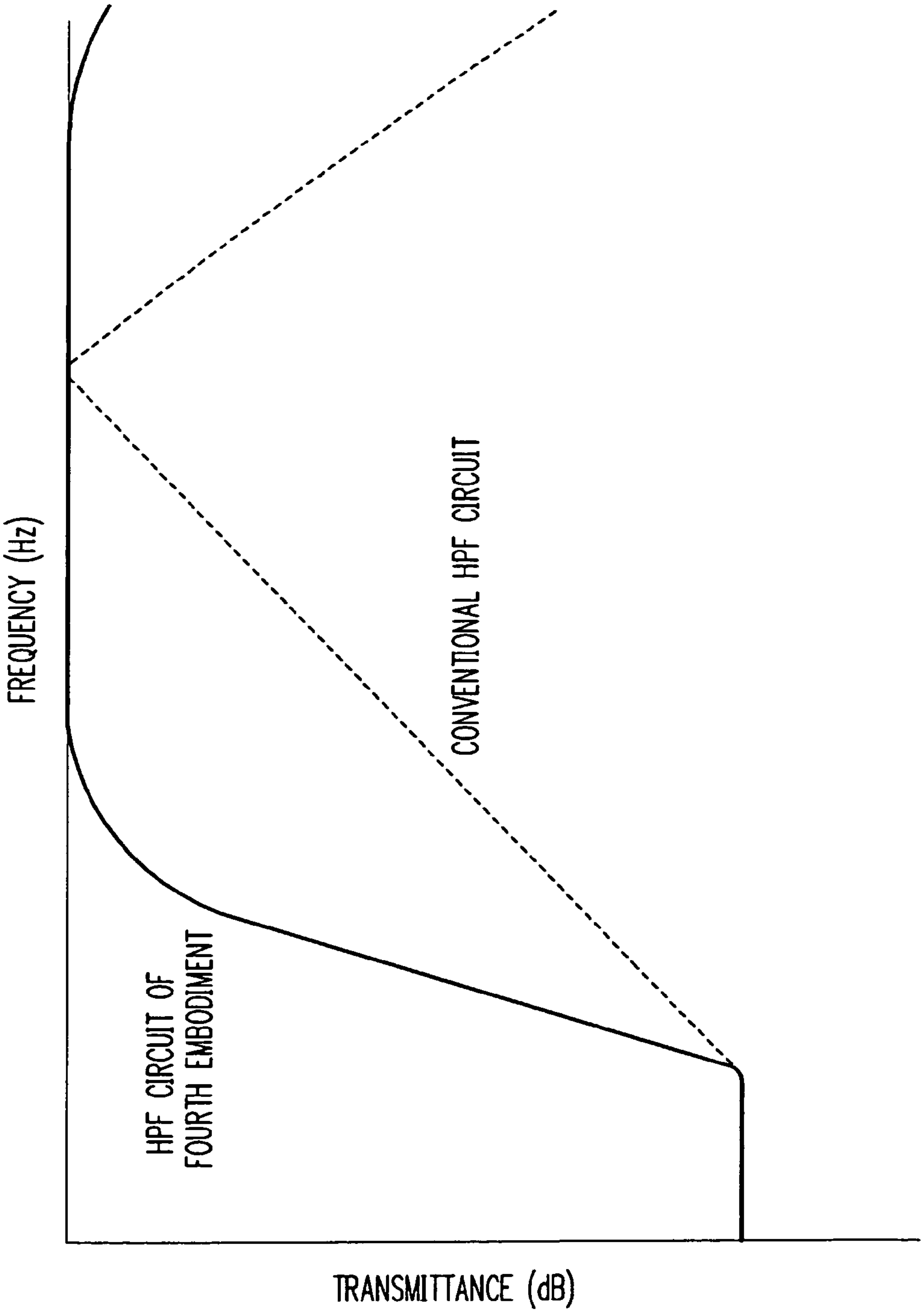
FIG. 18 is an illustration showing a transmission characteristic of the HPF circuit of the fourth embodiment.

FIG. 18 shows a transmission characteristic diagram of the HPF circuit. The ordinate axis denotes transmittance (dB) and the abscissa denotes frequency of incoming waves (Hz). The transmittance of the coil 23 for connecting the terminal 22*c* of the LILC 22 with the ground suddenly increases when the frequency exceeds a predetermined frequency because the inductance characteristic of the coil 23 and the capacitance characteristic of the LILC 22 bring synergy effect. Moreover, the transmittance of an electromagnetic wave of the HPF circuit of this embodiment is kept at a high level even in a frequency band higher than a cutoff frequency and shows circuit characteristics close to that of an ideal HPF circuit differently from the case of a conventional HPF circuit.

Thus, the HPF circuit of this embodiment is a broadband circuit which can be easily designed without performing complex calculation or depending on the cut-and-try technique. Moreover, because the number of design parameters is small, it is possible to improve the stability and reliability of circuit characteristics.

FIFTH EMBODIMENT

Figure 19:
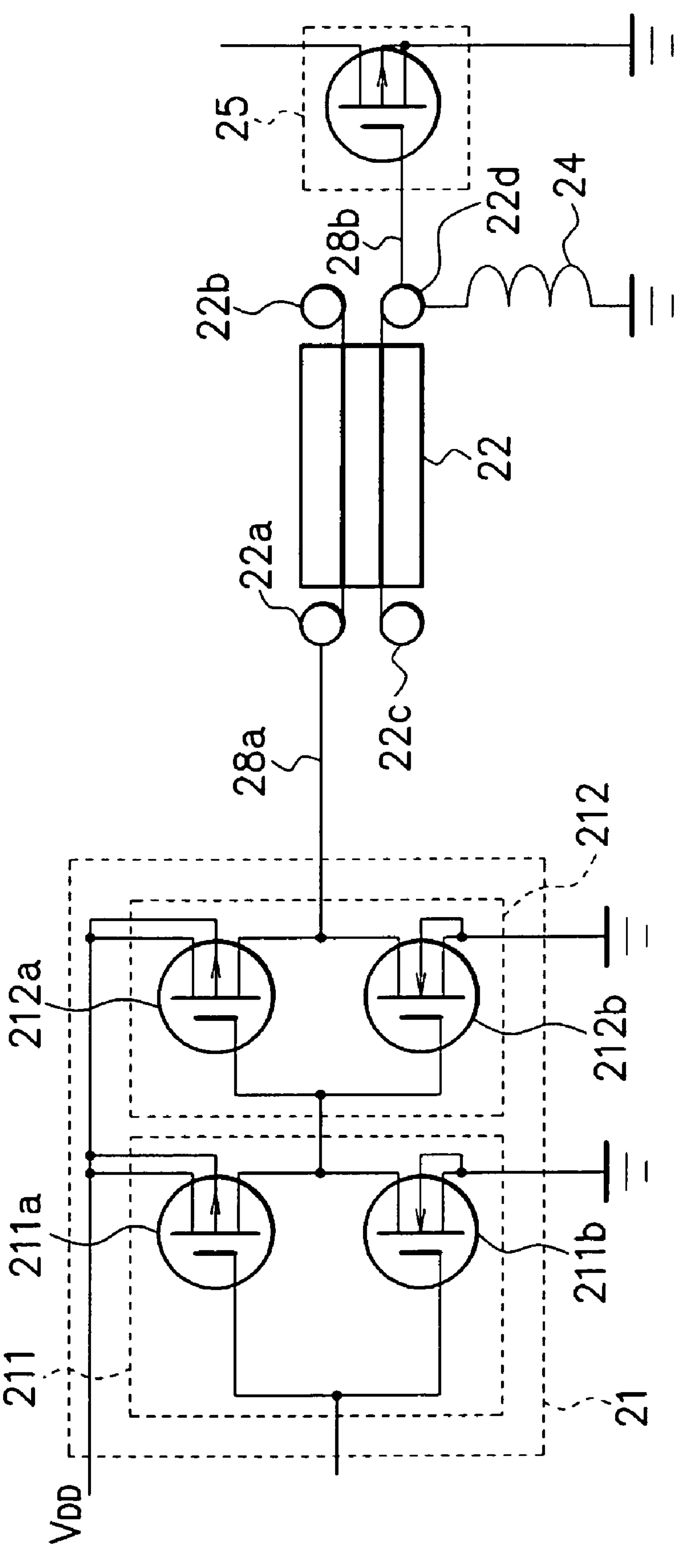
FIG. 19 is an illustration showing a configuration of an HPF circuit of fifth embodiment preferably executing the present invention.

Fifth preferable embodiment of the present invention is described below. FIG. 19 shows a configuration of a high-pass filter circuit (HPF circuit) to which the present invention is applied.

This HPF circuit is the same as the case of the fourth embodiment except that a terminal 22*c* is opened and a terminal 22*d* is connected to the ground through a coil 24.

Figure 20:
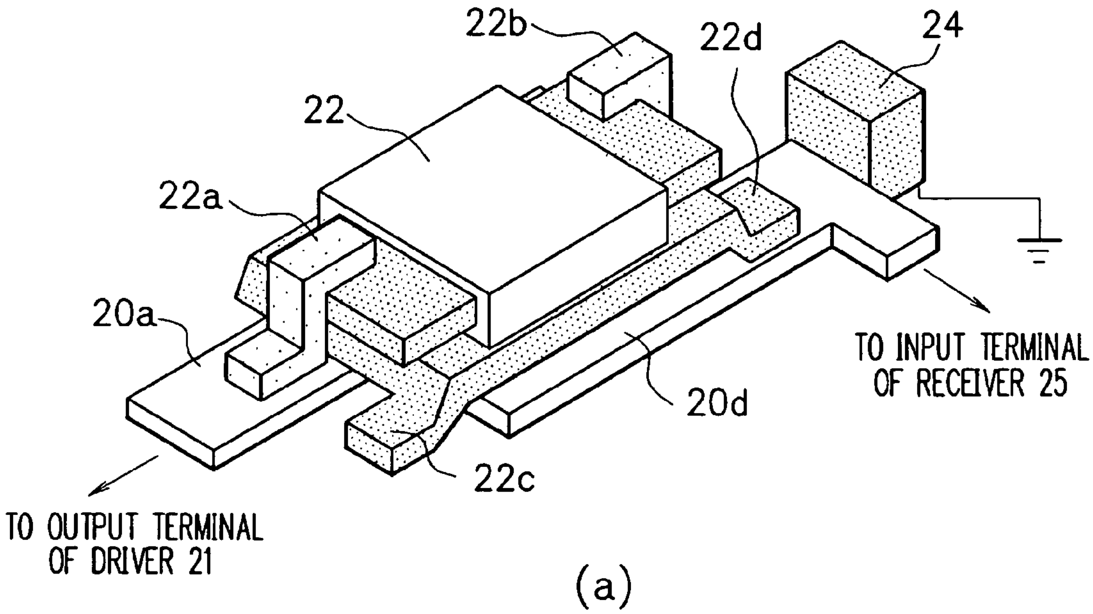
FIGS. 20(*a*) and 20(*b*) are illustrations showing an embodiment of an LILC to be applied to the HPF circuit of the fifth embodiment.
Figure 20:
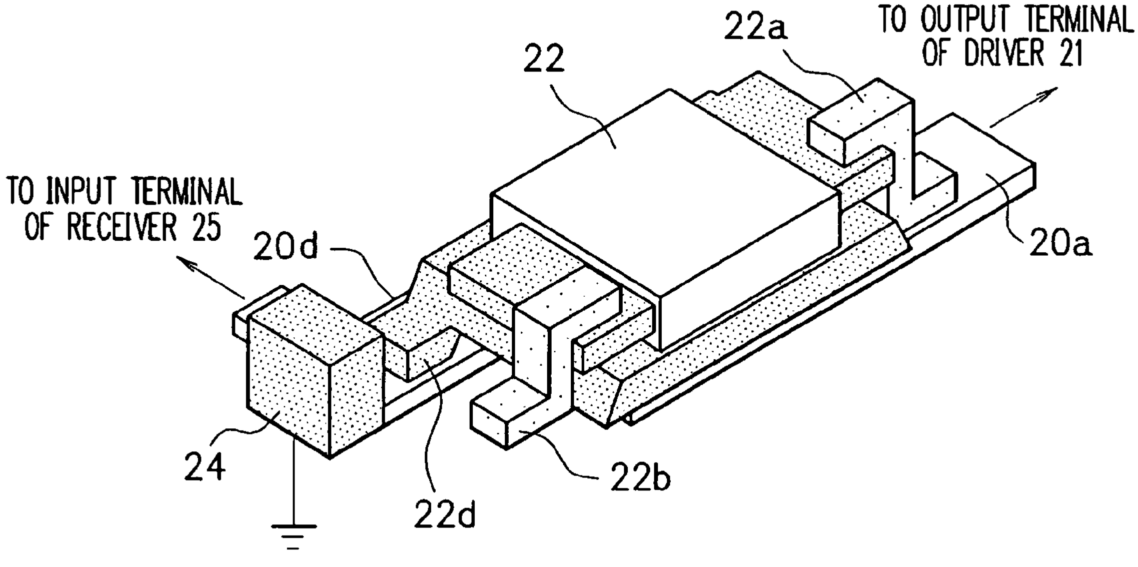

FIGS. 20(*a*) and 20(*b*) show a state of setting an LILC 22 to a wiring pattern on a printed circuit board. The terminal 22*a* of the LILC 22 is connected to a wiring pattern 20*a* connected with the output terminal of a driver 21. Terminals 22*b* and 22*c* of the LILC 22 are opened without being connected to a wiring pattern. The terminal 22*d* of the LILC 22 is connected with a wiring pattern 20*d* connected with the ground through the gate terminal of a receiver 25 and the ground through the coil 24.

Operations of the HPF circuit are the same as the case of the fourth embodiment. Moreover, the transmission characteristic is the same as the case of the fourth embodiment. Because the coil 24 for connecting the terminal 22*d* of the LILC 22 to the ground shows an inductance characteristic in a low frequency band, the inductance characteristic of the coil 24 and the capacitance characteristic of the LILC 22 create synergy effect and the transmittance suddenly increases when the frequency exceeds a predetermined frequency. Moreover, the transmittance of an electromagnetic wave is kept at a high value even in a frequency band higher than a cutoff frequency and shows a circuit characteristic close to the case of an ideal HPF circuit.

Thus, the HPF circuit of this embodiment is a broadband circuit which can be easily designed without performing complex calculation or depending on the cut-and-try technique. Moreover, because the number of design parameters is small, it is possible to improve the stability and reliability of a circuit characteristic.

SIXTH EMBODIMENT

Figure 21:
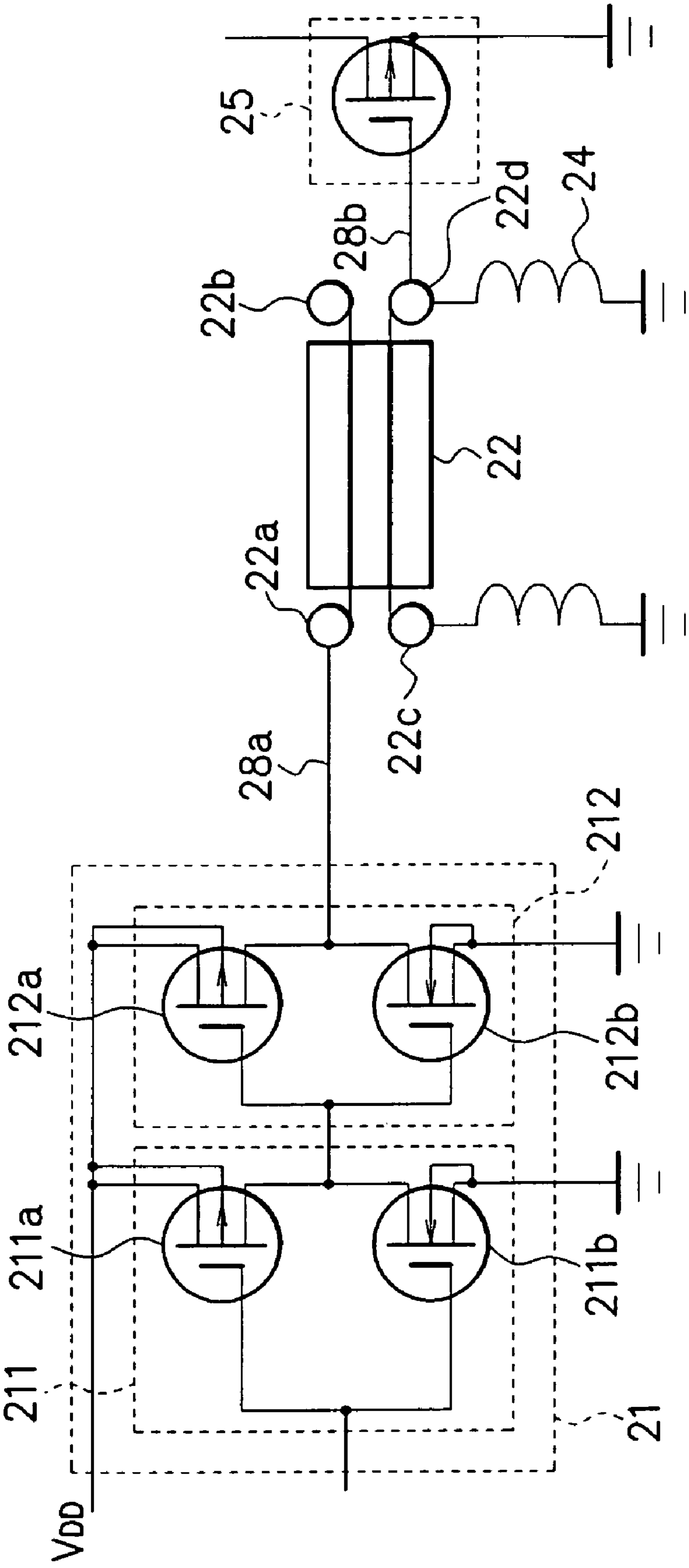
FIG. 21 is an illustration showing a configuration of an HPF circuit of sixth embodiment preferably executing the present invention.

Fifth embodiment preferably executing the present invention is described below. FIG. 21 shows a configuration of a high-pass filter circuit (HPF circuit) to which the present invention is applied.

This HPF circuit is the same as the case of the fourth embodiment except that the terminal 22*d* of the LILC 22 is connected to the ground through a coil 24.

Figure 22:
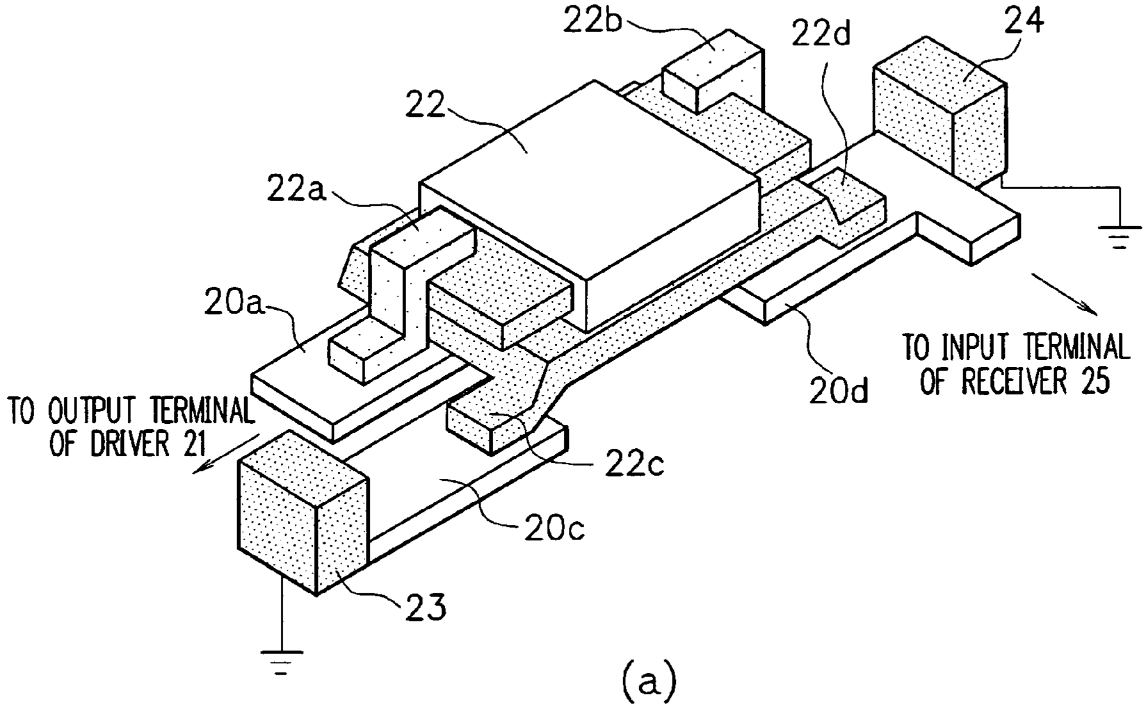
FIGS. 22(*a*) and 22(*b*) are illustrations showing an embodiment of an LILC to be applied to the HPF circuit of the sixth embodiment.
Figure 22:
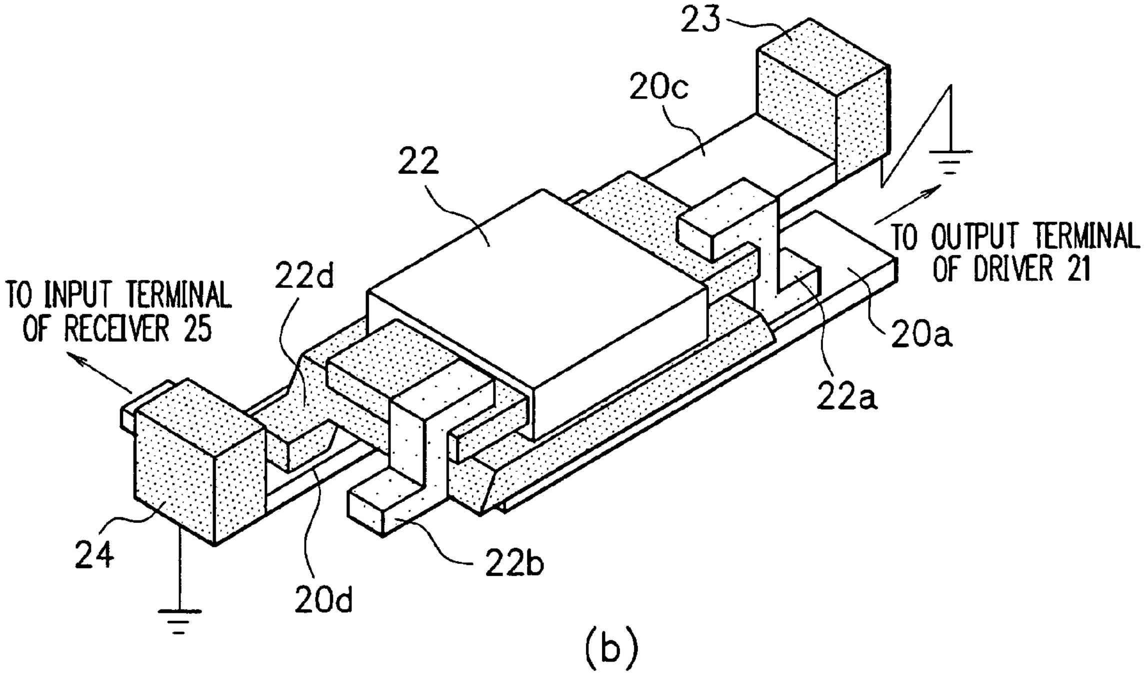

FIGS. 22(*a*) and 22(*b*) show a state of setting an LILC 22 to a wiring pattern on a printed circuit board. The terminal 22*a* of the LILC 22 is connected to a wiring pattern 20*a* connected with the output terminal of a driver 21. The terminal 22*b* of the LILC 22 is opened without being connected to a wiring pattern. The terminal 22*c* of the LILC 22 is connected to a wiring pattern 20*c* connected to the ground through a coil 23. The terminal 22*d* of the LILC 22 is connected to a wiring pattern 20*d* connected with the gate terminal of a receiver 25 and the ground.

Operations of the HPF circuit are the same as the case of the fourth embodiment. Moreover, the transmission characteristic is the same as the case of the fourth embodiment. However, because two coils (coils 23 and 24) are connected to the LILC 22, it is possible to make a filter characteristic in a low frequency band approach to the circuit characteristic of an ideal HPF circuit.

Thus, the HPF circuit of this embodiment is a broadband circuit which can be easily designed without performing complex calculation or depending on the cut-and-try technique. Moreover, because the number of design parameters is small, it is possible to improve the stability and reliability of a circuit characteristic.

The fourth to sixth embodiments respectively have a configuration in which the coil 23 or the coil 24 is connected to the terminal 22 of the LILC 22. However, the same advantage can be obtained by using a resistance instead of the coil. Moreover, a coil and a resistance may be used by combining them.

SEVENTH EMBODIMENT

In the case of the above first to third embodiments, an LPF circuit to which the present invention is applied is described. In the case of the above fourth to sixth embodiments, an HPF circuit to which the present invention is applied is described. However, by combining them, it is possible to apply the present invention to a band pass filter circuit or band elimination filter circuit.

Figure 23:
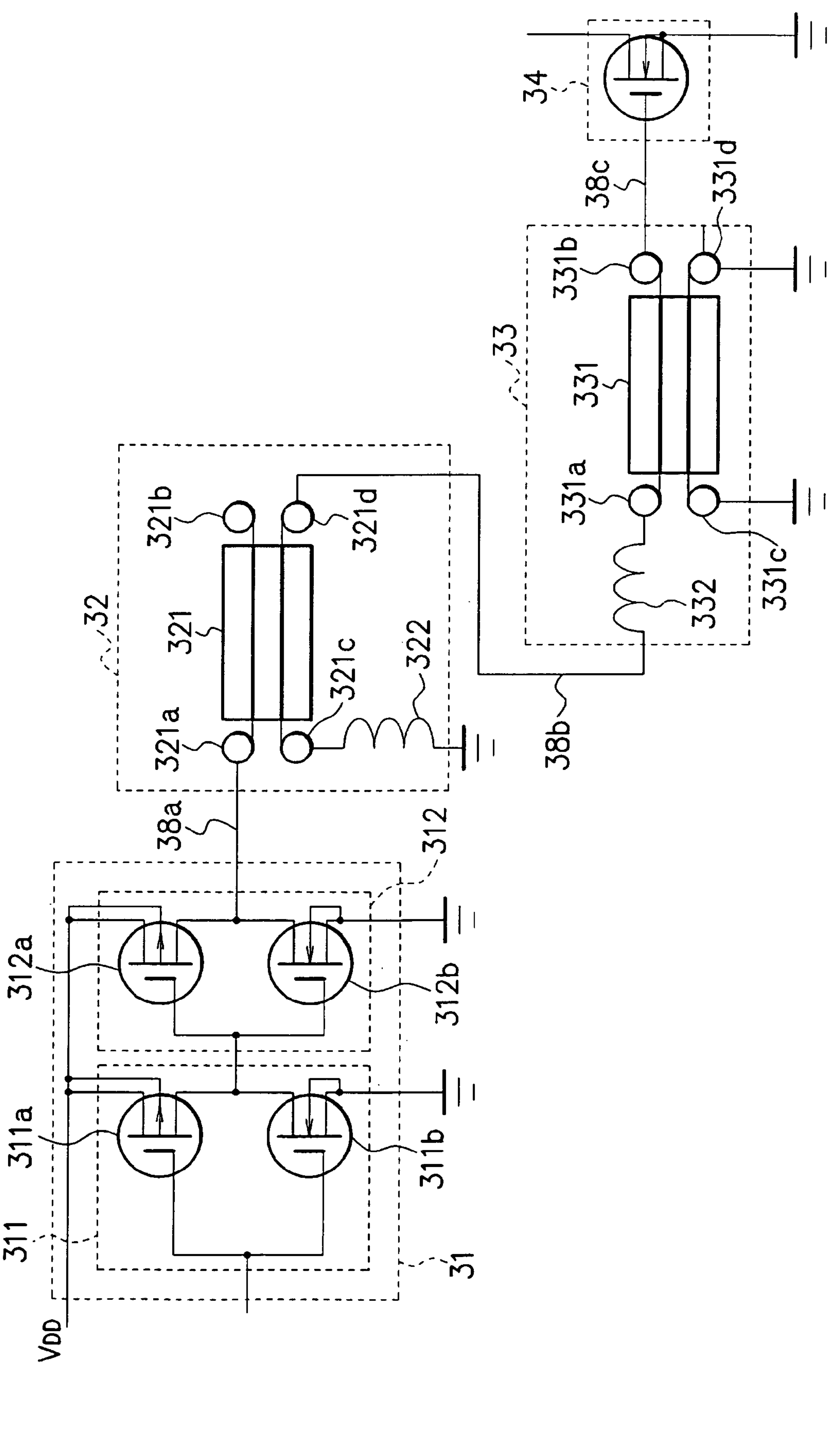
FIG. 23 is an illustration showing a configuration of a BPF circuit of seventh embodiment preferably executing the present invention.

Seventh embodiment preferably executing the present invention is described below. FIG. 23 shows a configuration of a band pass filter circuit (BPF circuit) to which the present invention is applied.

This BPF circuit is a circuit obtained by connecting a driver 31, a HPF 32, a LPF. 33, and a receiver 34 in series.

The driver 31 is the same as the driver 11 of the first embodiment, which outputs signal electromagnetic waves from the output terminal. The HPF 32 has the same configuration as the HPF circuit of the fourth embodiment and includes an LILC 321 and coil 322. The LILC 321 is a device having a four-terminal line structure in which a pair of conductors are faced at the both sides of a dielectric and its characteristic impedance Z0*a* is set to a value very smaller than the characteristic impedance Z3*a* of a wiring 38*a* (Z0*a*/Z3*a*≈0) for connecting the driver 31 with the LILC 321. The terminal 321*a* of the LILC 321 is connected to the output terminal of the driver 31 and the terminal 321*b* of the LILC 321 is opened. Moreover, the terminal 321*c* of the LILC 321 is connected to the ground through the coil 322. The terminal 321*d* of the LILC 321 is connected to the input terminal of the LPF 33. The LILC 321 can be set to a wiring pattern on a printed circuit board similarly to the case of the fourth embodiment. The coil 322 is a device set to improve the characteristic of a high-pass filter.

The LPF 33 has a configuration same as that of the LPF circuit of the second embodiment and includes an LILC 331 and a coil 332. The LILC 331 is a device having a four-terminal line structure in which a pair of conductors are faced each other at the both sides of a dielectric and a characteristic impedance Z0*b* is set to a value very smaller than the characteristic impedance Z1*b* of a wiring 38*b* (Z0*b*/Z1*b*≈0) for connecting the HPF 32 with the LILC 331. The terminal 331*a* of the LILC 331 is connected to an LILC 321*d* serving as the output terminal of the HPF 32 and the terminal 331*b* of the LILC 331 is connected to the ground. Moreover, terminals 331*c* and 331*d* of the LILC 331 are connected to the ground. The LILC 331 can be set to a wiring pattern on a printed circuit board similarly to the case of the second embodiment. The coil 332 is a device set to improve the characteristic of a high-pass filter.

The receiver 34 is a transistor for converting a signal inputted to the input terminal (gate terminal) into a voltage.

Figure 24:
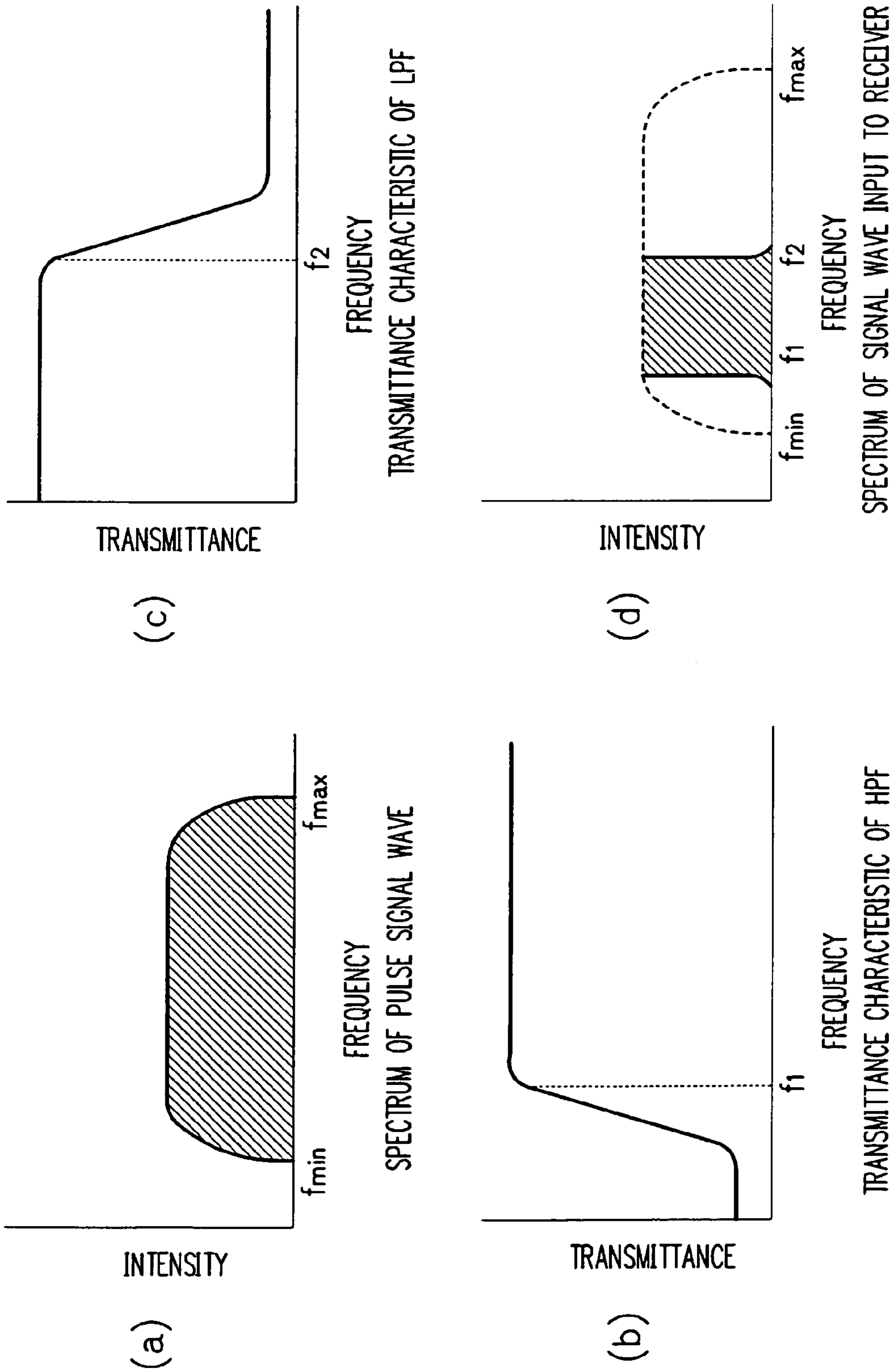
FIGS. 24(*a*) to 24(*d*) are illustrations for explaining operations of the BPF circuit of the seventh embodiment, in which FIG. 24(*a*) shows the spectrum of a pulse signal wave, FIG. 24(*b*) shows the transmission characteristic of an HPF, FIG. 24(*c*) shows the transmission characteristic of an LPF, and FIG. 24(*d*) shows the transmission characteristic of the BPF circuit.

Operations of the BPF circuit are described below. As shown in FIGS. 24(*a*) to 24(*c*), it is assumed that the spectrum of a pulse signal wave output from the driver 31 covers a frequency band between $f_{min}$ and $f_{max}$ (both included), the cutoff frequency of the HPF 32 is $f_1$, and the cutoff frequency of the LPF 33 is $f_2$.

Pulse signal waves output from the driver 31 reach the HPF 32 through a line including a wiring 38*a* and the ground. Frequency components equal to or higher than $f_1$ among the signal electromagnetic waves reaching the HPF 32 pass through the HPF 32 and frequency components less than $f_1$ are prevented by the HPF 32.

The frequency components passing through the HPF 32 reach the LPF 33 through a line including the wiring 38*b* and the ground. Frequency components equal to or higher than $f_2$ among the frequency components reaching the LPF 33 are prevented by the LPF 33 and frequency components lower than $f_2$ pass through the LPF 33.

The frequency components passing through the LPF 33 reach the receiver 34 by using a wiring 38*c* and the ground as a line and enters the gate terminal to operate the receiver 34. As shown in FIG. 24(*d*), only frequency components between $f_1$ and $f_2$ ($f_2$ is excluded) among the pulse signal waves output from the driver 31 reach the receiver 34.

Thus, by connecting an LPF and an HPF in series to which the present invention is applied, it is possible to apply the present invention to a BPF circuit. When the cutoff frequency of the HPF is higher than the cutoff frequency of the LPF, all frequency components are prevented by the HPF and LPF and no frequency component reaches the receiver. Therefore, it is necessary to set the cutoff frequency of the HPF to a value lower than the cutoff frequency of the LPF.

In this case, the BPF circuit is formed by using an LPF having a configuration same as that of the LPF circuit of the second embodiment and a HPF having a configuration same as that of the HPF circuit of the fourth embodiment. However, it is possible to apply the present invention to the BPF circuit also by combining an LPF and HPF having configurations same as those of another embodiment.

Thus, the BPF circuit of this embodiment is a broadband circuit which can be easily designed without performing complex calculation or depending on the cut-and-try technique. Moreover, because the number of design parameters is small, it is possible to improve the stability and reliability of circuit characteristics.

EIGHTH EMBODIMENT

Figure 25:
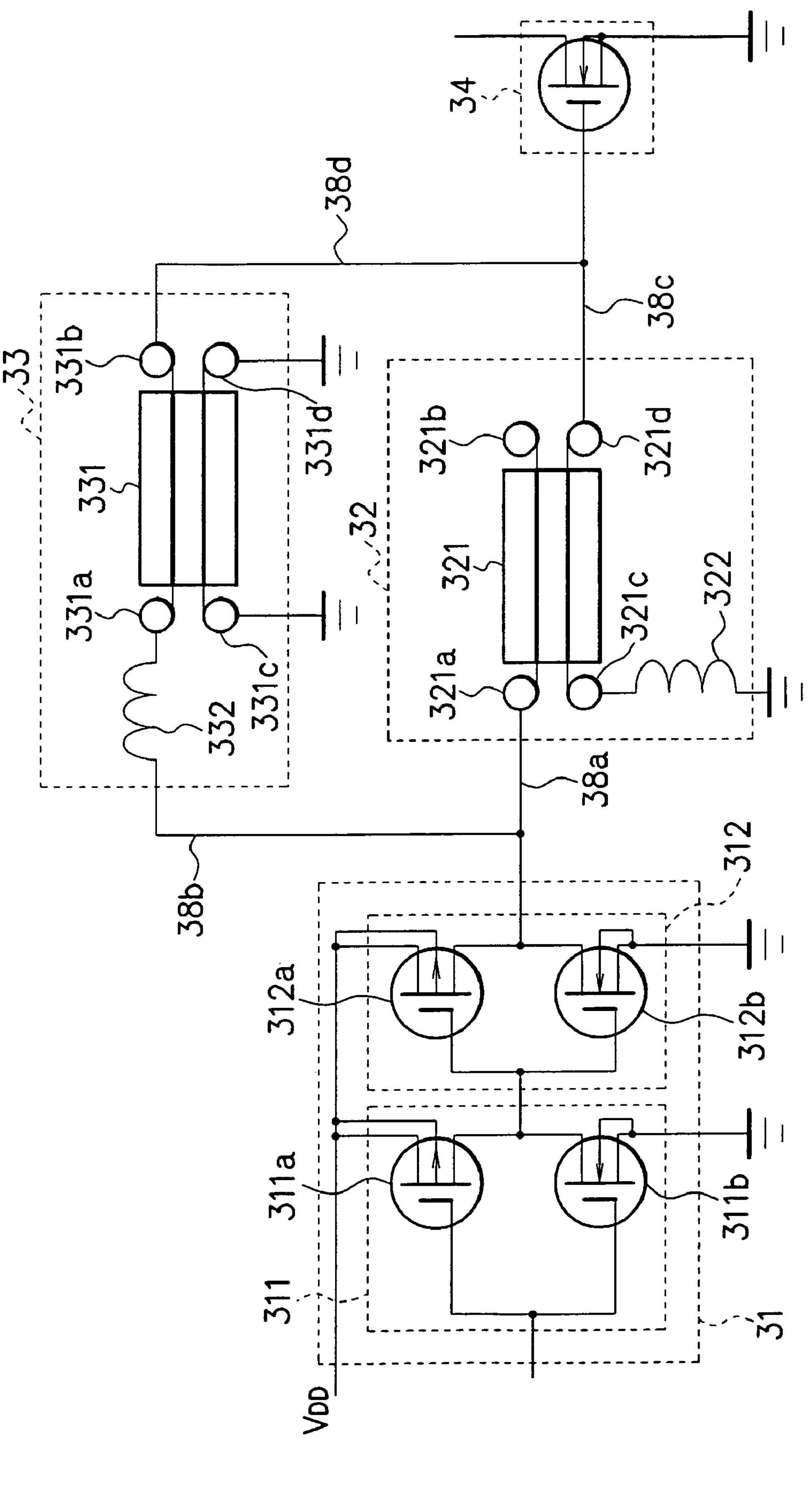
FIG. 25 is an illustration showing a configuration of a BEF circuit of eighth embodiment preferably executing the present invention.

Eighth embodiment preferably executing the present invention is described below. FIG. 25 shows a configuration of a band elimination filter circuit (BEF circuit) to which the present invention is applied.

This BEF circuit has a driver 31, a HPF 32, a LPF 33, and a receiver 34. Individual configurations of the driver 31, the HPF 32, the LPF 33, and the receiver 34 are the same as the case of the seventh embodiment but the BEF circuit of this embodiment is different in connections of various portions. The HPF 32 and LPF 33 are inserted between the driver 31 and the receiver 34 in parallel.

Figure 26:
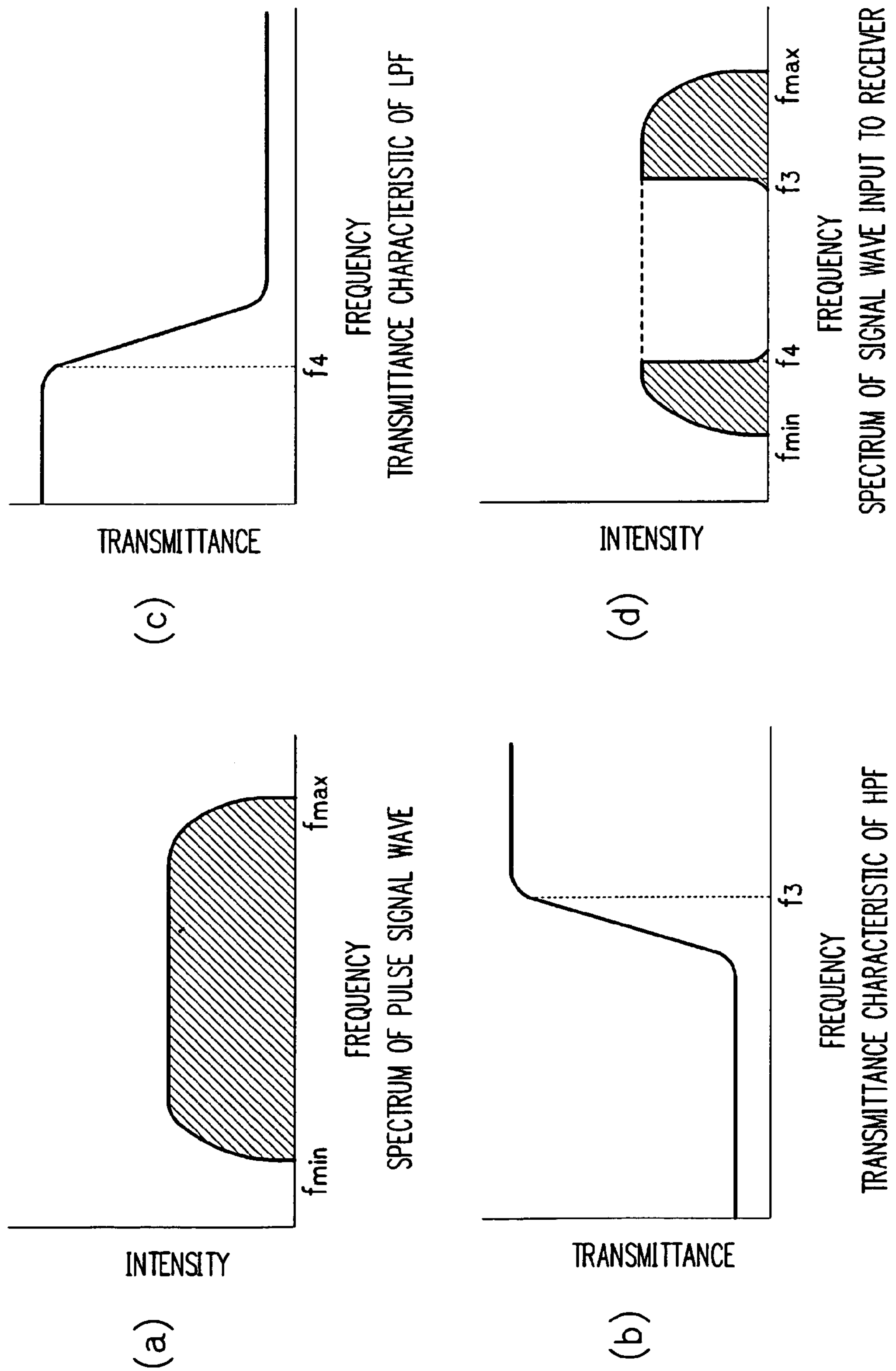
FIGS. 26(*a*) to 26(*d*) are illustrations for explaining operations of the BEF circuit of the eighth embodiment, in which FIG. 26(*a*) shows the spectrum of a pulse signal wave, FIG. 26(*b*) shows the transmission characteristic of an HPF, FIG. 26(*c*) shows the transmission characteristic of an LPF, and FIG. 26(*d*) shows the transmission characteristic of the BEF circuit.

Operations of a BPF circuit are described below. As shown in FIGS. 26(*a*) and 26(*b*), it is assumed that the spectrum of a pulse signal wave output from the driver 31 covers a frequency band between $f_{min}$ and $f_{max}$ (both included), the cutoff frequency of the HPF 32 is $f_3$, and the cutoff frequency of the LPF 33 is $f_4$.

Pulse signal waves output from the driver 31 reach the HPF 32 through a line including a wiring 38*a* and the ground. Frequency components equal to or higher than $f_3$ among the pulse signal waves reaching the LPF 33 pass through the HPF 32 and frequency components lower than $f_3$ are prevented by the HPF 32.

The pulse signal waves output from the driver 31 also reach the LPF 33 through a line including the wiring 38*b* and the ground. Frequency components equal to or higher than $f_4$ among the pulse signal waves reaching the LPF 33 are prevented by the LPF 33 and frequency components lower than $f_4$ pass through the LPF 33.

The frequency components passing through the HPF 32 and LPF 33 reach a receiver 34 through a line including wirings 38*c* or 38*d* and the ground and enters the gate terminal to operate the receiver 34. As shown in FIG. 26(*d*), only frequency components equal to or higher than $f_3$ and frequency components lower than $f_4$ among the pulse signal waves output from the driver 31 reach the receiver 34.

Thus, by connecting an LPF and HPF in parallel to which the present invention is applied, it is possible to apply the present invention to a BEF circuit. When the cutoff frequency of the HPF is lower than the cutoff frequency of the LPF, all frequency components pass through the HPF and LPF. Therefore, it is necessary to set the cutoff frequency of the HPF to a value higher than the cutoff frequency of the LPF.

In this case, the BEF circuit is formed by using an LPF having a configuration same as the case of the LPF circuit of the second embodiment and a HPF having a configuration same as the case of the HPF circuit of the fourth embodiment. However, it is also possible to apply the present invention to the BEF circuit also by combining an LPF and HPF having the same configurations as the case of another embodiment.

Thus, the BEF circuit of this embodiment is a broadband circuit which can be easily designed without performing complex calculation or depending on the cut-and-try technique. Moreover, because the number of design parameters is small, it is possible to improve the stability and reliability of circuit characteristics.

NINTH EMBODIMENT

Figure 27:
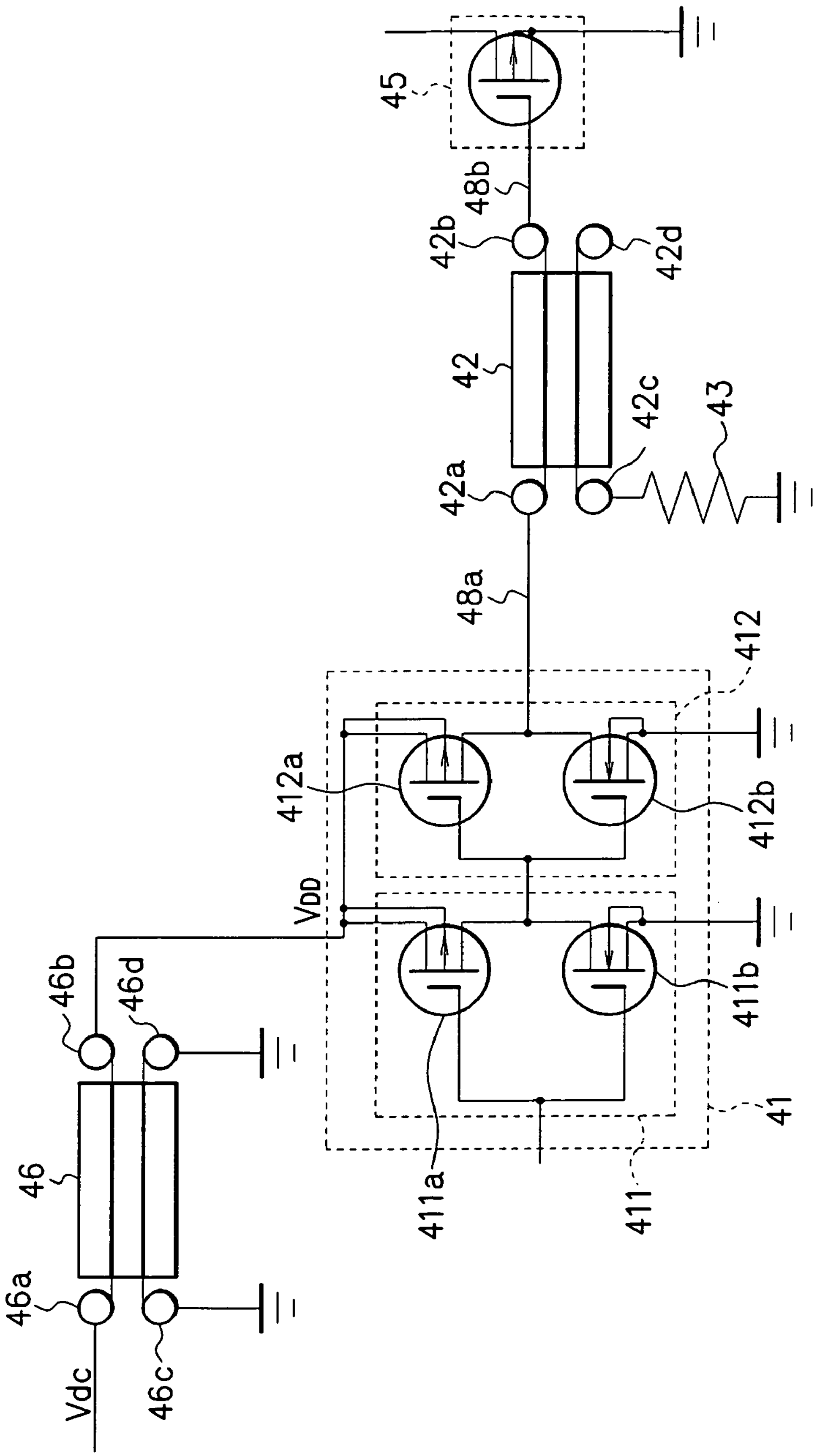
FIG. 27 is an illustration showing a configuration of a high-frequency terminal circuit of ninth embodiment preferably executing the present invention.

Ninth embodiment preferably executing the present invention is described below. FIG. 27 shows a configuration of a high-frequency terminal circuit to which the present invention is applied. This circuit is a pull-down-type terminal circuit in which a signal circuit is connected to the ground through a terminal resistance.

The high-frequency terminal circuit of this embodiment has a driver 41, a LILC 42, a resistance 43, a receiver 45, and a LILC 46.

The driver 41 is the same as that of the first embodiment, which outputs signal electromagnetic waves from its output terminal. An LILC 42 is a four-terminal device having a line structure and its characteristic impedance Z0 is set to a value very smaller than the characteristic impedance 24 of the wiring 48 ($Z0/Z4 \approx 0$) for connecting the driver 41 with the LILC 42. The terminal 42*a* of the LILC 42 is connected to the output terminal of the driver 41 and the terminal 42*b* of the LILC 42 is connected to the input terminal of a receiver 45. Moreover, the terminal 42*c* of the LILC 42 is connected to the ground through the resistance 43. The resistance 43 is a resistance (terminal resistance) for terminating a pulse signal wave so that the wave is not reflected at the LILC 42 and its impedance is equal to the impedance of a wiring 48*a* for connecting the driver 41 with the LILC 42. The receiver 45 is a transistor for converting a signal input to the input terminal (gate terminal) into a voltage. The LILC 46 is a device for restraining the fluctuation of a DC voltage Vdc to be supplied from a not-illustrated power supply so that the terminal resistance viewed from a pulse signal wave becomes a constant value.

Figure 28:
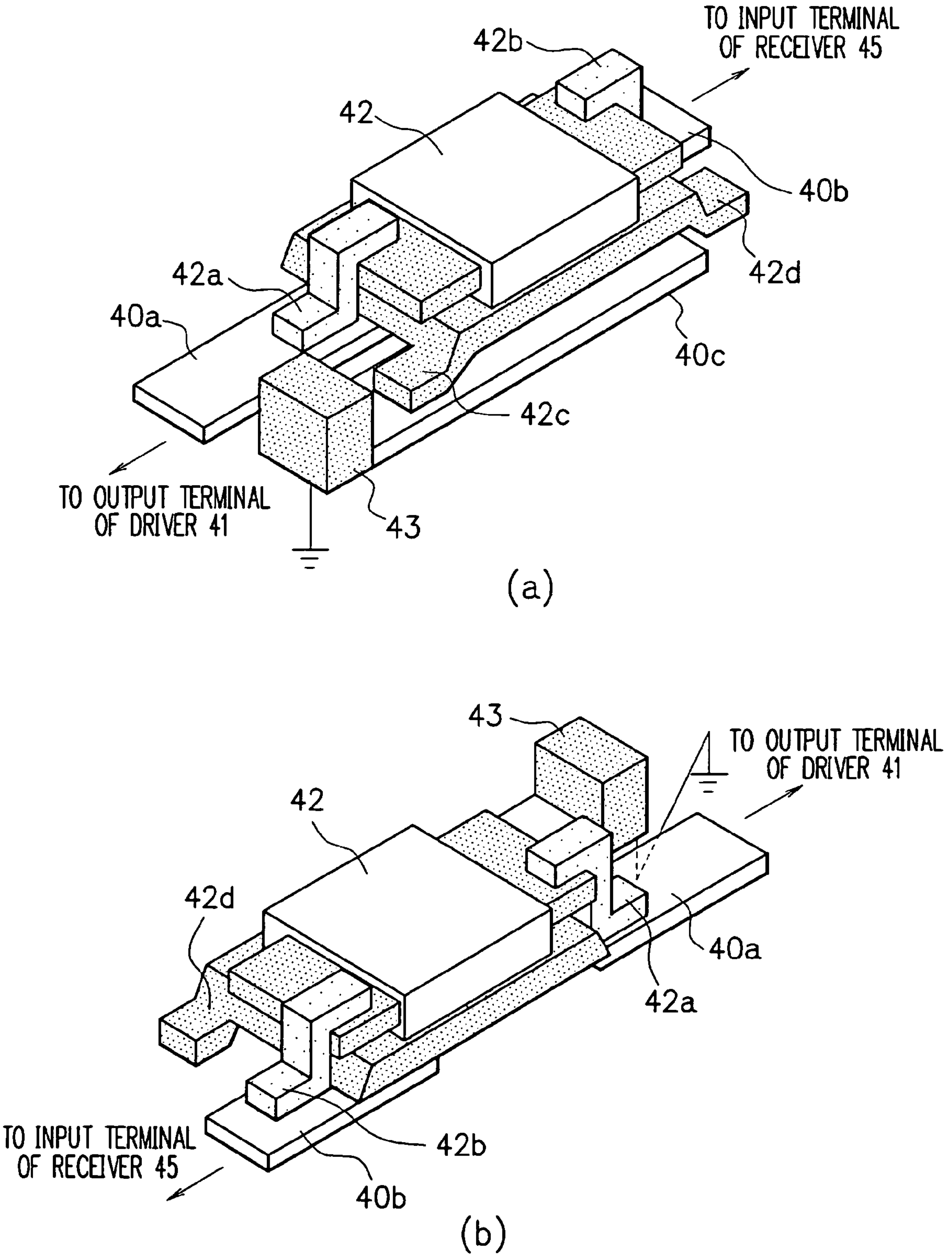
FIGS. 28(*a*) and 28(*b*) are illustrations showing mounting examples of an LILC to be applied to the high-frequency terminal circuit of the ninth embodiment.

FIGS. 28(*a*) and 28(*b*) show a state of setting the LILC 42 to a wiring pattern on a printed circuit board. The terminal 42*a* of the LILC 42 is connected to a wiring pattern 40*a* connected with the output terminal of the driver 41. The terminal 42*b* of the LILC 42 is connected with a wiring pattern 40*b* connected to the gate terminal of the receiver 45. The terminal 42*c* of the LILC 42 is connected to a wiring pattern 40*c* connected to the ground through a coil 43 and the terminal 42*d* of the LILC 42 is opened.

Figure 29:
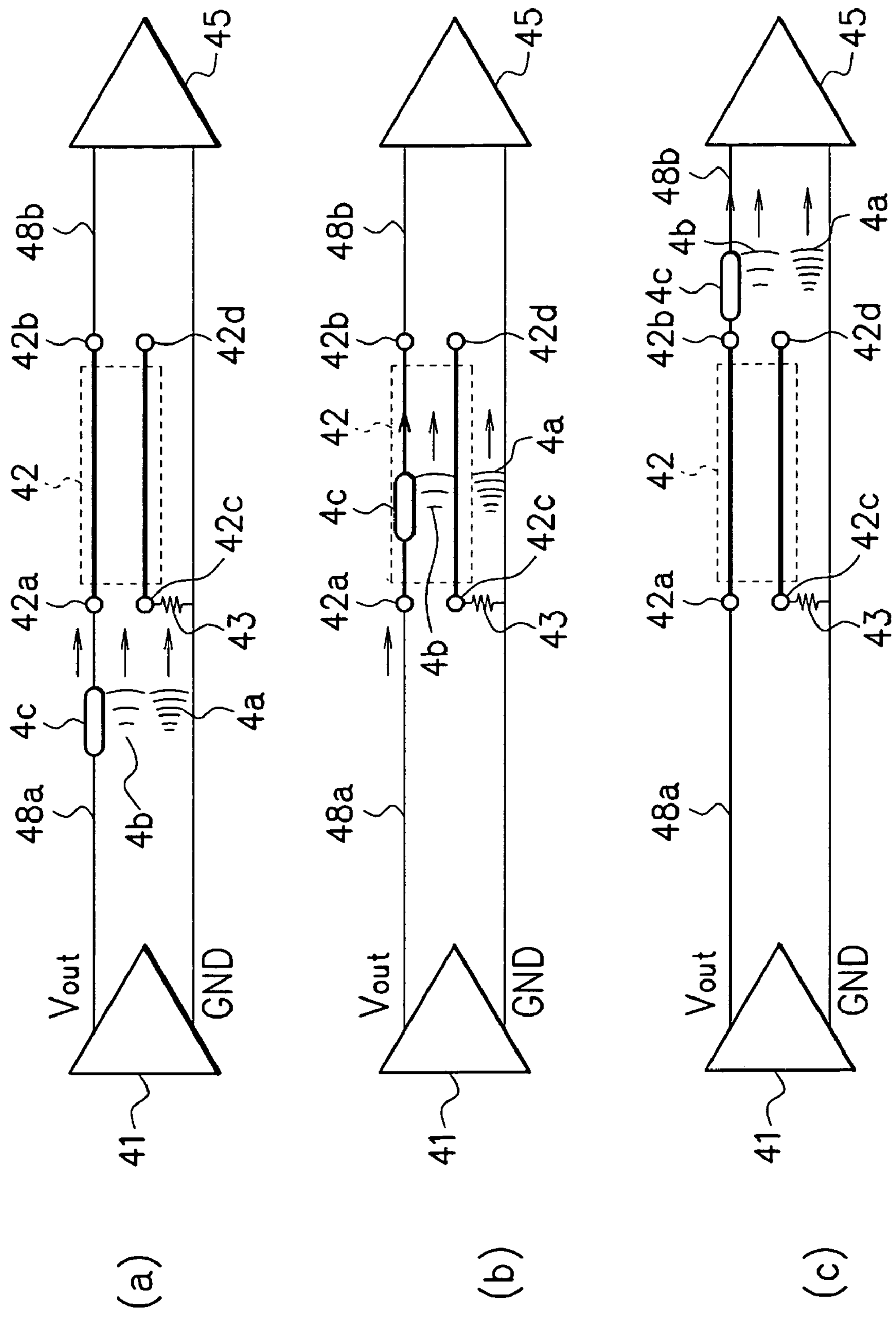
FIGS. 29(*a*) to 29(*c*) are illustrations for explaining a process in which a pulse signal wave passes through the high-frequency circuit of the ninth embodiment.

Operations of the high-frequency terminal circuit are described below. FIGS. 29(*a*) to 29(*c*) show states in which a pulse signal wave output from the driver 41 travels through a high-frequency terminal circuit. As shown in FIG. 29(*a*), pulse signal waves output from the driver 41 reach the LILC 42 through a line including a wiring 48*a* and the ground. An electromagnetic wave component (high frequency signal 4*a*) having a high frequency and capable of regarding the LILC 42 as a line is influenced by mismatching between the impedance of a wiring 48*a* and the impedance of the LILC 42. In this case, because $Z0/Z4 \approx 0$, the high frequency signal cannot enter the LILC 42. In the case of this embodiment, however, a terminal resistance (resistance 43) is connected to the terminal 42*c* of the LILC 42, the high frequency signal propagates to the receiver-45 side through a line including one (conductor having the terminals 42*c* and 42*d* of the LILC 42) of a pair of conductors of the LILC 42 to which the resistance 43 is connected and the ground. The high frequency signal propagating to the receiver-45 side enters the gate terminal of the receiver 45 through a line including a wiring 48*b* and the ground.

However, an electromagnetic component (low frequency signal) having a low frequency among pulse signal waves reaching the LILC 42 can enter the LILC 42 without being influenced by mismatching between the impedance of the wiring 48*a* and the impedance of the LILC 42. Therefore, the electromagnetic component propagates to the receiver-45 side by passing through the dielectric portion of the LILC 42 and enters the gate terminal of the receiver 45 through a line including the wiring 48*b* and the ground. Moreover, a DC signal passes through the conductor portion of the LILC 42 and transmits to the receiver-45 side, passes through the wiring 48*b*, and enters the gate terminal of the receiver 45.

Therefore, as shown in FIG. 29(*c*), all frequency components of pulse signal waves output from the driver 41 are input to the gate terminal of the receiver 45 and the waveform of a pulse signal wave output from the driver 41 is faithfully reproduced in a signal input to the gate terminal of the receiver 45. Therefore, the receiver 45 operates in accordance with a signal wave having the same waveform as a pulse signal output from the driver 41.

In the case of a digital circuit, a signal electromagnetic wave reciprocates between Hi level and Low level. However, in the case of a data-system signal electromagnetic wave, a state in which a signal stops at Hi level or Low level is kept for a long time and DC may continuously flow. In this case, when the DC flows to a terminal resistance, power is consumed while a signal is output.

Moreover, when an electromagnetic wave whose ¼ wavelength is longer than the line length of a transmission line travels through the transmission line, power is consumed without being matching-terminated at the terminal resistance because the electromagnetic wave cannot be regarded as a wave.

Therefore, in the case of the digital circuit, it is necessary to restrain waste of power by preventing an electromagnetic wave whose ¼ wavelength is longer than the line length of the transmission line or DC from flowing through the terminal resistance.

When a capacitor is inserted between the transmission line and the terminal resistance in series and the rise time of a signal electromagnetic wave is shorter than the time constant (⅕ or less), which is decided by the resistance value of the terminal resistance and the capacity of the capacitor, the voltage fluctuation of the capacitor cab be ignored. In this case, the capacitor cannot be perceived from the transmission line through which a signal electromagnetic wave propagates and it is possible to regard that the signal electromagnetic wave is terminated only by the terminal resistance.

When it is regarded that the signal electromagnetic wave is terminated only by the terminal resistance and the line length of the transmission line is shorter than ¼ wavelength of the electromagnetic wave of the minimum frequency under which the voltage fluctuation of the capacitor can be ignored, it is possible to prevent the electromagnetic wave of the frequency component which is not matching-terminated and DC from flowing into the terminal resistance.

For example, when a capacitor of 0.1 μF is inserted in series between a transmission line and a terminal resistance having a resistance value of 80Ω on a printed circuit board having a specific dielectric constant of $\epsilon_r=4$ and the impedance of a power supply is ignored, the time constant of CR becomes 8 μs. The frequency f of a sine wave having a rise time of 8 μs×⅕=1.6 μs is approximately 100 KHz and its ¼ wavelength is $\lambda/4=(c/f)\cdot(1/\sqrt{\epsilon_r})\cdot(1/4)=375$ m (where c is light velocity).

Because the line length of a transmission line on a printed circuit board is normally shorter than 375 m, the electromagnetic wave of a frequency component which is not matching-terminated and DC does not flow through a terminal resistance.

However, as described above, a capacitor has a property that the capacitor is influenced by a parasitic device and impedance rises when frequency exceeds a predetermined frequency. In a high frequency band, a synthesized value with a terminal resistance increases. Therefore, when a terminal circuit is formed using a capacitor, the waveform of a signal wave is distorted in a high frequency band.

However, because the impedance of an LILC is not increased also in a high frequency band, by forming a terminal circuit by using an LILC like the high-frequency terminal circuit of this embodiment, it is possible to matching-terminate an electromagnetic wave having a wide frequency band including high frequency signals without causing waveform distortion.

In the case of a low frequency signal under which an LILC cannot be regarded as a line, it is possible to realize matching termination similarly to a case of connecting a terminal resistance through a capacitor because the LILC acts similarly to the capacitor. Moreover, because the terminal resistance is connected to a conductor at a side which is DC-separated from a driver, DC does not flow through the terminal resistance.

Thus, in the case of the high-frequency terminal circuit of this embodiment, a terminal resistance is connected to the terminal of an LILC showing an impedance equal to or smaller than a predetermined value over a wide frequency band and thereby, all frequency components of pulse signals are matching-terminated. Therefore, some of the frequency components are not terminated to cause ringing and thereby, it does not operate a receiver. Moreover, because the terminal resistance is DC-insulated from a driver, DC does not flow through the terminal resistance even if the driver continuously outputs a Hi or Low signal and power is not wasted.

TENTH EMBODIMENT

Figure 30:
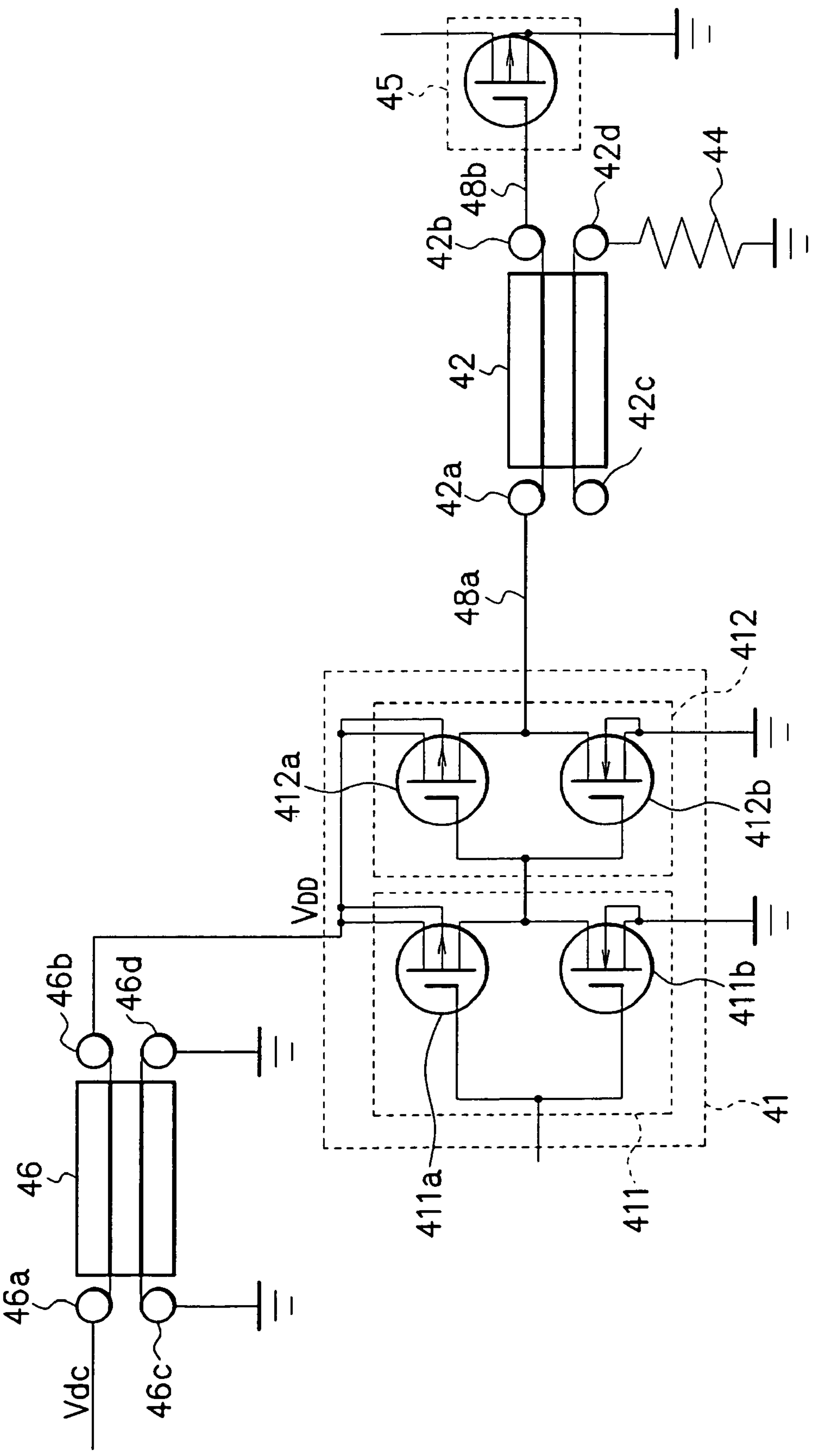
FIG. 30 is an illustration showing a configuration of a high-frequency terminal circuit of tenth embodiment preferably executing the present invention.

Tenth embodiment preferably executing the present invention is described below. FIG. 30 shows a configuration of a high-frequency terminal circuit to which the present invention is applied. This circuit is a pull-down-type terminal circuit obtained by connecting a signal circuit to the ground through a terminal resistance similarly to the case of the ninth embodiment, which is the same as the ninth embodiment except that a terminal 42*c* is opened and terminal 42*d* is connected to the ground through a resistance 44. The impedance of the resistance 44 is equal to the impedance of the conductor 48*b* connecting an LILC 42 with a receiver 45.

Figure 31:
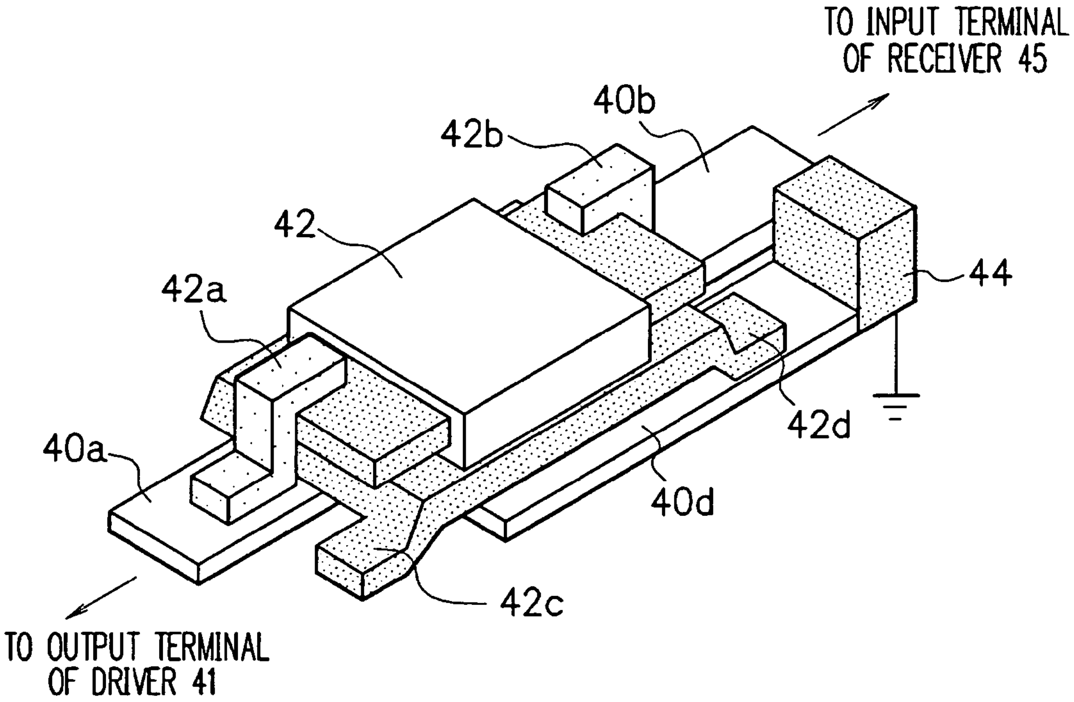
FIGS. 31(*a*) and 31(*b*) are illustrations showing a configuration of a high-frequency terminal circuit of eleventh embodiment preferably executing the present invention.
Figure 31:
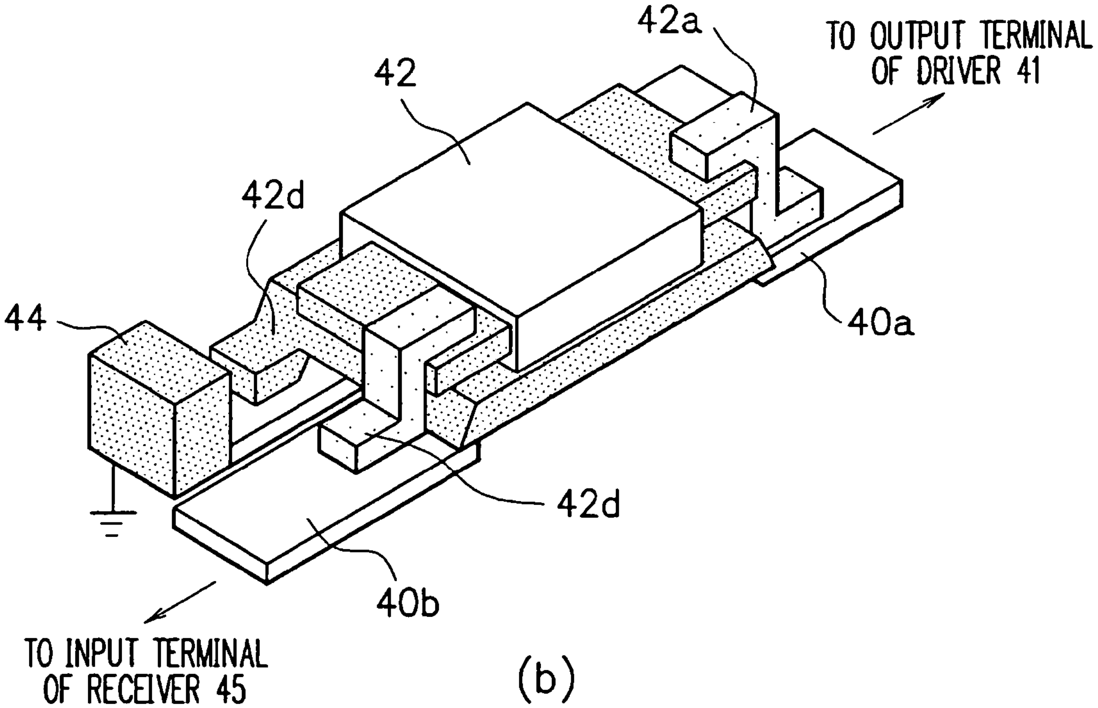

FIGS. 31(*a*) and 31(*b*) show a state of setting the LILC 42 to a wiring pattern on a printed circuit board. The terminal 42*a* of the LILC 42 is connected to a wiring pattern 40*a* connected with the output terminal of a driver 41. The terminal 42*b* of the LILC 42 is connected with a wiring pattern 40*b* connected to the gate terminal of a receiver 45. The terminal 42*c* of the LILC 42 is opened and the terminal 42*d* of the LILC 42 is connected with a wiring pattern 40*d* connected to the ground through a coil 44.

Operations of the high-frequency terminal circuit are described below. A state in which pulse signal waves output from the driver 41 travel through the high-frequency terminal circuit is the same as the case of the ninth embodiment and because the resistance 44 is connected to the terminal 42*d* of the LILC 42, a high frequency signal also enters the gate terminal of a receiver 45. Therefore, all frequency components of pulse signal waves output from the driver 41 are input to the gate terminal of the receiver 45 and a pulse signal wave output from the driver 41 is faithfully reproduced by the receiver 45.

As shown in the ninth embodiment, in the case of the high-frequency terminal circuit of this embodiment, a terminal resistance is connected to the terminal of an LILC showing an impedance equal to or smaller than a predetermined value over a wide frequency band and thereby, all frequency components of pulse signals are matching-terminated. Therefore, the high frequency terminal circuit prevents a situation where some of frequency components are not terminated to cause ringing and the ringing activates the receiver. Moreover, because the terminal resistance is DC-insulated from the driver, DC does not flow through the terminal resistance even if the driver continuously outputs a Hi or Low signal and power is not wasted.

ELEVENTH EMBODIMENT

Figure 32:
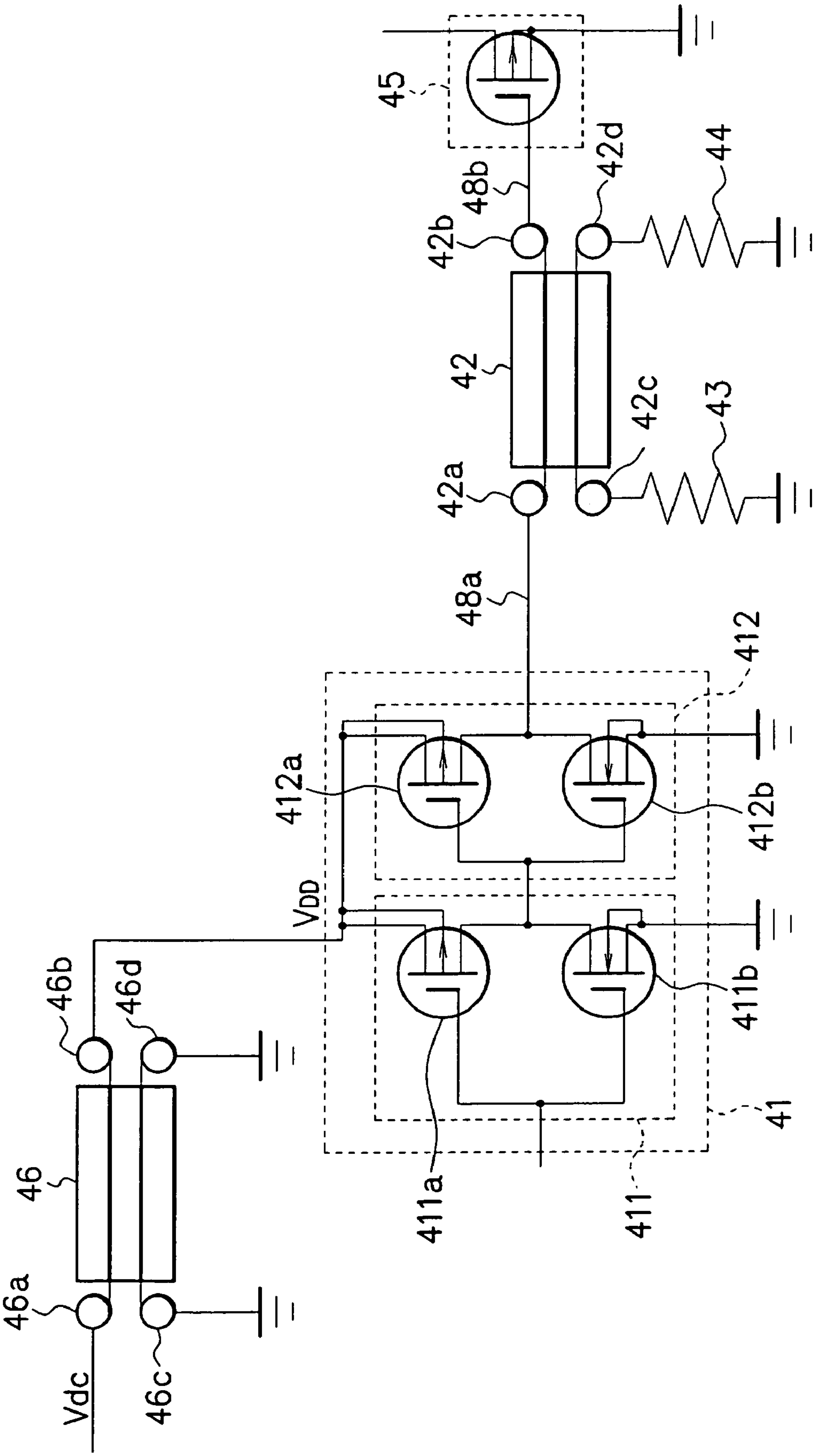
FIG. 32 is an illustration showing a mounting example of an LILC to be applied to the high-frequency terminal circuit of the eleventh embodiment.

Eleventh embodiment preferably executing the present invention is described below. FIG. 32 shows a configuration of a high-frequency terminal circuit to which the present invention is applied. This circuit is a pull-down-type terminal circuit obtained by connecting a signal circuit to the ground through a terminal resistance similarly to the case of the ninth embodiment, which is the same as the ninth embodiment except that the terminal 42*d* is connected to the ground through a resistance 44. The impedance of the resistance 44 is equal to the impedance of a wiring 48*b* connecting an LILC 42 with a receiver 45.

Figure 33:
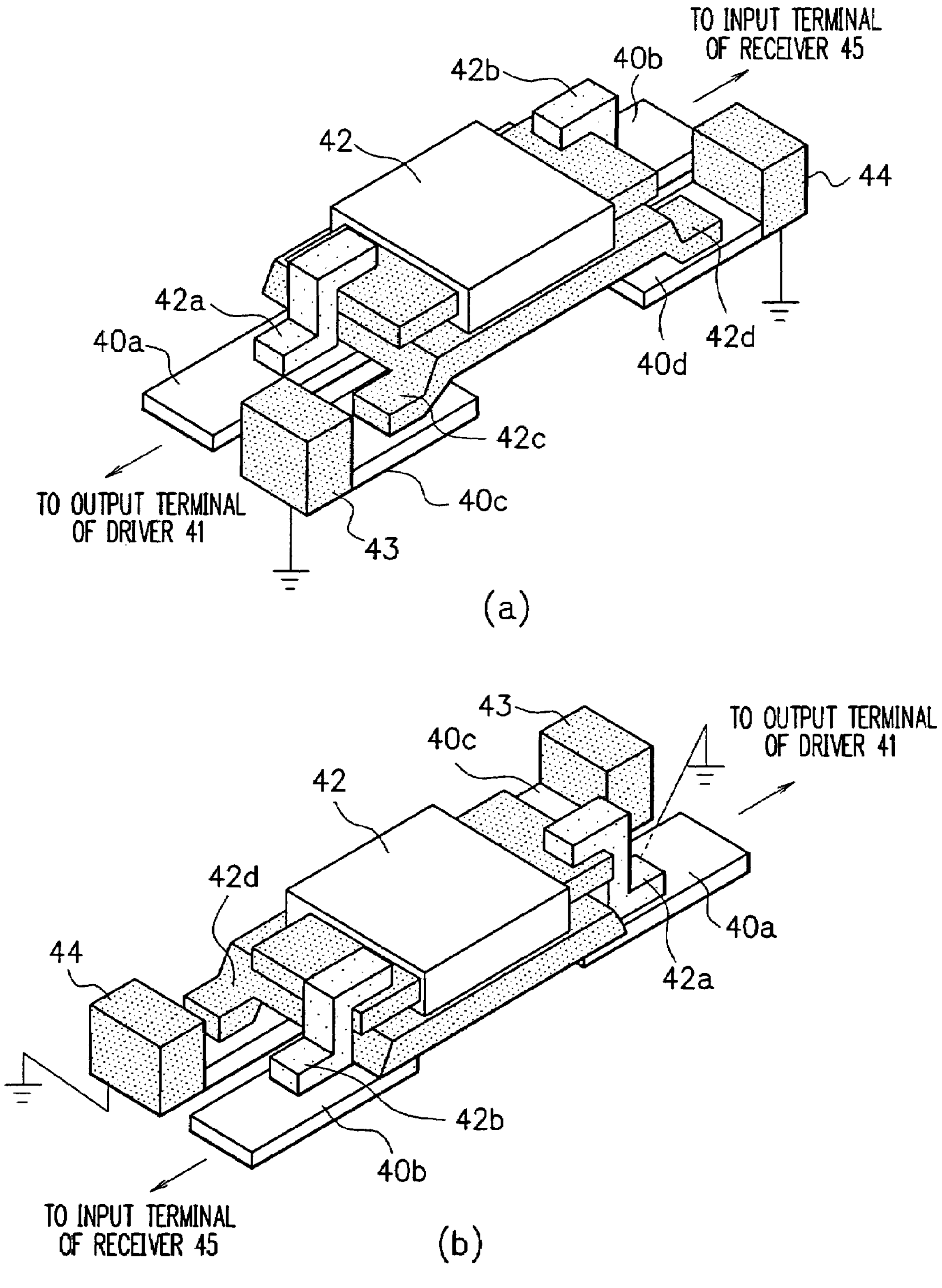
FIGS. 33(*a*) and 33(*b*) are illustrations showing a mounting example of an LILC to be applied to the high-frequency terminal circuit of the eleventh embodiment.

FIGS. 33(*a*) and 33(*b*) show a state of setting the LILC 42 to a wiring pattern on a printed circuit board. The terminal 42*a* of the LILC 42 is connected to a wiring pattern 40*a* connected with the output terminal of a driver 41. The terminal 42*b* of the LILC 42 is connected to a wiring pattern 40*b* connected to the gate terminal of a receiver 45. The terminal 42*c* of the LILC 42 is connected to a wiring pattern 40*c* connected to the ground through a resistance 43 and the terminal 42*d* of the LILC 42 is connected to a wiring pattern 40*d* connected to the ground through a resistance 44.

Operations of the high-frequency terminal circuit of this embodiment are almost the same as those of the ninth or tenth embodiment. However, because a terminal resistance is connected to the entrance side and exit side of an LILC 42, it is possible to further securely terminate a pulse electromagnetic wave output from the driver 41.

TWELFTH EMBODIMENT

Figure 34:
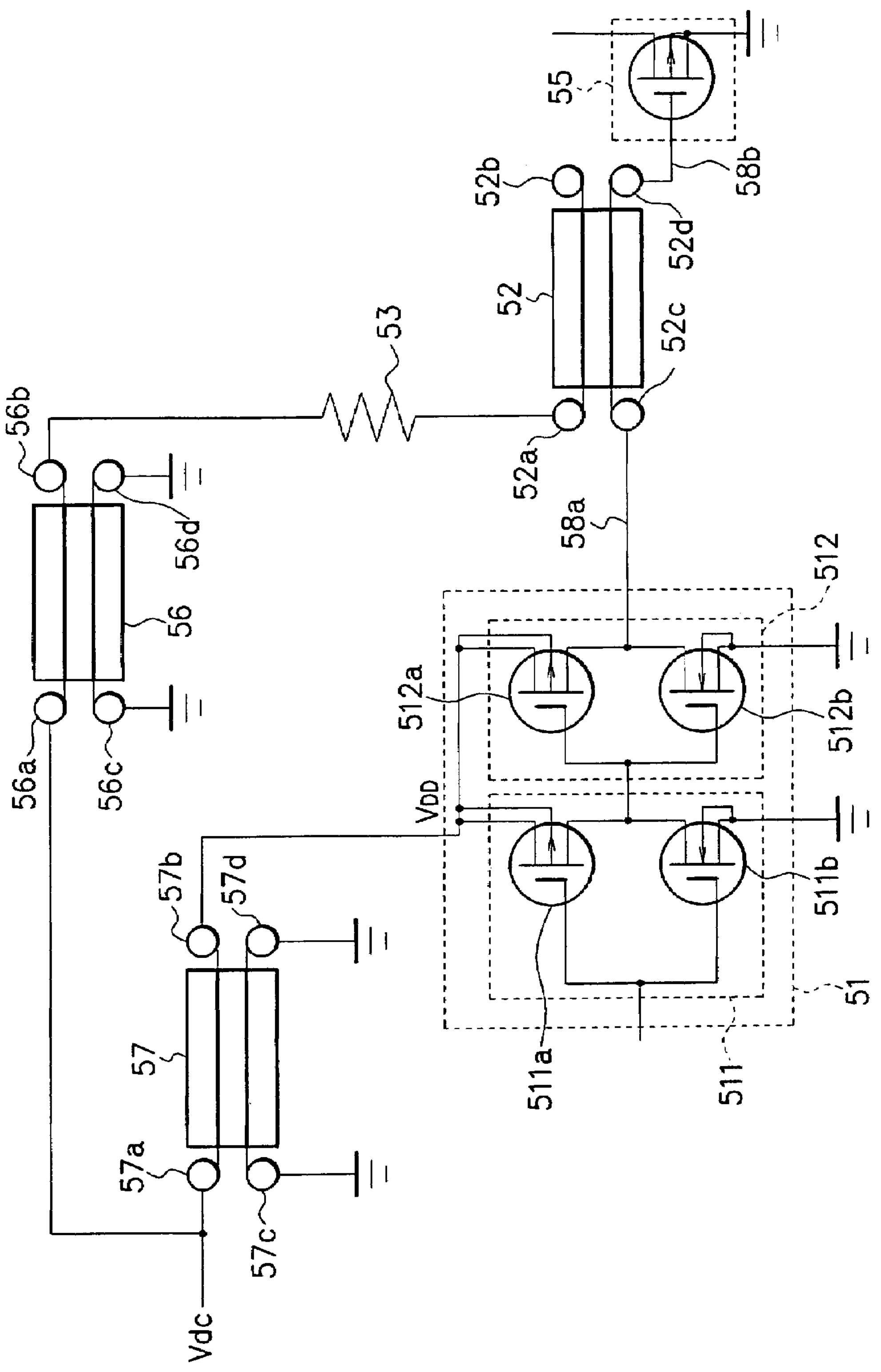
FIG. 34 is an illustration showing a configuration of a high-frequency terminal circuit of twelfth embodiment preferably executing the present invention.

Twelfth embodiment preferably executing the present invention is described below. FIG. 34 shows a configuration of a high-frequency terminal circuit to which the present invention is applied. This circuit is a pull-up-type terminal circuit obtained by connecting a signal circuit to a power supply through a terminal resistance.

The high-frequency terminal circuit of this embodiment has a driver 51, a LILC 52, a resistance 53, a receiver 55, a LILC 56, and a LILC 57.

The driver 51 is the same as the driver 51 of the first embodiment, which outputs signal electromagnetic waves from the output terminal. The LILC 52 is a device having a four-terminal line structure in which a pair of conductors are faced each other at the both sides of a dielectric and the characteristic impedance Z0 is set to a value very smaller than the characteristic impedance Z5 (Z0/Z5≈0) of a wiring 58*a* for connecting the driver 51 with the LILC 52. The LILC 52 includes all frequency components of pulse electromagnetic waves output from the driver 51 in an object frequency band. The terminal 52*a* of the LILC 52 is connected to the terminal 56*b* of the LILC 56 through the resistance 53. Moreover, the terminal 52*b* of the LILC 52 is opened. The terminal 52*c* of the LILC 52 is connected to the output terminal of the driver 51 and the terminal 52*d* of the LILC 52 is connected to the gate terminal of the receiver 55. The resistance 53 is a resistance (terminal resistance) for terminating a pulse signal wave so that it is not reflected in the LILC 52 and its impedance is equal to the impedance of a wiring 58*a* connecting the driver 51 with the LILC 52. The receiver 55 is a device for converting a signal input to a gate terminal into a voltage. LILCs 56 and 57 respectively restrain the fluctuation of a DC voltage VDC supplied from a not-illustrated power supply and make a terminal resistance viewed from a pulse signal wave become a constant value.

Figure 35:
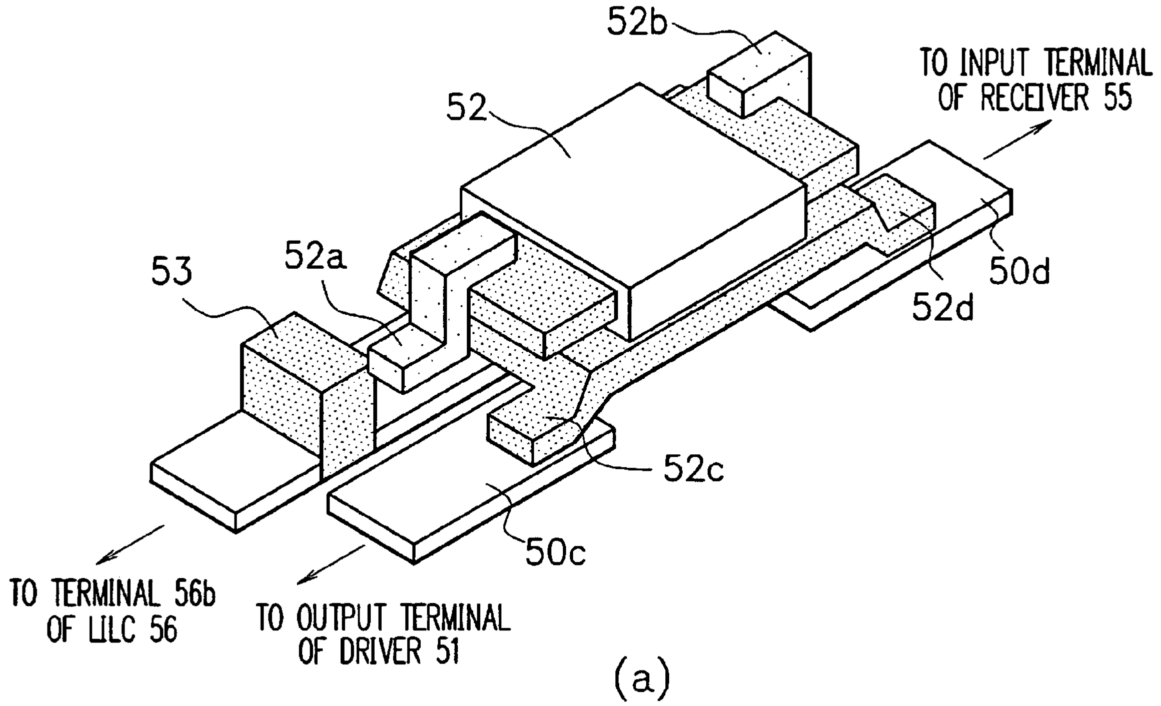
FIGS. 35(*a*) and 35(*b*) are illustrations showing a mounting example of an LILC to be applied to the high-frequency terminal circuit of the twelfth embodiment.
Figure 35:
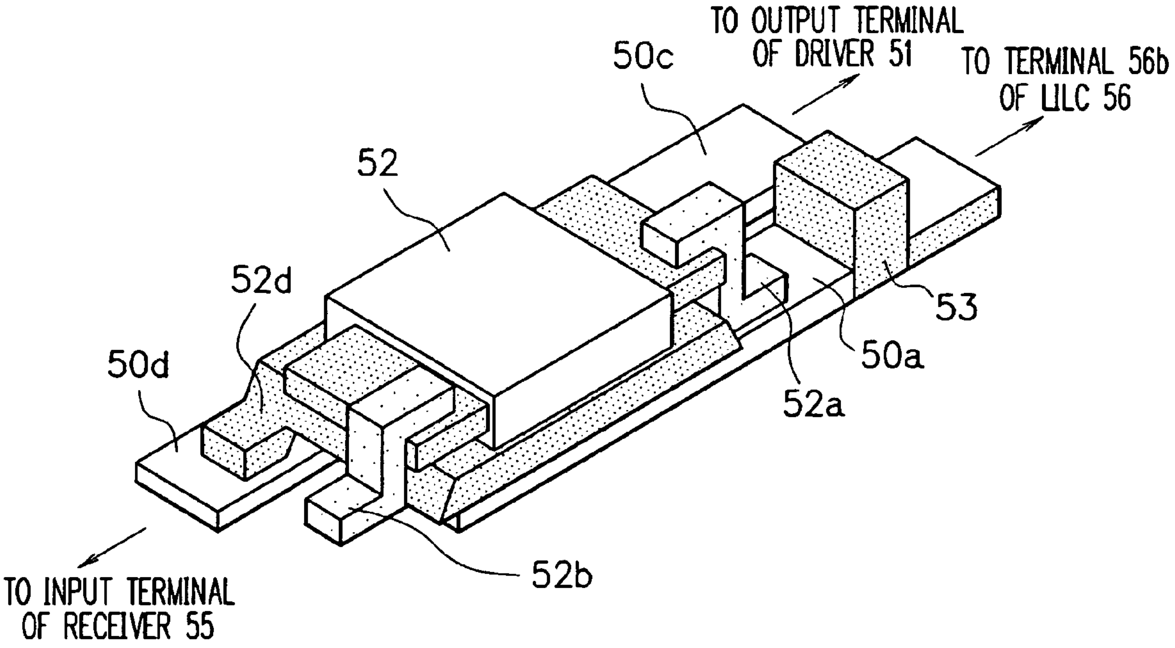

FIGS. 35(*a*) and 35(*b*) show a state of setting the LILC 52 to a wiring pattern on a printed circuit board. A terminal 52*a* is connected with a wring pattern 50*a* connected to the terminal 56*b* of the LILC 56 through a resistance 53 and a terminal 42*b* is opened. A terminal 52*c* is connected to a wiring pattern 50*c* connected with the output terminal of the driver 51. A terminal 52*d* is connected with a wring pattern 50*d* connected to the gate terminal of the receiver 55.

In the case of this terminal circuit, the terminal resistance 53 connected to the LILC 52 is connected to the terminal 56*b* of the LILC 56 and a terminal 56*d* faced with the terminal 56*b* is connected to the ground. Because the LILC 56 has a low impedance, it is possible to regard that the resistance 53 is connected to the ground in high frequency.

Figure 36:
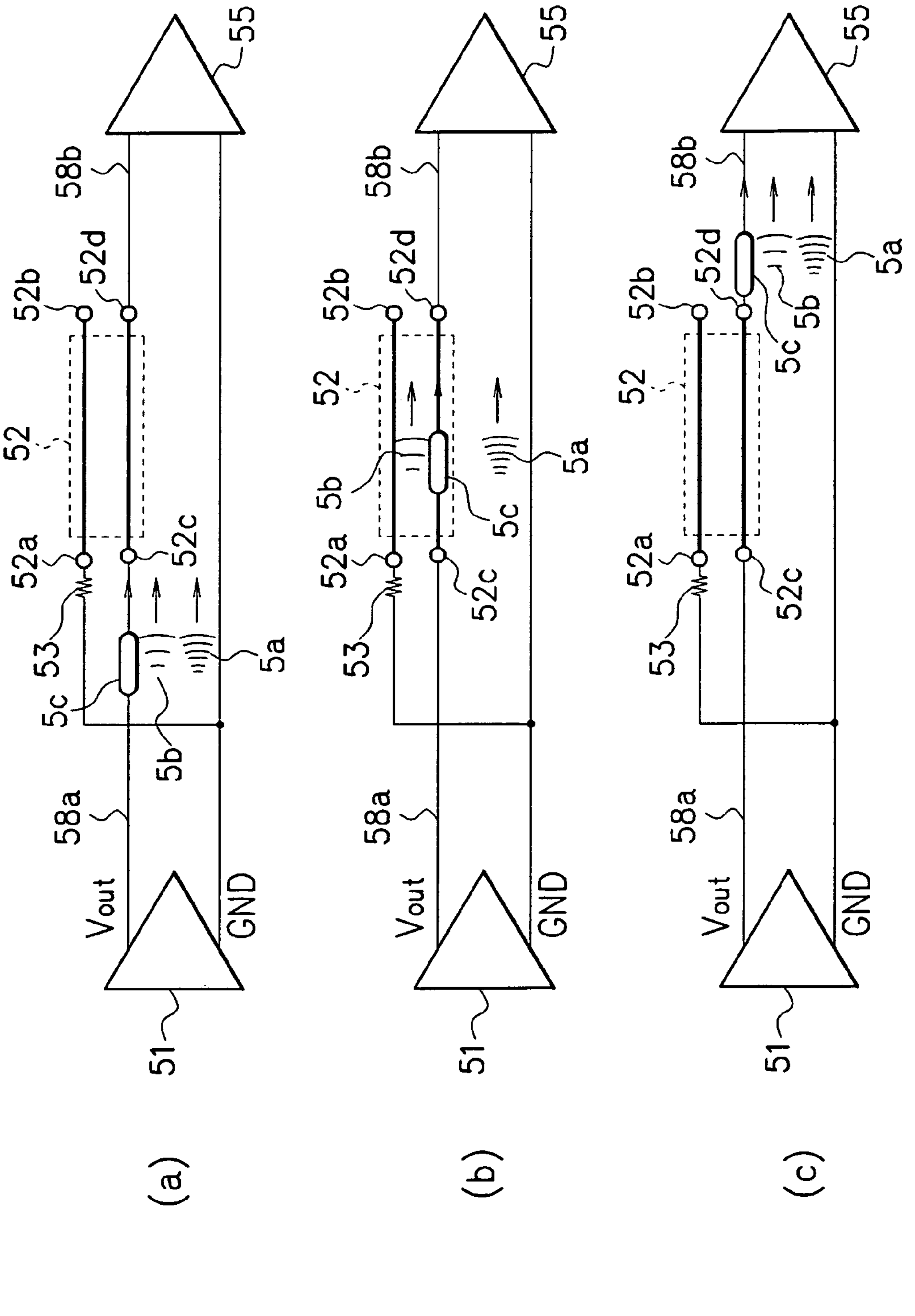
FIGS. 36(*a*) to 36(*c*) are illustrations for explaining a process in which a pulse signal wave passes through the high-frequency terminal circuit of the twelfth embodiment.

Operations of the high-frequency terminal circuit are described below. FIGS. 36(*a*) to 36(*c*) show states in which pulse signal waves output from the driver 51 travels through a high-frequency terminal circuit. As shown in FIG. 36(*a*), the pulse signal waves output from the driver 51 reach the LILC 52 through a line including a wiring 58*a* and the ground. Among the pulse signal waves reaching the LILC 52, an electromagnetic component (high frequency signal 5*a*) having a high frequency and capable of regarding the LILC 52 as a line is influenced by mismatching between the impedance of the wiring 58*a* and the impedance of the LILC 52. In this case, because Z0/Z5≈0, the high frequency signal cannot enter the LILC 52. In the case of this embodiment, however, because a terminal resistance (resistance 53) is connected to the terminal 52*a*, the high frequency signal propagates to the receiver-55 side through a line including the ground and one of a pair of conductors of the LILC 52, the conductor being regarded as connected to the ground through the resistance 53 as shown in FIG. 36(*b*).

As shown in FIG. 36(*c*), the high frequency signal 5*a* propagated to the receiver-55 side enters the gate terminal of the receive 55 through a line including the conductor 58*b* and the ground.

However, an electromagnetic component (low frequency signal) having a low frequency among the pulse signal waves reaching the LILC 52 can enter the LILC 52 without being influenced by mismatching between the impedance of the wiring 58*a* and the impedance of the LILC 52. Therefore, as shown in FIG. 36(*b*), the electromagnetic component passes through the portion of the dielectric of the LILC 52 and propagates to the receiver-55 side and, as shown in FIG. 36(*c*), enters the gate terminal of the receiver 55 through a line including the conductor 58*b* and the ground. Moreover, a DC signal passes through one of a pair of conductors of the LILC 52 to which the resistance 53 is not connected (conductor having terminals 52*a* and 52*b*) and transmits to the receiver-55 side and passes through a wiring 58*b* and enters the gate terminal of the receiver 55.

Therefore, all frequency components of pulse signal waves output from the driver 51 are input to the gate terminal of the receiver 55 and the waveform of a pulse signal output from the driver 51 is faithfully reproduced in a signal input to the gate terminal of the receiver 55. Therefore, the receiver 55 operates in accordance with a signal wave having the same waveform as a pulse signal output from the driver 51.

In the case of the high-frequency terminal circuit of this embodiment, a terminal resistance is connected to a terminal of an LILC showing an impedance equal to or lower than a predetermined value over a wide frequency band, in the same way as in the ninth embodiment. Thereby, because all frequency components of pulse signals are matching-terminated, the present embodiment prevents a situation where some frequency components are not terminated to generate ringing so that the receiver is activated. Moreover, because the terminal resistance is DC-insulated from the driver, DC does not flow through the terminal resistance and power is not wasted even if the driver continuously outputs a Hi or Low signal.

THIRTEENTH EMBODIMENT

Figure 37:
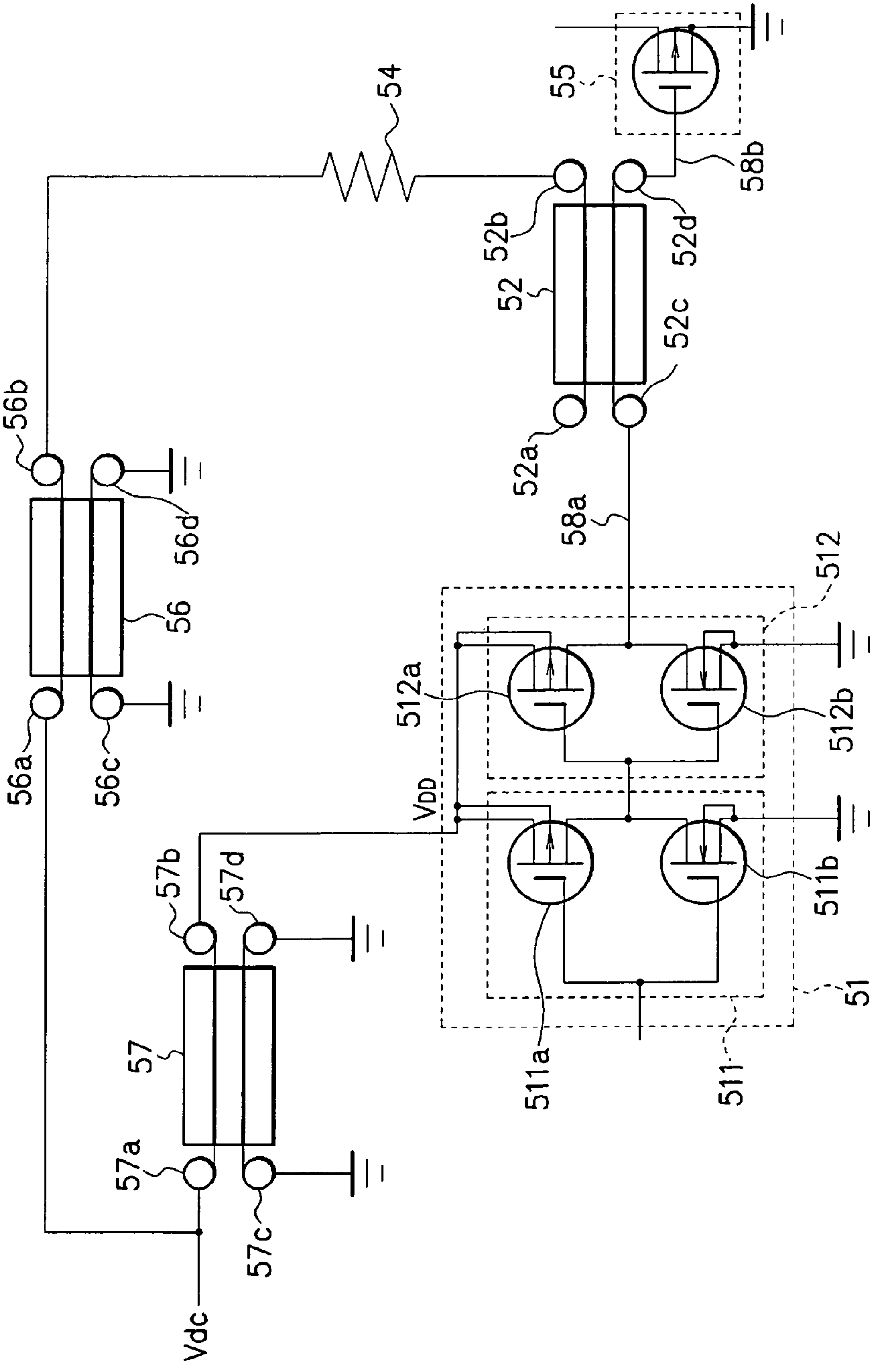
FIG. 37 is an illustration showing a configuration of a high-frequency terminal circuit of thirteenth embodiment preferably executing the present invention.

Thirteenth embodiment preferably executing the present invention is described below. FIG. 37 shows a configuration of a high-frequency terminal circuit to which the present invention is applied. This circuit is a pull-up-type terminal circuit in which a signal circuit is connected to a power supply through a terminal resistance, which is the same as the case of the twelfth embodiment except that a terminal 52*a* is opened and a terminal 52*b* is connected to the terminal 56*b* of an LILC 56 through a resistance 54. The impedance of the resistance 54 is equal to the impedance of a wiring 58*b* connecting an LILC 54 with a receiver 55.

Figure 38:
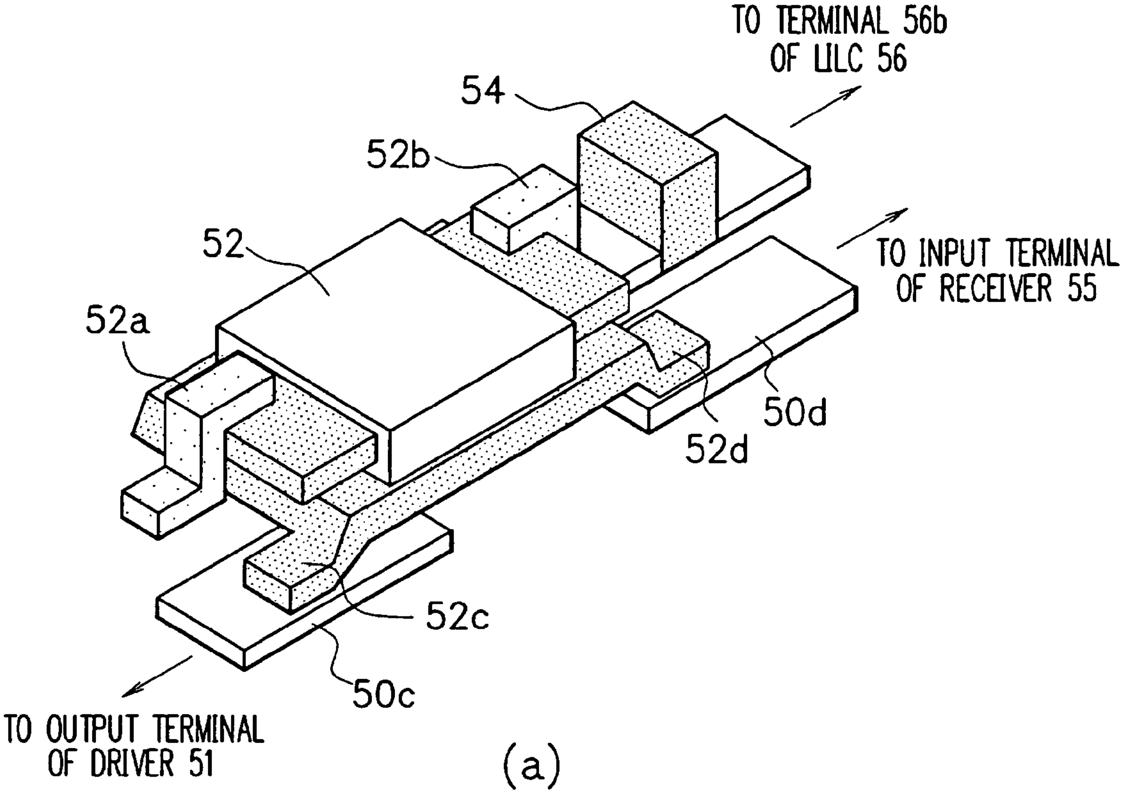
FIGS. 38(*a*) and 38(*b*) are illustrations showing a mounting example of an LILC to be applied to the high-frequency terminal circuit of the thirteenth embodiment.
Figure 38:
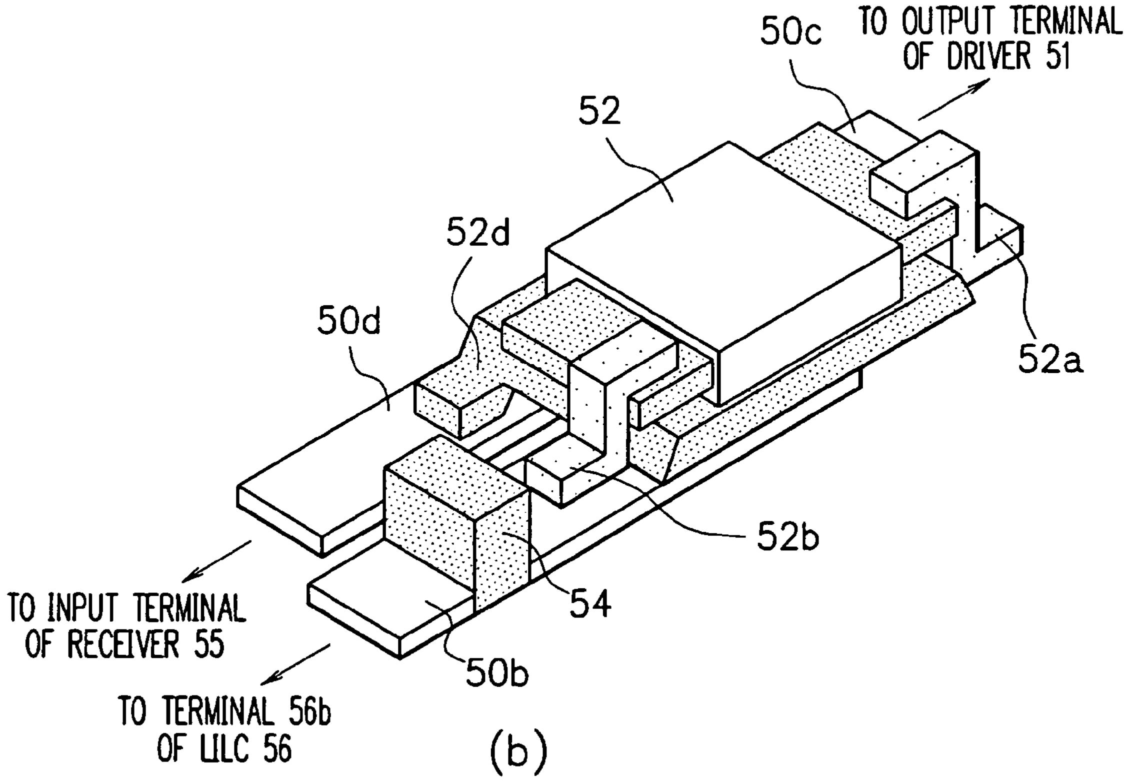

FIGS. 38(*a*) and 38(*b*) show a state of setting an LILC 42 to a wiring pattern on a printed circuit board. The terminal 52*a* is opened and the terminal 52*b* is connected with a wiring pattern 50*b* connected to the terminal 56*b* of the LILC 56 through the resistance 54. A terminal 52*c* is connected to a wiring pattern 50*c* connected with the output terminal of a driver 51. A terminal 52*d* is connected with a wiring pattern 50*d* connected to the gate terminal of the receiver 55.

In the case of this terminal circuit, the terminal resistance 54 connected to an LILC 52 is connected to the terminal 56*b* of the LILC 56 and a terminal 56*d* facing the terminal 56*b* is connected to the ground. Because the LILC 56 has a low impedance, it is possible to regard the resistance 54 as being connected to the ground.

Operations of the high-frequency terminal circuit are described below. A state in which a pulse signal wave output from the driver 51 travels through the high-frequency terminal circuit is the same as the case of the twelfth embodiment. All frequency components of pulse signal waves output from the driver 51 are input to the gate terminal of the receiver 55 and the waveform of a pulse signal wave output from the driver 51 is faithfully reproduced in a signal input to the gate terminal of the receiver 55. Therefore, the receiver 55 operates in accordance with the signal wave of the waveform same as a pulse signal output from the driver 51.

In the case of the high-frequency terminal circuit of this embodiment, a terminal resistance is connected to a terminal of an LILC showing an impedance equal to or lower than a predetermined value over a wide frequency band, in the same way as in the ninth embodiment and thereby, all frequency components of pulse signals are matching-terminated. Therefore, this embodiment prevents a situation where some frequency components are not terminated to generate ringing and the ringing activates the receiver. Moreover, because the terminal resistance is DC-insulated from the driver, DC does not flow through the terminal resistance even if the driver continuously outputs a Hi or Low signal and power is not wasted.

FOURTEENTH EMBODIMENT

Figure 39:
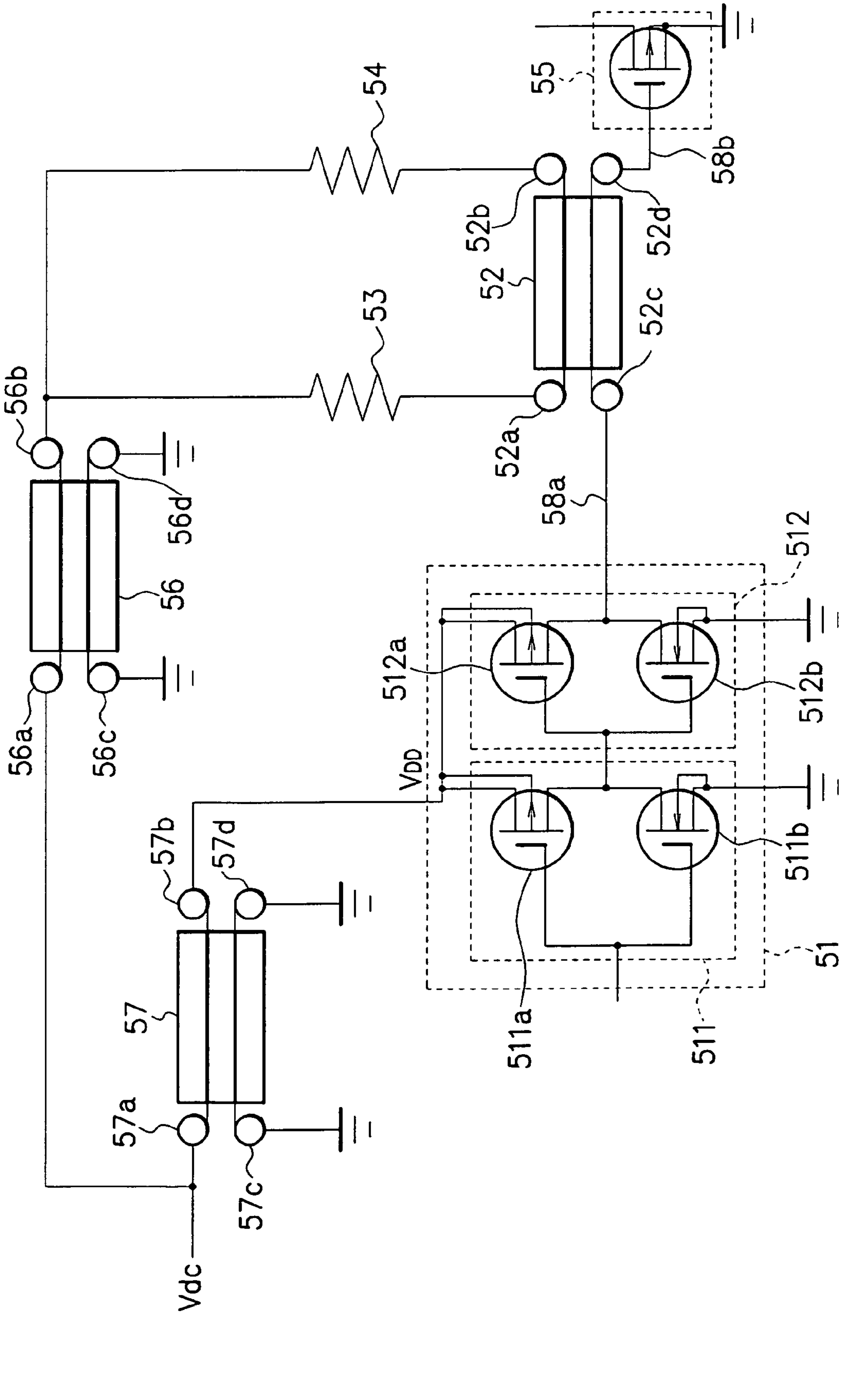
FIG. 39 is an illustration showing a configuration of a high-frequency terminal circuit of fourteenth embodiment preferably executing the present invention.

Fourteenth embodiment preferably executing the present invention is described below. FIG. 39 shows a high-frequency terminal circuit to which the present invention is applied. This circuit is a pull-up-type terminal circuit in which a signal circuit is connected to a power supply through a terminal resistance, which is the same as twelfth embodiment except that a terminal 52*b* is connected to the ground through a resistance 54. The impedance of the resistance 54 is equal to the impedance of a wiring 58*b* for connecting an LILC 54 with a receiver 55.

Figure 40:
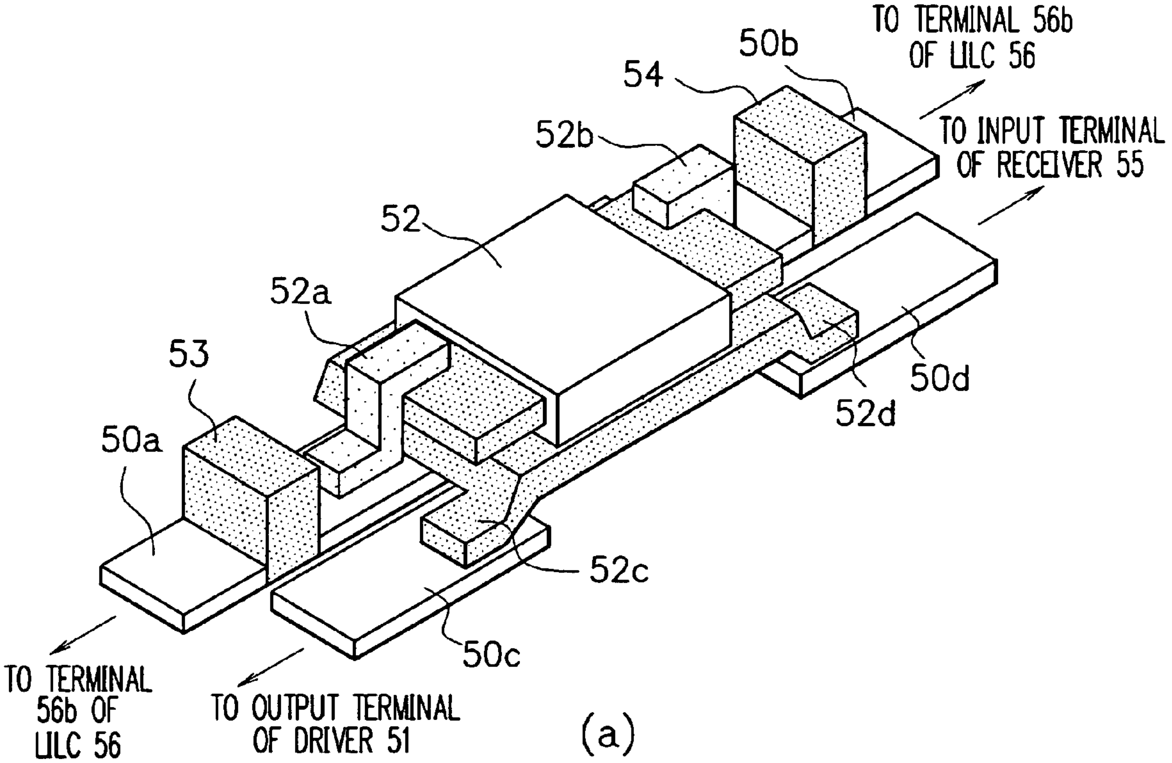
FIGS. 40(*a*) and 40(*b*) are illustrations showing a mounting example of an LILC to be applied to the high-frequency terminal circuit of the fourteenth embodiment.
Figure 40:
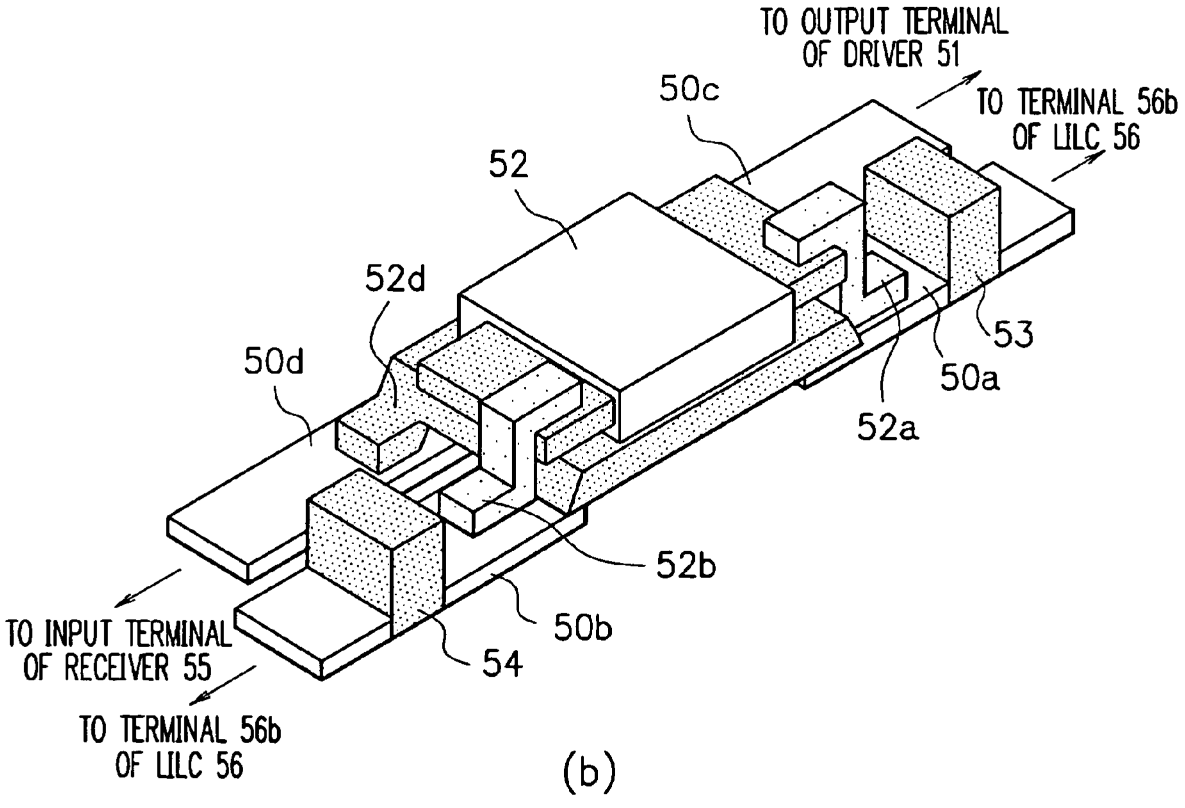

FIGS. 40(*a*) and 40(*b*) show a state of setting an LILC 52 to a wiring pattern on a printed circuit board. The terminal 52*a* of the LILC 52 is connected with a wiring pattern 50*a* connected to the terminal 56*b* of an LILC 56 through a coil 53. The terminal 52*b* of the LILC 52 is connected with a wring pattern 50*b* connected to the terminal 56*b* of the LILC 56 through the resistance 54. The terminal 52*c* of the LILC 52 is connected to a wiring pattern 50*c* connected with the output terminal of a driver 51. The terminal 52*d* of the LILC 52 is connected with a wiring pattern 50*d* connected to the gate terminal of the receiver 55.

Operations of the high-frequency terminal circuit of this embodiment are almost the same as those of the twelfth embodiment and thirteenth embodiment. Because a terminal resistance is connected to both entrance side and exit side of the LILC 52, it is possible to more securely terminate a pulse electromagnetic wave output from the driver 51.

The above embodiment is an example of preferred embodiments of the present invention but the present invention is not restricted to these embodiments.

For example, in the case of the above embodiments, an LPF circuit and HPF circuit are described by using a first-order configuration as an example. However, it is also possible to apply the present invention to a high-order LPF circuit and a HPF circuit.

Description is made by using a case of connection as an example. However, it is also allowed to connect a terminal resistance to both power supply and ground and thereby realize Therein connection.

Moreover, a driver and a receiver are not restricted to configurations shown for each embodiment.

Thus, the present invention can be variously modified.

INDUSTRIAL APPLICABILITY

As described above, according to the present invention, it is possible to constitute a broadband circuit from which a desired circuit characteristic can be obtained over a wide frequency band with a small number of circuit devices.

The invention claimed is:

1. A broadband circuit with which a circuit device is connected through a transmission line including a signal transmission conductor, a grounding conductor, and a dielectric present between these conductors, characterized in that line devices having a four-terminal line structure in which a pair of conductors are faced each other, having an impedance lower than that of a conductor to be connected to any terminal, having a transmission loss of the dielectric set to 0.05 or more, and the frequency band of an electromagnetic wave having a wavelength shorter than the length approximately four times larger than the length of the line devices as an object frequency band is inserted into the transmission line and used as a low impedance device to the electromagnetic wave of the object frequency band.

2. The broadband circuit according to claim 1, in which a signal source for outputting signal electromagnetic waves and a passive device to be operated in accordance with an input signal are connected by the transmission line into which the line devices is inserted, characterized in that the line devices inserted into the transmission line includes at least some of spectrums of signal electromagnetic waves in the object frequency band, one end of either one of the pair of conductors of the line device is connected to the output terminal of the signal source and the other end of it is connected to the input terminal of the passive device, and the other ends of the conductors are connected to the ground.

3. The broadband circuit according to claim 2, characterized in that the signal source and the line devices are connected through a device mainly including a reactance component in the object frequency band.

4. The broadband circuit according to claim 2, characterized in that the signal source and the line devices are connected through a resistance.

5. The broadband circuit according to claim 2, characterized in that frequency components in the object frequency band of the line devices among signal electromagnetic waves propagated from the signal source up to the line devices are reflected by the line devices, frequency components out of the object frequency band of the line devices propagate to the passive device side through the line devices, and a DC component transmits to the passive device side through one of a pair of conductors of the line devices connected to the signal source and the passive device.

6. The broadband circuit according to claim 1 in which a signal source for outputting a signal electromagnetic wave and a passive device to be operated in accordance with an input signal are mutually connected by the transmission line into which the line devices is inserted, characterized in that the line devices inserted into the transmission line includes at least some of the spectrums of the signal electromagnetic waves in the object frequency band, one end of one of a pair of conductors of the line devices is connected to the output terminal of the signal source and the other end of it is electrically opened, the end of the other conductor at the passive device side is connected to the input terminal of the passive device, and at least one end is connected to the ground through a device mainly including a reactance component in the object frequency band.

7. The broadband circuit according to claim 1 in which a signal source for outputting a signal electromagnetic wave and a passive device to be operated in accordance with an input signal are mutually connected by the transmission line into which the line devices is inserted, characterized in that the line devices inserted into the transmission line includes at least some of the spectrums of the signal electromagnetic wave in the object frequency band, one end of one of a pair of conductors of the line devices is connected to the output terminal of the signal source and the other end of it is opened, the end of the other conductor at the passive device side is connected to the input terminal of the passive device, and at least one end is connected to the ground through a resistance.

8. The broadband circuit according to claim 6, characterized in that frequency components in the object frequency band of the line devices among signal electromagnetic waves propagated from the signal source up to the line devices are propagated to the passive device side through a line including one of a pair of conductors of the line devices connected to the input terminal of the passive device and the ground, and frequency components out of the object frequency band enter the line devices and attenuate.

9. The broadband circuit according to claim 1, wherein the line devices include first and second line devices, in which a signal source for outputting a signal electromagnetic wave and a passive device to be operated in accordance with an input signal are mutually connected by the transmission line into which first and second line devices are inserted, characterized in that the first and second line devices respectively include at least some of the spectrums of the signal electromagnetic waves in their object frequency bands, one end of one of a pair of conductors of the first line device is connected to the output terminal of the signal source and the other end of it is electrically opened, the end of the other conductor at the opposite side to the signal source is connected to one of a pair of conductors of the second line device, and at least one end is connected to the ground through a device mainly including a reactance component or a resistance in the object frequency band of the first line device, and the other end of one of a pair of conductors of the second line device whose one end is connected with the first line device is connected to the input terminal of the passive device and both ends of the other conductor are connected to the ground.

10. The broadband circuit according to claim 7, wherein the line device include first and second line devices, characterized in that the first line device and the second line device are mutually connected through a device mainly including a reactance component or a resistance in the object frequency band of the second line device.

11. The broadband circuit according to claim 9, characterized in that frequency components in the object frequency band of the first line device among signal electromagnetic waves propagated from the signal source up to the first line device are propagated to the second line device side through a line including one of a pair of conductors of the first line device connected with a conductor of the second line device and the ground, frequency components out of the object frequency band of the first line device enters the line device and attenuate, frequency components in the object frequency hand of the second line device among signal electromagnetic waves propagated up to the second line device are reflected by the second line device, and frequency components out of the object frequency hand of the second line device are propagated to the passive device side through the second line device.

12. The broadband circuit according to claim 1, wherein the line devices include first and second line devices, in which a signal source for outputting a signal electromagnetic wave and a passive device to be operated in accordance with an input signal are mutually connected by the transmission line into which the first and second line devices are inserted, characterized in that the first and second line devices respectively include at least some of the spectrums of the signal electromagnetic waves in their object frequency bands, one end of one of a pair of conductors of the first line device is connected to the output terminal of the signal source and the other end of it is connected to the one of a pair of conductors of the second line device and both ends of the other conductor are connected to the ground, the other end of one of a pair of conductors of the second line device whose one end is connected with the first line device is electrically opened, the end of the other conductor at the passive device side is connected to the input terminal of the passive device, and at least one end is connected to the ground through a device mainly including a reactance component or a resistance in the object frequency band of the second line device.

13. The broadband circuit according to claim 12, characterized in that frequency components in the object frequency band of the first line device among signal electromagnetic waves propagated from the signal source up to the first line device are reflected by the first line device, frequency components out of the object frequency band of the first line device are propagated to the second line device side through the first line device, frequency components in the object frequency band of the second line device among signal electromagnetic waves propagated up to the second line device are propagated to the passive device side through a line including one of a pair of conductors of the second line device connected to the input terminal of the passive device and the ground, and frequency components out of the object frequency band of the second line device enter the second line device and attenuate.

14. The broad circuit according to claim 1, wherein the line devices include first and second line devices, in which a signal source for outputting a signal electromagnetic wave and a passive device to be operated in accordance with an input signal are mutually connected by the transmission line into which the first and second line devices are inserted, characterized in that the first and second line devices respectively include at least some of the spectrums of the signal electromagnetic waves in their object frequency bands, one end of one of a pair of conductors of the first line device is connected to the output terminal of the signal source, the other end of it is connected to the input terminal of the passive device, and both end of the other conductor are connected to the ground, one end of one of a pair of conductors of the second line device is connected to the output terminal of the signal source and the other end of it is electrically opened, the end of the other conductor at the passive device side is connected to the input terminal of the passive device, and at least one end is connected to the ground through a line mainly including a reactance component or a resistance in the object frequency band of the second line device.

15. The broadband circuit according to claim 14, characterized in that frequency components in the object frequency band of the first line device among signal electromagnetic waves propagated from the signal source up to the first line device are propagated to the passive device side through a line including one of a pair of conductors of the first line device connected to the input terminal of the passive device and the ground, frequency components out of the object frequency band of the first line device enter the first line device and attenuate, frequency components in the object frequency band of the second line device among signal electromagnetic waves propagated from the signal source up to the second line device are reflected by the second line device, and frequency components out of the object frequency band of the second line device transmit to the passive device side through the second line device.

16. The broadband circuit according to claim 12, characterized in that the signal source and the first line device are mutually connected through a device mainly including a reactance component or a resistance in the object frequency band of the first line device.

17. The broadband circuit according to claim 1 in which a signal source for outputting a signal electromagnetic wave and a passive device to be operated in accordance with an input signal are mutually connected by the transmission line into which the line devices is inserted, characterized in that the line devices inserted into the transmission line includes the spectrum of the signal electromagnetic wave in the object frequency band, one end of one of a pair of conductors of the line devices is connected to the output terminal of the signal source and the other end of it is connected to the input terminal of the passive device, and at least one end of the other conductor is connected to the ground through a terminal resistance.

18. The broadband circuit according to claim 17, characterized in that frequency components in the object frequency band of the line devices among signal electromagnetic waves propagated from the signal source up to the line devices are propagated to the passive device side through a line including one of a pair of conductors of the line device connected to the signal source and the passive device and the ground, while frequency components out of the object frequency band of the line devices is propagated to the passive device side through the line devices, and a DC component transmits to the passive device side through one of a pair of conductors of the line devices connected to the signal source and the passive device.

19. The broadband circuit according to claim 1, wherein the line devices include first and second line devices, in which a signal source for outputting signal electromagnetic waves and a passive device to be operated in accordance with an input signal are mutually connected by the transmission line into which the first line device is inserted and a power supply for supplying power to the signal source and the first line device are mutually connected through the second line device, characterized in that the first and second line devices include spectrums of the signal electromagnetic waves in their object frequency bands, one end of one of a pair of conductors of the first line device is connected to the output terminal of the signal source and the other end of it is connected to the input terminal of the passive device, and at least one end of the other conductor is connected to the second line device through a terminal resistance, and one end of one of a pair of conductors of the second line device is connected to the first line device through the terminal resistance and the other end of it is connected to the power supply, and both ends of the other conductor are connected to the ground.

20. The broadband circuit according to claim 19, characterized in that among signal electromagnetic waves propagated from the signal source up to the first line device, frequency components in the object frequency band of the first line device are propagated to the passive device side through a line including one of a pair of conductors of the first line device connected to the signal source and passive device and the ground, frequency components out of the object frequency band of the first line device are propagated to the passive device side through the first line device, and a DC component transmits to the passive device side through one of a pair of conductors of the first line device connected to the signal source and the passive device.

21. The broadband circuit according to claim 17, characterized in that the terminal resistance has a resistance value equal to that of a signal transmission conductor connected to the end of the side at which the terminal resistance of a conductor of the line devices to which the terminal resistance is not connected is connected.

22. The broadband circuit according to claim 17, characterized in that the line devices is further set on a power supply line for connecting the signal source with a power supply for supplying power to the signal source, and one end of one of a pair of conductors of the line devices set to the power supply line is connected to the power terminal of the signal source and the other end of it is connected to the power supply and both ends of the other conductor are connected to the ground.

23. The broadband circuit according to claim 2, characterized in that the signal source and the passive device are mounted on a printed circuit board on which the signal transmission conductor is formed as a wiring pattern and the grounding conductor is formed as a ground plane and a wiring pattern connected to the ground plane, and in the case of the line devices mounted on the printed circuit board, at least one ends of the conductors are connected to the wiring patterns of the signal transmission conductor and the grounding conductor and inserted into the line devices.

* * * * *